(12) United States Patent
Park et al.

(10) Patent No.: US 12,557,458 B2
(45) Date of Patent: Feb. 17, 2026

(54) DISPLAY DEVICE

(71) Applicant: Samsung Display Co., LTD., Yongin-si (KR)

(72) Inventors: Do Yeong Park, Yongin-si (KR); Chong Chul Chai, Yongin-si (KR); Kyung Bae Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 881 days.

(21) Appl. No.: 17/407,390

(22) Filed: Aug. 20, 2021

(65) Prior Publication Data

US 2022/0199677 A1 Jun. 23, 2022

(30) Foreign Application Priority Data

Dec. 23, 2020 (KR) ........................ 10-2020-0182610

(51) Int. Cl.
*H10H 29/14* (2025.01)
*H10H 20/821* (2025.01)
(Continued)

(52) U.S. Cl.
CPC ........ *H10H 29/142* (2025.01); *H10H 20/821* (2025.01); *H10H 20/831* (2025.01);
(Continued)

(58) Field of Classification Search
CPC .. H10H 29/142; H10H 20/821; H10H 20/831; H10H 20/84; H10H 20/819;
(Continued)

(56) References Cited

U.S. PATENT DOCUMENTS

| 8,957,418 | B2 | 2/2015 | Moriguchi et al. |
| 10,249,603 | B2 | 4/2019 | Cho et al. |
| 10,276,630 | B2 | 4/2019 | Lee et al. |
| 10,340,419 | B2 | 7/2019 | Kim et al. |

(Continued)

FOREIGN PATENT DOCUMENTS

| JP | 5241967 | 7/2013 |
| KR | 10-2014-0071042 | 6/2014 |

(Continued)

OTHER PUBLICATIONS

International Search Report, corresponding to International Application No. PCT/KR2021/019208 dated Mar. 30, 2022.

*Primary Examiner* — Su C Kim
(74) *Attorney, Agent, or Firm* — Womble Bond Dickinson (US) LLP

(57) ABSTRACT

A display device includes a substrate including a display area and a non-display area; pixels disposed in the display area; first scan lines that transmit signals to the pixels, extend in a first direction, and are disposed in a second direction different from the first direction; second scan lines that extend in the second direction and are disposed in the first direction; and a pad part electrically connected to the second scan lines and disposed in the non-display area. Each of the first scan lines is electrically connected to at least one of the second scan lines through a corresponding one of contactors. Each of the pixels is a first pixel, a second pixel, or a third pixel based on whether or not including a contactor.

23 Claims, 22 Drawing Sheets

(51) Int. Cl.
*H10H 20/831* (2025.01)
*H10H 20/84* (2025.01)
*G09G 3/32* (2016.01)

(52) U.S. Cl.
CPC ............... *H10H 20/84* (2025.01); *G09G 3/32* (2013.01); *G09G 2300/0426* (2013.01); *G09G 2300/0852* (2013.01); *G09G 2330/02* (2013.01)

(58) Field of Classification Search
CPC ................ H10H 20/857; G09G 3/32; G09G 2300/0426; G09G 2300/0852; G09G 2330/02; G09G 2300/0842; G09G 2320/029; H01L 25/0753; H01L 25/167; H10D 86/40
See application file for complete search history.

(56) References Cited

U.S. PATENT DOCUMENTS

| | | | |
|---|---|---|---|
| 11,127,343 | B2 | 9/2021 | Jeong et al. |
| 2017/0084214 | A1* | 3/2017 | Ono ................... G02F 1/136286 |
| 2017/0242516 | A1* | 8/2017 | Bae ....................... G06V 20/695 |
| 2018/0019369 | A1* | 1/2018 | Cho ....................... H01L 27/156 |
| 2019/0347986 | A1* | 11/2019 | Weng ................... G09G 3/3225 |

FOREIGN PATENT DOCUMENTS

| | | |
|---|---|---|
| KR | 10-2015-0015639 | 2/2015 |
| KR | 10-2018-0003703 | 1/2018 |
| KR | 10-2018-0009014 | 1/2018 |
| KR | 10-2018-0011404 | 2/2018 |
| KR | 10-1987196 | 6/2019 |
| KR | 10-2118153 | 6/2020 |
| KR | 10-2020-0103925 | 9/2020 |

* cited by examiner

DISPLAY DEVICE

CROSS-REFERENCE TO RELATED APPLICATION(S)

This application claims priority to and benefits of Korean patent application number 10-2020-0182610 under 35 U.S.C. § 119 filed on Dec. 23, 2020 in the Korean Intellectual Property Office, the entire contents of which are incorporated herein by reference.

BACKGROUND

1. Technical Field

Embodiments relate to a display device.

2. Description of the Related Art

With increasing interest in information displays and an increasing demand for portable information media, the demand for display devices is markedly increased, and commercialization thereof is in progress.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Various embodiments are directed to a display device capable of reducing a load of a power line and thus enhancing reliability.

A display device in accordance with an embodiment may include a substrate including a display area and a non-display area; a plurality of pixels disposed in the display area; first scan lines that transmit signals to the plurality of pixels, extend in a first direction, and are disposed in a second direction different from the first direction; second scan lines that extend in the second direction and are disposed in the first direction; and a pad part electrically connected to the second scan lines and disposed in the non-display area. Each of the first scan lines may be electrically connected to at least one of the second scan lines through a corresponding one of contactors.

In an embodiment, each of the plurality of pixels may be a first pixel, a second pixel, or a third pixel based on whether or not including a contactor.

The first pixel, the second pixel, and the third pixel may have different structures.

In an embodiment, the first pixel may include a contactor. The second pixel may not include a contactor, and may be disposed closer to the pad part in the second direction than the first pixel. The third pixel may not include a contactor, and may be disposed farther from the pad part in the second direction than the first pixel.

In an embodiment, the display area may include a first area in which the first pixel may be disposed; a second area in which the second pixel may be disposed; and a third area in which the third pixel may be disposed. At least one of the first area, the second area, and the third area may have a size less than a size of each of the other areas.

In an embodiment, the contactors may be disposed in a direction inclined to one of the first direction and the second direction in a plan view.

In an embodiment, each of the first pixel, the second pixel, and the third pixel may include a first sub-pixel including a first storage capacitor and at least one transistor electrically connected to the first storage capacitor; a second sub-pixel including a second storage capacitor and at least one transistor electrically connected to the second storage capacitor; a third sub-pixel including a third storage capacitor and at least one transistor electrically connected to the third storage capacitor; a first power line electrically connected to each of the first sub-pixel, the second sub-pixel, and the third sub-pixel receiving a first driving power voltage; a second power line electrically connected to each of the first sub-pixel, the second sub-pixel, and the third sub-pixel and receiving a second driving power voltage; a first scan line electrically connected to each of the first sub-pixel, the second sub-pixel, and the third sub-pixel, the first scan line being one of the first scan lines; a 2-1-th scan line of the second scan lines that is adjacent to the first power line; and a 2-2-th scan line of the second scan lines that is adjacent to the second power line.

In an embodiment, each of the 2-1-th scan line and the 2-2-th scan line may include a first conductive line disposed on the substrate; a second conductive line disposed on the first conductive line with a first insulating layer disposed between the first conductive line and the second conductive line; and a third conductive line disposed on the second conductive line with a second insulating layer disposed between the second conductive line and the third conductive line. The first conductive line, the second conductive line, and the third conductive line may be electrically connected to each other.

In an embodiment, the first power line may include a first layer disposed on the substrate; and a second layer disposed on the first layer with the first insulating layer and the second insulating layer disposed between the first layer and the second layer. The second power line may include a first layer disposed on the substrate. The first conductive line and the first layer may be disposed on a same layer, and the third conductive line and the second layer may be disposed on a same layer.

In an embodiment, the first scan line of the first pixel may be electrically connected to at least one of the 2-1-th scan line and the 2-2-th scan line through the contactor in the first pixel.

In an embodiment, the first scan line of the first pixel may be electrically connected to the at least one of the 2-1-th scan line and the 2-2-th scan line through at least one contact hole passing through the first insulating layer and the second insulating layer in the first pixel. The contact hole may be the contactor.

In an embodiment, the 2-1-th scan line and the 2-2-th scan line may be electrically connected to the first scan line and overlap the first scan line in the second pixel.

In an embodiment, the 2-1-th scan line and the 2-2-th scan line may be not electrically connected to the first scan line and may not overlap the first scan line in the third pixel.

In an embodiment, the 2-1-th scan line may be electrically connected to the first power line in the third pixel, and the 2-2-th scan line may be electrically connected to the second power line in the third pixel.

In an embodiment, the 2-1-th scan line and the first power line may be integral with each other, in the third pixel and the 2-2-th scan line and the second power may be integral with each other in the third pixel.

In an embodiment, the first conductive line of the 2-1-th scan line may be integral with the first layer of the first power line in the third pixel, and the first conductive line of the 2-2-th scan line may be integral with the first layer of the second power line in the third pixel.

In an embodiment, at least a portion of the first conductive line of the 2-1-th scan line may protrude to the first layer of the first power line and may be integral with the first layer of the first power line in the third pixel. At least a portion of the first conductive line of the 2-2-th scan line may protrude to the first layer of the second power line and may be integral with the first layer of the second power line in the third pixel.

In an embodiment, the first conductive line of the 2-1-th scan line may extend to the first layer of the first power line and may be integral with the first layer of the first power line in the third pixel. The first conductive line of the 2-2-th scan line may extend to the first layer of the second power line and may be integral with the first layer of the second power line in the third pixel.

In an embodiment, each of the first pixel, the second pixel, and the third pixel may include a first emission area, a second emission area, and a third emission area spaced apart from each other on the substrate in the first direction, and including a plurality of light emitting elements disposed in each of the first emission area, the second emission area, and the third emission area; and a first electrode, a second electrode, a third electrode, and a fourth electrode included in each of the first emission area, the second emission area, and the third emission area, and spaced apart from each other in the first direction.

In an embodiment, the plurality of light emitting elements may include first light emitting elements electrically connected to the first electrode and the second electrode and disposed between the first electrode and the second electrode; and second light emitting elements electrically connected to the third electrode and the fourth electrode and disposed between the third electrode and the fourth electrode.

In an embodiment, each of the first pixel, the second pixel, and the third pixel may include a first connection electrode disposed on the first electrode, and electrically connecting the first electrode to respective first ends of the first light emitting elements; an intermediate electrode disposed on the second electrode and the fourth electrode, and electrically connecting respective second ends of the first light emitting elements with respective first ends of the second light emitting elements; and a second connection electrode disposed on the third electrode, and electrically connecting the third electrode with respective second ends of the second light emitting elements.

In an embodiment, the first scan lines and the second scan lines may intersect each other and form a mesh shape.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
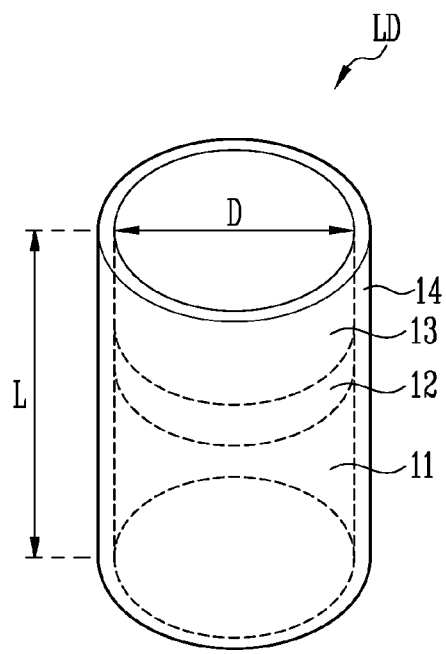
FIGS. 1 and 2 are schematic perspective views schematically illustrating a light emitting element in accordance with an embodiment.

As the disclosure allows for various changes and numerous embodiments, embodiments will be illustrated in the drawings and described in detail in the written description. However, this is not intended to limit the disclosure to particular modes of practice, and it is to be appreciated that all changes, equivalents, and substitutes within the spirit and technical scope of the disclosure are encompassed in the disclosure.

Throughout the disclosure, like reference numerals refer to like parts throughout the various figures and embodiments of the disclosure. The sizes of elements in the accompanying drawings may be exaggerated for clarity of illustration.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

In the disclosure, the singular forms are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be further understood that the terms "comprise," "include," "have," and variations thereof etc. when used in this specification, specify the presence of stated features, integers, steps, operations, elements, components, and/or combinations of them but do not preclude the presence or addition of one or more other features, integers, steps, operations, elements, components, and/or combinations thereof.

Furthermore, when a first part such as a layer, a film, a region, or a plate is disposed on a second part, the first part may be not only directly on the second part but a third part or other parts may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under or below a second part, the first part may be not only directly under or below the second part but a third part or other parts may intervene between them.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be understood that when an element (e.g., a first element) is referred to as being (operatively or communicatively) "coupled with/to" or "connected with/to" another element (e.g., a second element), the first element can be coupled or connected with/to the second element directly or via another element (e.g., a third element). In contrast, it will be understood that when an element (e.g., a first element) is referred to as being "directly coupled with/to" or "directly connected with/to" another element (e.g., a second element), no other element (e.g., a third element) intervenes between the element and the other element.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments and details of the disclosure are described with reference to the accompanying drawings in order to describe the disclosure in detail so that those having ordinary skill in the art to which the disclosure pertains can readily practice the disclosure. Furthermore, a singular form may include a plural from unless the context indicates otherwise.

Figure 2:
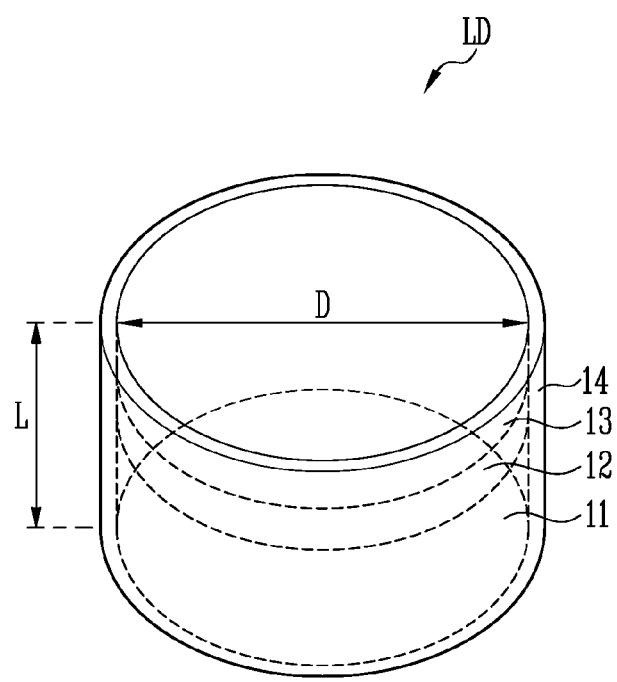
Figure 3:
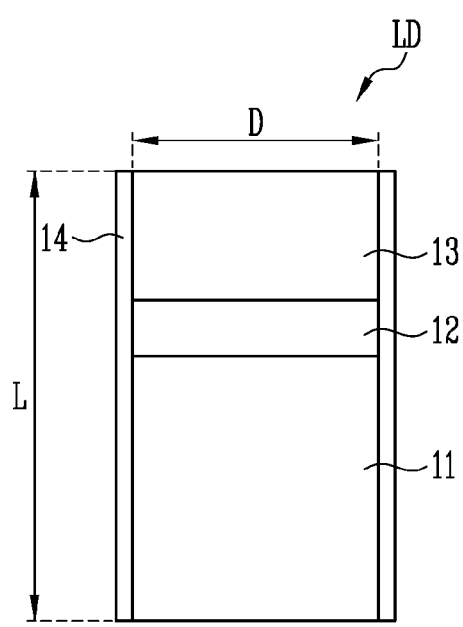
FIG. 3 is a schematic sectional view illustrating the light emitting element of FIG. 1.

FIGS. 1 and 2 are schematic perspective views illustrating a light emitting element LD in accordance with an embodiment. FIG. 3 is a sectional view illustrating the light emitting element LD of FIG. 1.

In an embodiment, the type and/or shape of the light emitting element LD is not limited to that in the embodiments illustrated in FIGS. 1 to 3.

Referring to FIGS. 1 to 3, the light emitting element LD may include a first semiconductor layer 11, a second semiconductor layer 13, and an active layer 12 interposed between the first and second semiconductor layers 11 and 13. For example, the light emitting element LD may be implemented as a light emitting stack formed by successively stacking the first conductive semiconductor layer 11, the active layer 12, and the second conductive semiconductor layer 13.

The light emitting element LD may be formed in a shape extending in a direction. If the direction in which the light emitting element LD extends is defined as a longitudinal direction, the light emitting element LD may have a first end (or a lower end) and a second end (or an upper end) in the longitudinal direction. One of the first and second semiconductor layers 11 and 13 may be disposed on the first end (or the lower end) of the light emitting element LD. The other of the first and second semiconductor layers 11 and 13 may be disposed on the second end (or the upper end) of the light emitting element LD. For example, the first semiconductor layer 11 may be disposed on the first end (or the lower end) of the light emitting element LD, and the second semiconductor layer 13 may be disposed on the second end (or the upper end) of the light emitting element LD.

The light emitting element LD may have various shapes. For example, as illustrated in FIG. 1, the light emitting element LD may have a rod-like shape, a bar-like shape, or a pillar-like shape which may be long (for example, having an aspect ratio greater than 1) in the longitudinal direction (L). In an embodiment, the length L of the light emitting element LD in the longitudinal direction (L) may be greater than the diameter D (or a width of a cross-section thereof) thereof. However, the disclosure is not limited thereto. In an embodiment, as illustrated in FIG. 2, the light emitting element LD may have a rod-like shape, a bar-like shape, or a pillar-like shape which is short in the longitudinal direction (L) (for example, having an aspect ratio less than 1). The light emitting element LD may have a rod-like shape, a bar-like shape, or a pillar-like shape in which the length L there and the diameter D thereof are the same as each other.

The light emitting element LD may include a light-emitting diode (LED) fabricated to have a subminiature size, for example, have a diameter D and/or a length L having a size to a degree of the microscale to the nanoscale.

In case that the light emitting element LD is long (for example, having an aspect ratio greater than 1) in the longitudinal direction (L), the diameter D of the light emitting element LD may approximately range from about 0.5 µm to about 6 µm, and the length L thereof may approximately range from about 1 µm to about 10 µm. However, the diameter D and the length L of the light emitting element LD are not limited thereto. The size of the light emitting element LD may be changed to meet conditions (or design conditions) of a lighting device or a self-emissive display device in which the light emitting element LD is used.

The first semiconductor layer 11 may include, for example, at least one n-type semiconductor layer. For instance, the first semiconductor layer 11 may include an n-type semiconductor layer which may include a semiconductor material of InAlGaN, GaN, AlGaN, InGaN, AlN, and InN and is doped with a first conductive dopant (or an n-type dopant) such as Si, Ge, or Sn. However, the material of the first semiconductor layer 11 is not limited to this, and the first semiconductor layer 11 may be formed of various other materials. The first semiconductor layer 11 may include an upper surface that contacts the active layer 12 and a lower surface that is exposed to the outside, in the longitudinal direction (L) of the light emitting element LD. The lower surface of the first semiconductor layer 11 may correspond to the first end (or the lower end) of the light emitting element LD.

The active layer 12 may be disposed on the first semiconductor layer 11 and have a single or multiple quantum well structure. For example, in case that the active layer 12 has a multiple quantum well structure, the active layer 12 may be formed by periodically repeatedly stacking a barrier layer (not shown), a stain reinforcing layer, and a well layer which are provided as a unit. The stain reinforcing layer may have a lattice constant less than that of the barrier layer so that strain, for example, compressive strain, to be applied to the well layer can be further reinforced. However, the structure of the active layer 12 is not limited to that of the foregoing embodiment.

The active layer 12 may emit light having a wavelength ranging from about 400 nm to about 900 nm and use a double heterostructure. In an embodiment, a clad layer (not illustrated) doped with a conductive dopant may be formed over or under or below the active layer 12 in the longitudinal direction (L) of the light emitting element LD. For example, the cladding layer may be formed as an AlGaN layer or an InAlGaN layer. In an embodiment, a material such as AlGaN or InAlGaN may be used to form the active layer 12, and various other materials may be used to form the active layer 12. The active layer 12 may include a first surface which contacts the first semiconductor layer 11, and a second surface which contacts the second semiconductor layer 13.

If an electric field having a voltage or more is applied to opposite ends of the light emitting element LD, the light emitting element LD emits light by coupling of electron-hole pairs in the active layer 12. Since light emission of the light emitting element LD is controlled based on the foregoing principle, the light emitting element LD may be used as a light source (a light emitting source) of various light emitting devices including a pixel of the display device.

The second semiconductor layer 13 may be disposed on the second surface of the active layer 12 and include a semiconductor layer having a type different from that of the first semiconductor layer 11. For example, the second semiconductor layer 13 may include at least one p-type semiconductor layer. For instance, the second semiconductor layer 13 may include a p-type semiconductor layer which may include at least one semiconductor material of InAlGaN, GaN, AlGaN, InGaN, AlN, and InN and is doped with a second conductive dopant (or a p-type dopant) such as Mg, Zn, Ca, Sr, or Ba. However, the material for forming the second semiconductor layer 13 is not limited to this, and the second semiconductor layer 13 may be formed of various other materials. The second semiconductor layer 13 may include a lower surface that contacts the second surface of the active layer 12 and an upper surface that is exposed to the outside, in the longitudinal direction (L) of the light emitting element LD. Here, the upper surface of the second semiconductor layer 13 may correspond to the second end (or the upper end) of the light emitting element LD.

In an embodiment, the first semiconductor layer 11 and the second semiconductor layer 13 may have different thicknesses in the longitudinal direction (L) of the light emitting element LD. For example, the first semiconductor layer 11 may have a thickness greater than that of the second semiconductor layer 13 in the longitudinal direction (L) of the light emitting element LD. Therefore, the active layer 12 of the light emitting element LD may be disposed closer to the upper surface of the second semiconductor layer 13 than to the lower surface of the first semiconductor layer 11.

Although each of the first semiconductor layer 11 and the second semiconductor layer 13 is formed as a single layer, the disclosure is not limited thereto. In an embodiment, depending on the material of the active layer 12, the first semiconductor layer 11 and the second semiconductor layer 13 each may further include at least one or more layers, for example, a clad layer and/or a tensile strain barrier reducing (TSBR) layer. The TSBR layer may be a strain relief layer of which a lattice structure is disposed between semiconductor layers having different lattice structures so that the strain relief layer functions as a buffer layer to reduce a difference in lattice constant. Although the TSBR layer may be formed as a p-type semiconductor layer such as p-GaInP, p-AlInP, or p-AlGaInP, the disclosure is not limited thereto.

In an embodiment, the light emitting element LD may further include a contact electrode (not illustrated and hereinafter referred to as "first contact electrode") disposed on the second semiconductor layer 13, as well as including the first semiconductor layer 11, the active layer 12, and the second semiconductor layer 13. Furthermore, in an embodiment, the light emitting element LD may further include another contact electrode (not illustrated and hereinafter referred to as "second contact electrode") disposed on the first end of the first semiconductor layer 11.

Each of the first and second contact electrodes may be an ohmic contact electrode, but the disclosure is not limited thereto. In an embodiment, each of the first and second contact electrodes may be a Schottky contact electrode. The first and second contact electrodes may include conductive material. For example, the first and second contact electrodes may include opaque metal such as chromium (Cr), titanium (Ti), aluminum (Al), gold (Au), nickel (Ni), and oxides or alloys thereof, which are used alone or in combination, but the disclosure is not limited thereto. In an embodiment, the first and second contact electrodes may also include transparent conductive oxides such as indium tin oxide (ITO), indium zinc oxide (IZO), zinc oxide (ZnO), indium gallium zinc oxide (IGZO), and indium tin zinc oxide (ITZO).

Materials included in the first and second contact electrodes may be identical to or different from each other. The first and second contact electrodes may be substantially transparent or translucent. Therefore, light generated by the light emitting element LD may pass through the first and second contact electrodes and be emitted outside the light emitting element LD. In an embodiment, in case that light generated by the light emitting element LD is emitted outside the light emitting element LD through a region other than the opposite ends of the light emitting element LD rather than passing through the first and second contact electrodes, the first and second contact electrodes may include opaque metal.

In an embodiment, the light emitting element LD may further include an insulating film 14. However, in some an embodiment, the insulating film 14 may be omitted, or may cover or overlap only some or a number of the first semiconductor layer 11, the active layer 12, and the second semiconductor layer 13.

The insulating film 14 may prevent the active layer 12 from being short-circuited by contacting a conductive material except the first and second semiconductor layers 13. Furthermore, the insulating film 14 may minimize a defect in the surface of the light emitting element LD, thus enhancing the life and emission efficiency of the light emitting element LD. In case that light emitting elements LD are disposed in close contact with each other or closely, the insulating film 14 may prevent undesired short-circuit between the light emitting elements LD. Whether the insulating film 14 is provided is not limited so long as the active layer 12 can be prevented from short-circuiting with an external conductive material.

The insulating film 14 may enclose an entire outer circumferential surface of the light emitting stack including the first semiconductor layer 11, the active layer 12, and the second semiconductor layer 13.

Although the insulating film 14 has been described in the foregoing embodiment as enclosing the entirety of the respective outer circumferential surfaces of the first semiconductor layer 11, the active layer 12, the second semiconductor layer 13, the disclosure is not limited thereto. In an embodiment, in case that the light emitting element LD may include the first contact electrode, the insulating film 14 may enclose the entirety of the respective outer circumferential surfaces of the first semiconductor layer 11, the active layer 12, the second semiconductor layer 13, and the first contact electrode. In an embodiment, the insulating film 14 may not enclose the entirety of the outer circumferential surface of the first contact electrode, or may enclose only a portion of the outer circumferential surface of the first contact electrode, but may not enclose the other or the remaining portion of the outer circumferential surface of the first contact electrode. Furthermore, in an embodiment, in case that the first contact electrode is disposed on the second end (or the upper end) of the light emitting element LD and the second contact electrode is disposed on the first end (or the lower end) of the light emitting element LD, the insulating film 14 may allow at least one area or an area of each of the first and second contact electrodes to be exposed.

The insulating film 14 may include transparent insulating material. For example, the insulating film 14 may be include one or more insulating materials selected from the group constituting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titan strontium oxide ($SrTiO_x$), cobalt oxide ($Co_xO_y$), magnesium oxide (MgO), zinc oxide (ZnO), ruthenium Oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, InxOy:H, niobium oxide ($Nb_xO_y$), magnesium fluoride ($MgF_x$), aluminum fluoride ($AlF_x$), an alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN). However, the disclosure is not limited thereto, and various materials having insulation may be used as the material of the insulating film 14.

The insulating film 14 may be provided in the form of a single layer or in the form of multiple layers including at least double layers. For example, in case that the insulating film 14 is formed in a double layer structure including a first layer and a second layer that are successively stacked each other, the first layer and the second layer may be made of different materials (or substances) and be formed by different processes. In an embodiment, the first layer and the second layer may include a same material or a similar material and may be formed by a successive process.

In an embodiment, the light emitting element LD may be implemented as a light emitting pattern having a core-shell structure. The first semiconductor layer 11 may be disposed in a core of the light emitting element LD, for example, a central portion of the light emitting element LD. The active layer 12 may be provided or disposed and/or formed to enclose the outer circumferential surface of the first semiconductor layer 11. The second semiconductor layer 13 may be provided or disposed and/or formed to enclose the active layer 12. Furthermore, the light emitting element LD may further include a contact electrode (not illustrated) that encloses at least one side or a side of the second semiconductor layer 13. In an embodiment, the light emitting element LD may further include an insulating film 14 which is provided or disposed on the outer circumferential surface of the light emitting pattern having a core-shell structure and may include a transparent insulating material. The light emitting element LD implemented as the light emitting pattern having the core-shell structure may be manufactured in a growth manner.

The light emitting element LD may be employed as a light emitting source (or a light source) for various display devices. The light emitting element LD may be fabricated by a surface treatment process. For example, the light emitting element LD may be surface-treated so that, in case that light emitting elements LD are mixed with a fluidic solution (or solvent) and supplied to each pixel area (for example, an emission area of each pixel or an emission area of each sub-pixel), the light emitting elements LD can be evenly distributed rather than unevenly aggregating in the solution.

A light emitting unit (or a light emitting device) including the light emitting element LD may be used in various types of devices including a display device which requires a light source. For instance, in case that light emitting elements LD are disposed in the pixel area of each pixel of a display panel, the light emitting elements LD may be used as a light source of each pixel. However, the field of application of the light emitting element LD is not limited to the above-mentioned examples. For example, the light emitting element LD may also be used in other types of electronic devices such as a lighting device which requires a light source.

Figure 4A:
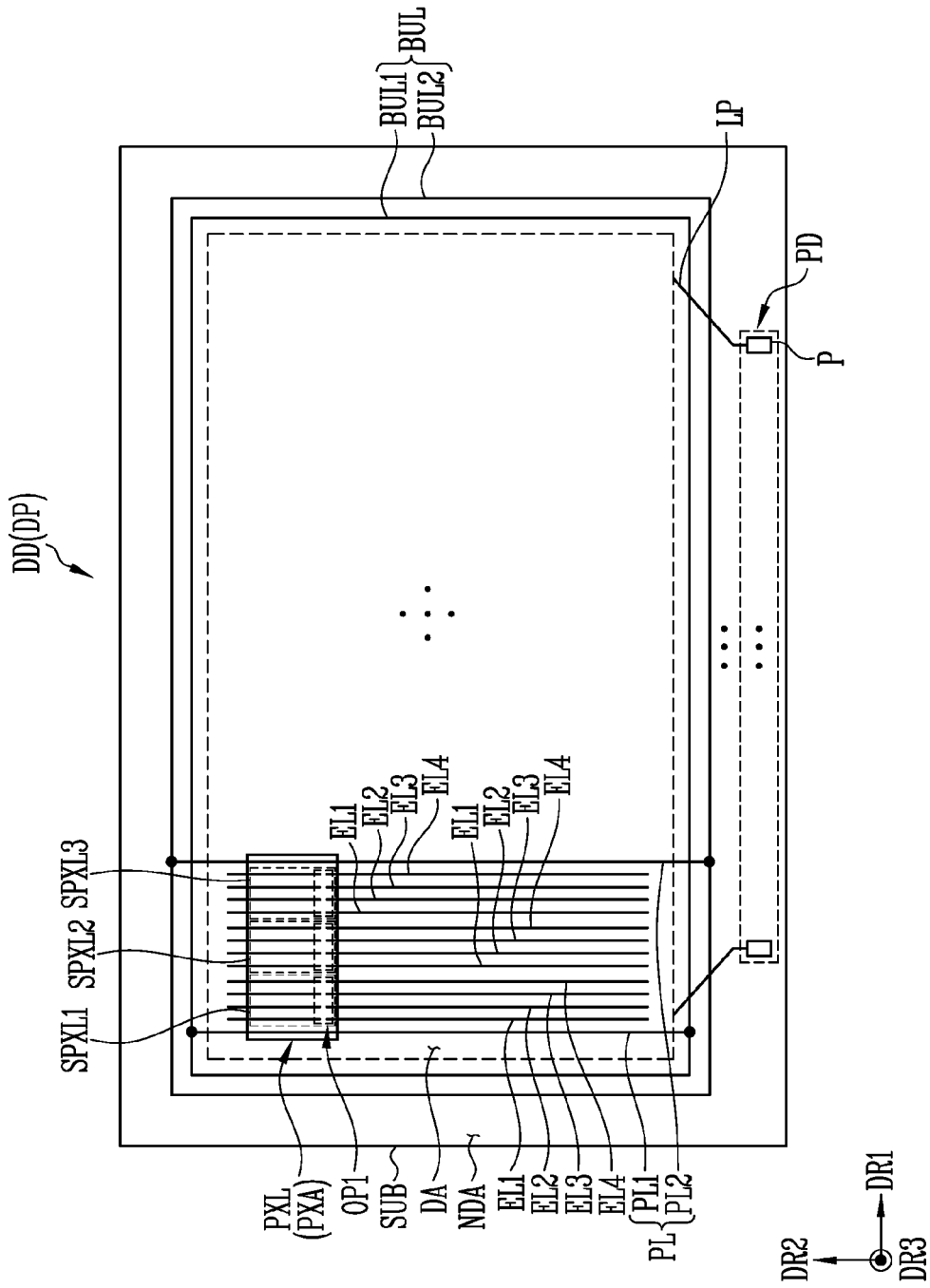
FIGS. 4A and 4B are schematic plan views schematically illustrating a display device in accordance with an embodiment.
Figure 4B:
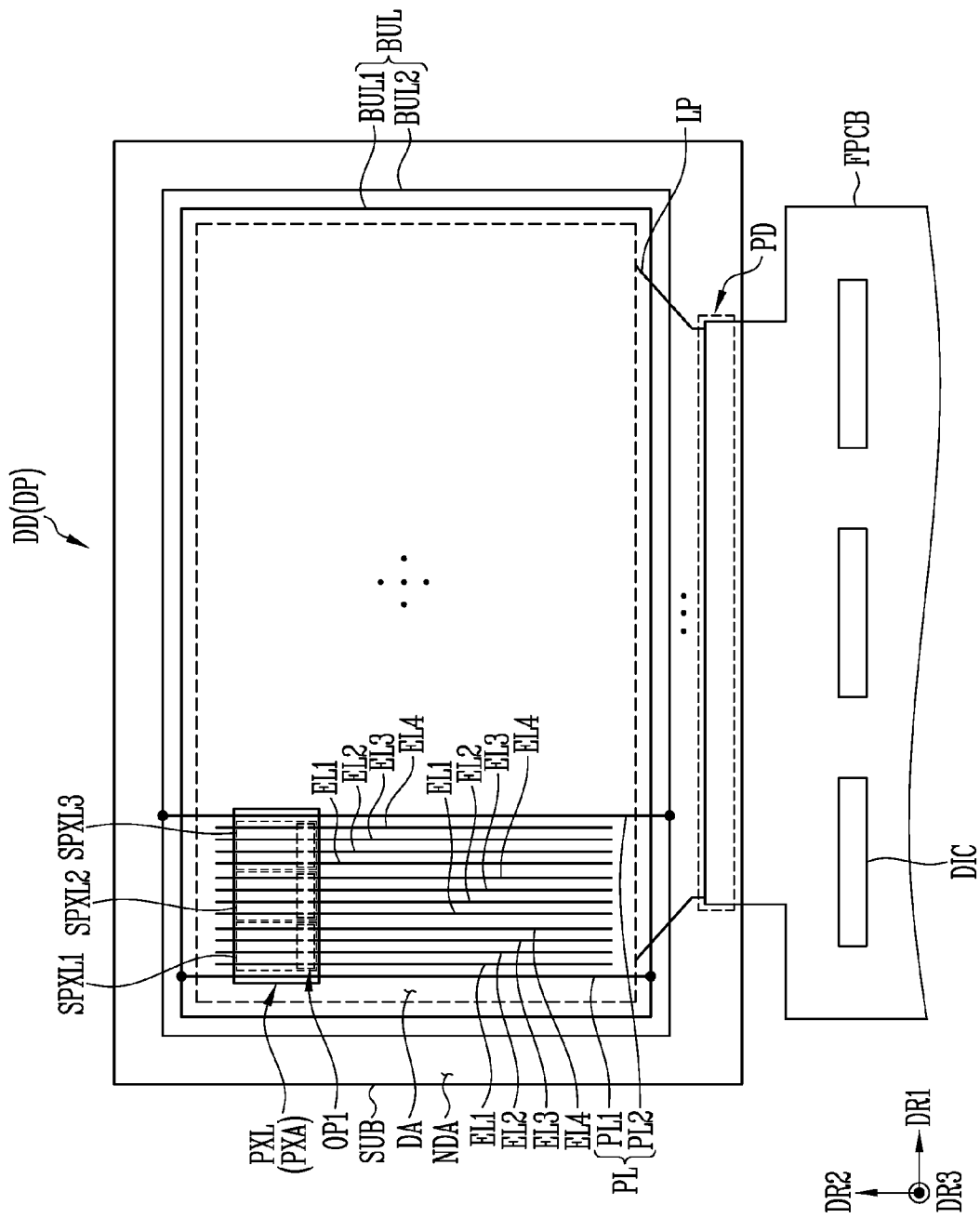

FIGS. 4A and 4B are schematic plan views schematically illustrating a display device DD in accordance with an embodiment.

FIGS. 4A and 4B schematically illustrate, for the sake of explanation, the display device DD, for example, the structure of a display panel DP provided or disposed in the display device DD, focusing on a display area DA in which an image is displayed.

In an embodiment, the term "connection (or coupling)" between two components may embrace an electrical connection and a physical connection.

If the display device DD is an electronic device having a display surface on at least one surface or a surface thereof, for example, a smartphone, a television, a tablet personal computer (PC), a mobile phone, a video phone, an electronic book reader, a desktop PC, a laptop PC, a netbook computer, a workstation, a server, a personal digital assistant (PDA), a portable multimedia player (PMP), an $MP_3$ player, a medical appliance, a camera, or a wearable device, the disclosure may be applied to the display device DD.

Referring to FIGS. 1 to 4B, the display device DD in accordance with an embodiment may include a substrate SUB, pixels PXL, and a line circuit LP.

The display device DD may be classified into a passive matrix type display device and an active matrix type display device according to a method of driving the light emitting element LD. For example, in case that the display device DD in accordance with an embodiment is implemented as an active matrix type display device, each of the pixels PXL may include a driving transistor that controls the amount of current to be supplied to the light emitting element LD, and a switching transistor that transmits data signals to the driving transistor.

The display device DD may be provided in various forms, for example, in the form of a rectangular plate having two pairs of parallel sides, but the disclosure is not limited thereto. In case that the display device DD is provided in the form of a rectangular plate, one of the two pairs of sides may be longer than the other pair. For the sake of explanation, FIGS. 4A and 4B illustrate the case where the display device DD has a substantially rectangular shape with a pair of long sides and a pair of short sides. A direction in which the long sides extend is indicated by a first direction DR1, a direction in which the short sides extend is indicated by a second direction DR2, and a direction perpendicular to the directions in which the long sides and the short sides extend is indicated by a third direction DR3. In the display device DD provided in the form of a rectangular plate, a corner at which a long side and a short side contact (or meet) each other may have a substantially round shape, but the disclosure is not limited thereto.

The substrate SUB may include the display area DA and a non-display area NDA.

The display area DA may be an area in which the pixels PXL for displaying an image are provided. For the convenience sake, FIGS. 4A and 4B illustrate a pixel PXL, but pixels PXL may be substantially provided in the display area DA of the substrate SUB.

The substrate SUB may include a transparent insulating material to allow light transmission. The substrate SUB may be a rigid or flexible substrate.

An area of the substrate SUB is provided as the display area DA in which the pixels PXL are disposed, and the other or remaining area thereof is provided as the non-display area NDA. For example, the substrate SUB may include the display area DA including pixel areas PXA on which the respective pixels PXL are disposed, and the non-display area NDA disposed around the perimeter of the display area DA (or adjacent to the display area DA).

The pixels PXL may be disposed in the pixel area PXA in the display area DA of the substrate SUB. In an embodiment, the pixels PXL may be arranged or disposed in the display area DA in a stripe arrangement structure or a PenTile® arrangement structure, but the disclosure is not limited thereto.

Each of the pixels PXL may include at least one light emitting element LD that is driven in response to a corresponding scan signal and a corresponding data signal. The light emitting element LD may have a small size to a degree of the nanometer scale to the micrometer scale and be connected in parallel to light emitting elements LD disposed adjacent thereto, but the disclosure is not limited thereto. The light emitting element LD may form a light source of the corresponding pixel PXL.

Each of the pixels PXL may include at least one light source, for example, the light emitting element LD illustrated in FIG. 1, which is driven by a signal (for example, a scan signal and a data signal) and/or a power supply (for example, a first driving power supply and a second driving power supply). However, in embodiments, the type of the light emitting element LD which may be used as a light source of each of the pixels PXL is not limited thereto.

A first sub-pixel SPXL1, a second sub-pixel SPXL2, and a third sub-pixel SPXL3 may be provided in each of the pixel areas PXA in which the respective pixels PXL are provided or disposed. In an embodiment, the first sub-pixel SPXL1 may be a red sub-pixel, the second sub-pixel SPXL2 may be a green sub-pixel, and the third sub-pixel SPXL3 may be a blue sub-pixel. However, the disclosure is not limited thereto. In an embodiment, the second sub-pixel SPXL2 may be a red pixel, the first sub-pixel SPXL1 may be a green pixel, and the third sub-pixel SPXL3 may be a blue pixel. As another example, in an embodiment, the third sub-pixel SPXL3 may be a red pixel, the first sub-pixel SPXL1 may be a green pixel, and the second sub-pixel SPXL2 may be a blue pixel.

A first electrode EL1, a second electrode EL2, a third electrode EL3, and a fourth electrode EL4 which may be spaced apart from each other may be disposed in an area (hereinafter, referred to as "sub-pixel area") of each pixel area PXA in which the first to third sub-pixels SPXL1, SPXL2, and SPXL3 are provided or disposed. For example, the first electrode EL1, the second electrode EL2, the third electrode EL3, and the fourth electrode EL4 which are spaced apart from each other in the first direction DR1 and extend in the second direction DR2 may be disposed in the sub-pixel area. At least one light emitting element LD may be disposed (or provided) between two adjacent electrodes of the first electrode EL1, the second electrode EL2, the third electrode EL3, and the fourth electrode EL4. Elements disposed in the pixel area PXA will be described below with reference to FIGS. 7 to 15.

At least one first opening area OP1 (or an electrode separation area) may be disposed in the sub-pixel area. For example, the first opening area OP1 may be disposed on at least one side or a side of each of the first to third sub-pixels SPXL1, SPXL2, and SPXL3 in the second direction DR2. A portion of at least one of the first electrode EL1, the second electrode EL2, the third electrode EL3, and the fourth electrode EL4 may be removed from the first opening area OP1.

A power line PL for supplying a driving voltage to the pixels PXL may be provided or disposed in the display area DA. The power line PL may include a first power line PL1 and a second power line PL2.

The first power line PL1 and the second power line PL2 may extend in a direction, for example, the second direction DR2. First and second power lines PL1 and PL2 may be arranged or disposed in the display areas DA at intervals of at least one pixel PXL (or the pixel area PXA) in the first direction DR1.

The first power line PL1 may be electrically connected in common to pixels PXL that may be successively arranged or disposed in a same direction as a direction in which the first power line PL1 extends. For example, the first power line PL1 may extend in the second direction DR2 and be electrically connected in common to pixels PXL that are successively arranged or disposed in the second direction DR2. Likewise, the second power line PL2 may be electrically connected in common to pixels PXL that are successively arranged or disposed in a same direction as a direction in which the second power line PL2 extends. For example, the second power line PL2 may extend in the second direction DR2 and be electrically connected in common to pixels PXL that are successively arranged or disposed in the second direction DR2.

In an embodiment, an area of the first power line PL1 may overlap the pixel area PXA of at least one pixel PXL, but the disclosure is not limited thereto. The first power line PL1 may be electrically connected with a first bus line BUL1 disposed in the non-display area NDA to thus be electrically connected with a first power pad of a pad part PD through the first bus line BUL1. In case that the display device DD is driven, a voltage of the first driving power supply (for example, a high-potential driving power supply) may be supplied to the first power pad.

An area of the second power line PL2 may overlap the pixel area PXA of at least one pixel PXL, but the disclosure is not limited thereto. The second power line PL2 may be electrically connected with a second bus line BUL2 disposed in the non-display area NDA to thus be electrically connected with a second power pad of the pad part PD through the second bus line BUL2. In case that the display device DD is driven, a voltage of the second driving power supply (for example, a low-potential driving power supply) may be supplied to the second power pad.

The non-display area NDA may be an area in which lines, pads, and/or internal circuits electrically connected with the pixels PXL to drive the pixels PXL are provided or disposed. For example, the line circuit LP, a bus line BUL, and the pad part PD may be provided or disposed in the non-display area NDA.

The non-display area NDA may be provided or disposed on at least one side or a side of the display area DA. The non-display area NDA may enclose the perimeter (or the circumference or the edges) of the display area DA.

The line circuit LP may be provided or disposed in the non-display area NDA and electrically connect a driver DIC (or the pad part PD) with the pixels PXL. The line circuit LP may include a fan-out line electrically connected with signal lines, for example, a scan line, a data line, and an emission control line, which are electrically connected to each pixel PXL to provide signals to the pixel PXL. Furthermore, the line circuit LP may be a fan-out line electrically connected to signal lines, for example, a control line and a sensing line, which are electrically connected to each pixel PXL to compensate in real time for a variation in electrical characteristics of the pixel PXL.

The bus line BUL may enclose at least one side or a side of the display area DA. In an embodiment, the bus line BUL may include the first bus line BUL1 and the second bus line BUL2.

The first bus line BUL1 may be electrically connected with the first power line PL1 and the first power pad of the pad part PD. For example, the first bus line BUL1 may be electrically connected between the first power line PL1 and the first power pad and thus transmit, to the first power line PL1, the voltage of the first driving power supply applied to the first power pad in case that the display device DD is driven.

The first bus line BUL1 may be electrically connected to a first alignment pad provided or disposed on a mother substrate at an operation of aligning the light emitting elements LD in the pixel area PXA of each pixel PXL during an operation of fabricating the display device DD to thus transmit a first alignment signal applied to the first alignment pad to the first electrode EL1 and the fourth electrode EL4 of each of the pixels PXL. To this end, the first bus line BUL1 may be electrically connected with the first and fourth electrodes EL1 and EL4 of each of the pixels PXL and be separated from the first and fourth electrodes EL1 and EL4 of each of the pixels PXL after the alignment of the light emitting elements LD has been completed.

The second bus line BUL2 may be electrically connected with the second power line PL2 and the second power pad of the pad part PD. For example, the second bus line BUL2 may be electrically connected between the second power line PL2 and the second power pad to thus transmit, to the second power line PL2, the voltage of the second driving power supply applied to the second power pad in case that the display device DD is driven.

The second bus line BUL2 may be electrically connected to the second alignment pad provided or disposed on the mother substrate at an operation of aligning the light emitting elements LD to thus transmit a second alignment signal applied to the second alignment pad to the second and third electrodes EL2 and EL3 of the pixels PXL. To this end, the second bus line BUL2 may be electrically connected with the second and third electrodes EL2 and EL3 of each of the pixels PXL and be separated from the second and third electrodes EL2 and EL3 of each of the pixels PXL after the alignment of the light emitting elements LD has been completed.

In an embodiment, at least one of the first and second bus lines BUL1 and BUL2 may have a substantially closed-loop shape. For example, each of the first and second bus lines BUL1 and BUL2 may have a substantially closed-loop shape that encloses the perimeter of the display area DA. However, the disclosure is not limited thereto. In an embodiment, one of the first and second bus lines BUL1 and BUL2 may have a substantially closed-loop shape, and the other may have a shape which does not completely enclose the perimeter of the display area DA, for example, a partially-open-loop shape.

In case that each of the first and second bus lines BUL1 and BUL2 has a substantially closed-loop shape, a voltage drop of the first and second driving power supplies may be reduced or minimized. The first and second bus lines BUL1 and BUL2 may be electrically connected to opposite ends of the first and second power lines PL1 and PL2, respectively, so that voltages of first and second driving power supplies VDD and VSS may be bidirectionally supplied to the first and second power lines PL1 and PL2, respectively. Therefore, a deviation in luminance of the pixels PXL attributable to a voltage drop of the first and second driving power supplies may be mitigated or prevented.

Furthermore, in case that each of the first and second bus lines BUL1 and BUL2 has a substantially closed-loop shape, corresponding alignment signals may be applied to the corresponding first to fourth electrodes EL1, EL2, EL3, and EL4 of each of the pixels PXL in an operation of aligning the light emitting elements LD.

In an embodiment, an additional bus line (not illustrated) which encloses the second bus line BUL2 may be provided. The additional bus line may be disposed at the outer most perimeter (the outermost side) of the bus lines BUL to thus function as a shielding line.

The pad part PD may include pads P. The pads P may supply (or transmit) driving power voltages and signals for driving the pixels PXL and/or the internal circuits provided or disposed in the display area DA.

At least one of the pads P may be the first power pad. The first power pad may be electrically connected with the first bus line BUL1. The first power pad may receive a first alignment signal in an operation of aligning the light emitting elements LD and transmit the first alignment signal to each of the first and fourth electrodes EL1 and EL4 of each pixel PXL through the first bus line BUL1.

At least another one of the pads P may be the second power pad. The second power pad may be electrically connected with the second bus line BUL2. The second power pad may receive a second alignment signal in an operation of aligning the light emitting elements LD and transmit the second alignment signal to each of the second and third electrodes EL2 and EL3 of each pixel PXL through the second bus line BUL2.

The display device DD may further include a circuit board FPCB electrically connected to the display panel DP through the pad part PD, as illustrated in FIG. 4B. The circuit board FPCB may be a flexible printed circuit board, but the disclosure is not limited thereto.

The circuit board FPCB may process various signals input from a printed circuit board (not shown) and output the processed signals to the display panel DP. To this end, an end of the circuit board FPCB may be attached to the display panel DP, and another end (not shown) thereof opposite to the end may be attached to the printed circuit board. The circuit board FPCB may be electrically connected to each of the display panel DP and the printed circuit board by a conductive adhesive component. The conductive adhesive component may include an anisotropic conductive film The driver DIC may be mounted on the circuit board FPCB. Here, the driver DIC may be an integrated circuit (IC). The driver DIC may receive driving signals output from the printed circuit board and output signals to be supplied to the pixels PXL based on the received driving signals. The driver DIC may include a power supply pad electrically connected to each of the first and second power pads so that the voltage of the corresponding driving power supply can be supplied to the first and second power pads in case that the display device DD is driven.

Figure 5:
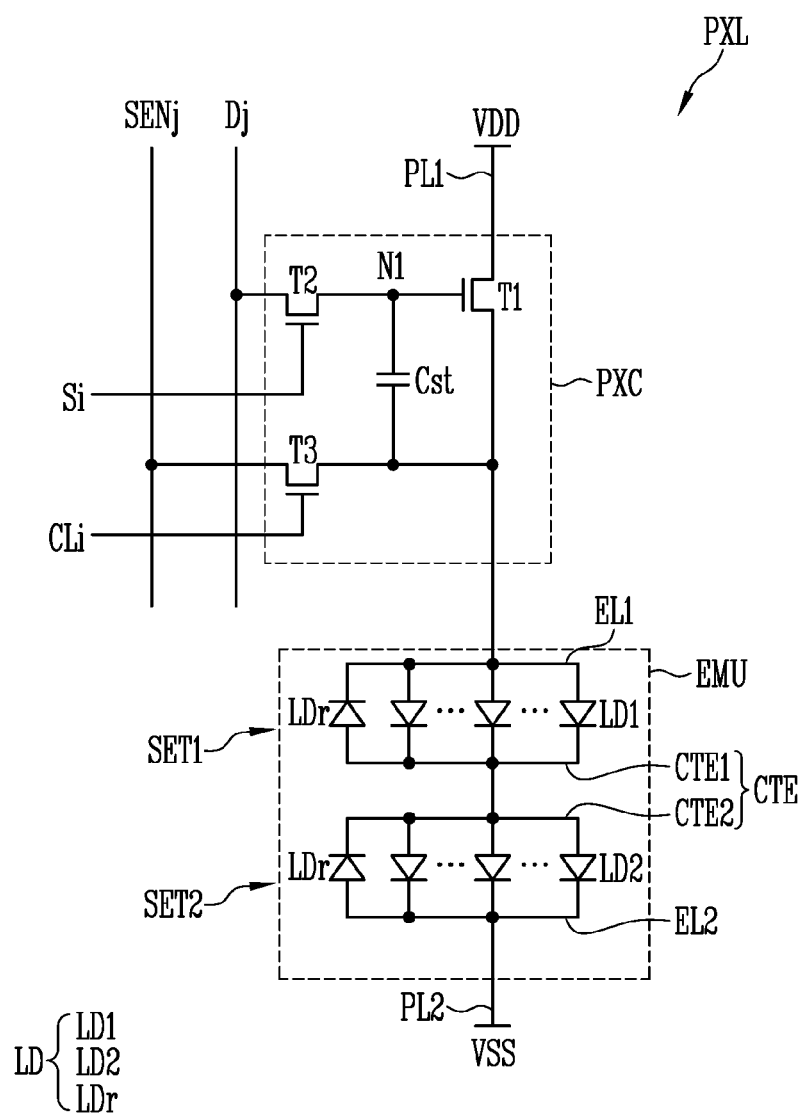
FIG. 5 is a schematic diagram of an equivalent circuit illustrating an embodiment of an electrical connection relationship of components included in each pixel illustrated in FIGS. 4A and 4B.

FIG. 5 is a schematic circuit of an equivalent circuit diagram illustrating an embodiment of an electrical connection relationship of components included in each pixel PXL illustrated in FIGS. 4A and 4B.

For example, FIG. 5 illustrates the electrical connection relationship of components included in a pixel PXL which may be employed in an active matrix type display device in accordance with an embodiment. However, the types of the components included in the pixel PXL to which embodiments may be applied are not limited thereto.

As illustrated in FIG. 5, not only the components included in each of the pixels PXL illustrated in FIGS. 4A and 4B but also an area in which the components are provided are referred to as "pixel PXL."

Referring to FIGS. 1 to 5, each pixel PXL (hereinafter referred to as "pixel") may include an emission unit EMU (or an emitter) that generates light having a luminance corresponding to a data signal. Furthermore, the pixel PXL may selectively further include a pixel circuit PXC that drives the emission unit EMU.

In an embodiment, the emission unit EMU may include light emitting elements LD electrically connected between a first power line PL1 to which the voltage of a first driving power supply VDD is applied, and a second power line PL2 to which the voltage of a second driving power supply VSS is applied. For example, the emission unit EMU may include a first electrode EL1 (or "first alignment electrode") electrically connected to the first driving power supply VDD via the pixel circuit PXC and the first power line PL1, a second electrode EL2 (or "second alignment electrode") electrically connected to the second driving power supply VSS through the second power line PL2, and light emitting elements LD electrically connected in parallel to each other in a same direction between the first and second electrodes EL1 and EL2. In an embodiment, the first electrode EL1 may be an anode, and the second electrode EL2 may be a cathode. Here, the first power line PL1 may be the first power line PL1 described with reference to FIGS. 4A and 4B. The second power line PL2 may be the second power line PL2 described with reference to FIGS. 4A and 4B.

Each of the light emitting elements LD included in the emission unit EMU may include a first end electrically connected to the first driving power supply VDD through the first electrode EL1, and a second end electrically connected to the second driving power supply VSS through the second electrode EL2. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a value equal to or greater than a threshold voltage of the light emitting elements LD during an emission period of the pixel PXL. The first driving power supply VDD may be the first driving power supply described with reference to FIGS. 4A and 4B. The second driving power supply VSS may be the second driving power supply described with reference to FIGS. 4A and 4B.

As described above, the light emitting elements LD, which are electrically connected in parallel to each other in a same direction (for example, in a forward direction) between the first electrode EL1 and the second electrode EL2 to which voltages having different potentials are respectively supplied, may form respective valid light sources. The valid light sources may form the emission unit EMU of the pixel PXL.

The light emitting elements LD of the emission unit EMU may emit light having a luminance corresponding to driving current supplied thereto through the pixel circuit PXC. For example, during each frame period, the pixel circuit PXC may supply driving current, corresponding to a grayscale value of corresponding frame data, to the emission unit EMU. The driving current supplied to the emission unit EMU may be divided into parts which flow into the respective light emitting elements LD. Therefore, each of the light emitting elements LD may emit light having a luminance corresponding to current applied thereto, so that the emission unit EMU may emit light having a luminance corresponding to the driving current.

Although FIG. 5 illustrates the embodiment in which the opposite ends of the light emitting elements LD are electrically connected in a same direction between the first and second driving power supplies VDD and VSS, the disclosure is not limited thereto. In an embodiment, the emission unit EMU may further include at least one invalid light source, for example, a reverse light emitting element LDr, as well as the light emitting elements LD that form the respective valid light sources. The reverse light emitting element LDr, along with the light emitting elements LD that form the valid light sources, may be electrically connected in parallel to each other between the first and second electrodes EL1 and EL2. Here, the reverse light emitting element LDr may be electrically connected between the first and second electrodes EL1 and EL2 in a direction opposite to that of the light emitting elements LD. Even in case that a driving voltage (for example, a forward driving voltage) is applied between the first and second electrodes EL1 and EL2, the reverse light emitting element LDr remains inactive. Therefore, no current substantially does flow through the reverse light emitting element LDr.

The pixel circuit PXC may be electrically connected to a scan line S1 and a data line Dj of the corresponding pixel PXL. For example, in case that the pixel PXL is disposed in an i-th row (where i is an integer) and a j-th column (where j is an integer) of the display area DA, the pixel circuit PXC of the pixel PXL may be electrically connected to an i-th scan line Si and a j-th data line Dj of the display area DA. Furthermore, the pixel circuit PXC may be electrically connected to an i-th control line CLi and a j-th sensing line SENj of the display area DA.

The pixel circuit PXC may include first to third transistors T1, T2, and T3, and a storage capacitor Cst.

The first transistor T1 (or a driving transistor) may include a first terminal electrically connected to the first driving power supply VDD and a second terminal electrically connected to the first electrode EL1 of each of the light emitting elements LD. A gate electrode of the first transistor T1 may be electrically connected to a first node N1. The first transistor T1 may control the amount of driving current to be supplied to the light emitting elements LD in response to the voltage of the first node N1.

The second transistor T2 (or a switching transistor) may include a first terminal electrically connected to the j-th data line Dj and a second terminal electrically connected to the first node N1. Here, the first terminal and the second terminal of the second transistor T2 are different terminals, and, for example, if the first terminal is a source electrode, and the second terminal is a drain electrode. A gate electrode of the second transistor T2 may be electrically connected to the i-th scan line Si.

In case that a scan signal having a voltage capable of turning on the second transistor T2 is supplied from the i-th scan line Si, the second transistor T2 is turned on to electrically connect the j-th data line Dj with the first node N1. Here, a data signal of a corresponding frame is supplied to the j-th data line Dj, and thus the data signal is transmitted to the first node N1. The data signal transmitted to the first node N1 may be charged to the storage capacitor Cst.

The third transistor T3 may be electrically connected between the first transistor T1 and the j-th sensing line SENj. For example, a first terminal of the third transistor T3 may be electrically connected to the first terminal (for example, a source electrode) of the first transistor T1 electrically connected to the first electrode EL1. A second terminal of the third transistor T3 may be electrically connected to the j-th sensing line SENj. A gate electrode of the third transistor T3 may be electrically connected to the i-th control line CLi. The third transistor T3 may be turned on by a control signal having a gate-on voltage supplied to the i-th control dine CLi during a sensing period so that the j-th sensing line SENj and the first transistor T1 can be electrically connected to each other.

The sensing period may be a period in which characteristic information (for example, a threshold voltage, etc. of the first transistor T1) of each of the pixels PXL disposed in the display area DA for example, is extracted.

The storage capacitor Cst may include a first electrode electrically connected to the first driving power supply VDD and a second electrode electrically connected to the first node N1. The storage capacitor Cst may be charged with a voltage corresponding to a data signal supplied to the first node N1 and maintain the charged voltage until a data signal of a subsequent frame is supplied thereto.

Each emission unit EMU may include at least one serial set including light emitting elements LD electrically connected in parallel to each other. In other words, as illustrated in FIG. 5, the emission unit EMU may have a serial/parallel combination or mixed structure.

For example, the emission unit EMU may include first and second serial sets (or stages) SET1 and SET2 which are successively electrically connected between the first and second driving power supplies VDD and VSS. Each of the first and second serial sets SET1 and SET2 may include two electrodes EL1 and CTE1, CTE2 and EL2 that form an electrode pair of the corresponding serial set, and light emitting elements LD electrically connected in parallel to each other in a same direction between the two electrodes EL1 and CTE1, CTE2 and EL2.

The first serial set SET1 may include a first electrode EL1, a first intermediate electrode CTE1, and at least one first light emitting element LD1 electrically connected between the first electrode EL1 and the first intermediate electrode CTE1. Furthermore, the first serial set SET1 may include a reverse light emitting element LDr electrically connected between the first electrode EL1 and the first intermediate electrode CTE1 in a direction opposite to that of the first light emitting element LD1.

The second serial set SET2 may include a second intermediate electrode CTE2, a second electrode EL2, and at least one second light emitting element LD2 electrically connected between the second intermediate electrode CTE2 and the second electrode EL2. Furthermore, the second serial set SET2 may include a reverse light emitting element LDr electrically connected between the second intermediate electrode CTE2 and the second electrode EL2 in a direction opposite to that of the second light emitting element LD2.

The first intermediate electrode CTE1 of the first serial set SET1 and the second intermediate electrode CTE2 of the second serial set SET2 may be integrally provided and electrically connected to each other. In other words, the first intermediate electrode CTE1 and the second intermediate electrode CTE2 may form an intermediate electrode CTE that electrically connects the first serial set SET1 and the second serial set SET2 that are successively provided. In case that the first intermediate electrode CTE1 and the second intermediate electrode CTE2 are integrally provided, the first intermediate electrode CTE1 and the second intermediate electrode CTE2 may be respective different areas of the intermediate electrode CTE.

In the foregoing embodiment, the first electrode EL1 of the first serial set SET1 may be an anode of the emission unit EMU of each pixel PXL. The second electrode EL2 of the second serial set SET2 may be a cathode of the emission unit EMU.

As described above, the emission unit EMU of the pixel PXL including the first and second serial sets SET1 and SET2 (or the light emitting elements LD) electrically connected to each other in the serial/parallel combination or mixed structure may readily adjust driving current or voltage conditions according to specifications of a product to which the emission unit EMU is to be applied.

The emission unit EMU of the pixel PXL including the first and second serial sets SET1 and SET2 (or the light emitting elements LD) electrically connected to each other in the serial/parallel combination or mixed structure may reduce driving current, compared to the emission unit having a structure such that the light emitting elements LD are electrically connected only in parallel to each other. Furthermore, the emission unit EMU of the pixel PXL including the first and second serial sets SET1 and SET2 electrically connected to each other in the serial/parallel combination or mixed structure may reduce driving current to be applied to the opposite ends of the emission unit EMU, compared to the emission unit having a structure such that light emitting elements LD, the number of which is the same as that of the emission unit EMU, are electrically connected in series to each other. The emission unit EMU of the pixel PXL including the first and second serial sets SET1 and SET2 (or the light emitting elements LD) electrically connected to each other in the serial/parallel combination or mixed structure may increase a greater number of light emitting elements LD included between the electrodes EL1, CTE1, CTE2, and EL2, compared to the emission unit having a structure such that the serial sets (or stages) are electrically connected in series to each other. The light output efficiency of the light emitting elements LD may be enhanced. Even if a defect occurs in a specific or determined serial set (or stage), the ratio of light emitting elements LD that emit no light because of the defect may be reduced, so that a reduction in the light output efficiency of the light emitting elements LD can be mitigated.

Although FIG. 5 illustrates an embodiment where all of the first to third transistors T1, T2, and T3 are N-type transistors, the disclosure is not limited thereto. For example, at least one of the first to third transistors T1, T2, and T3 may be changed to a P-type transistor. Furthermore, although FIG. 5 illustrates an embodiment where the emission unit EMU is electrically connected between the pixel circuit PXC and the second driving power supply VSS, the emission unit EMU may be electrically connected between the first driving power supply VDD and the pixel circuit PXC.

The structure of the pixel circuit PXC may be changed in various ways. For example, the pixel circuit PXC may further include at least one transistor element such as a transistor element for initializing the first node N1, and/or a transistor element for controlling an emission time of the light emitting elements LD, or other circuit elements such as a boosting capacitor for boosting the voltage of the first node N1.

The structure of the pixel PXL which may be applied to the disclosure is not limited to the embodiment illustrated in FIG. 5, and the pixel PXL may have various structures. For example, each pixel PXL may be provided in a passive light emitting display device or the like within the spirit and the scope of the disclosure. The pixel circuit PXC may be omitted, and the opposite ends of the light emitting elements LD included in the emission unit EMU may be connected or directly and electrically connected to the i-th scan lines Si, the j-th data line Dj, the first power line PL1 to which the first driving power supply VDD is to be applied, the second power line PL2 to which the second driving power supply VSS is to be applied, and/or a control line.

Figure 6A:
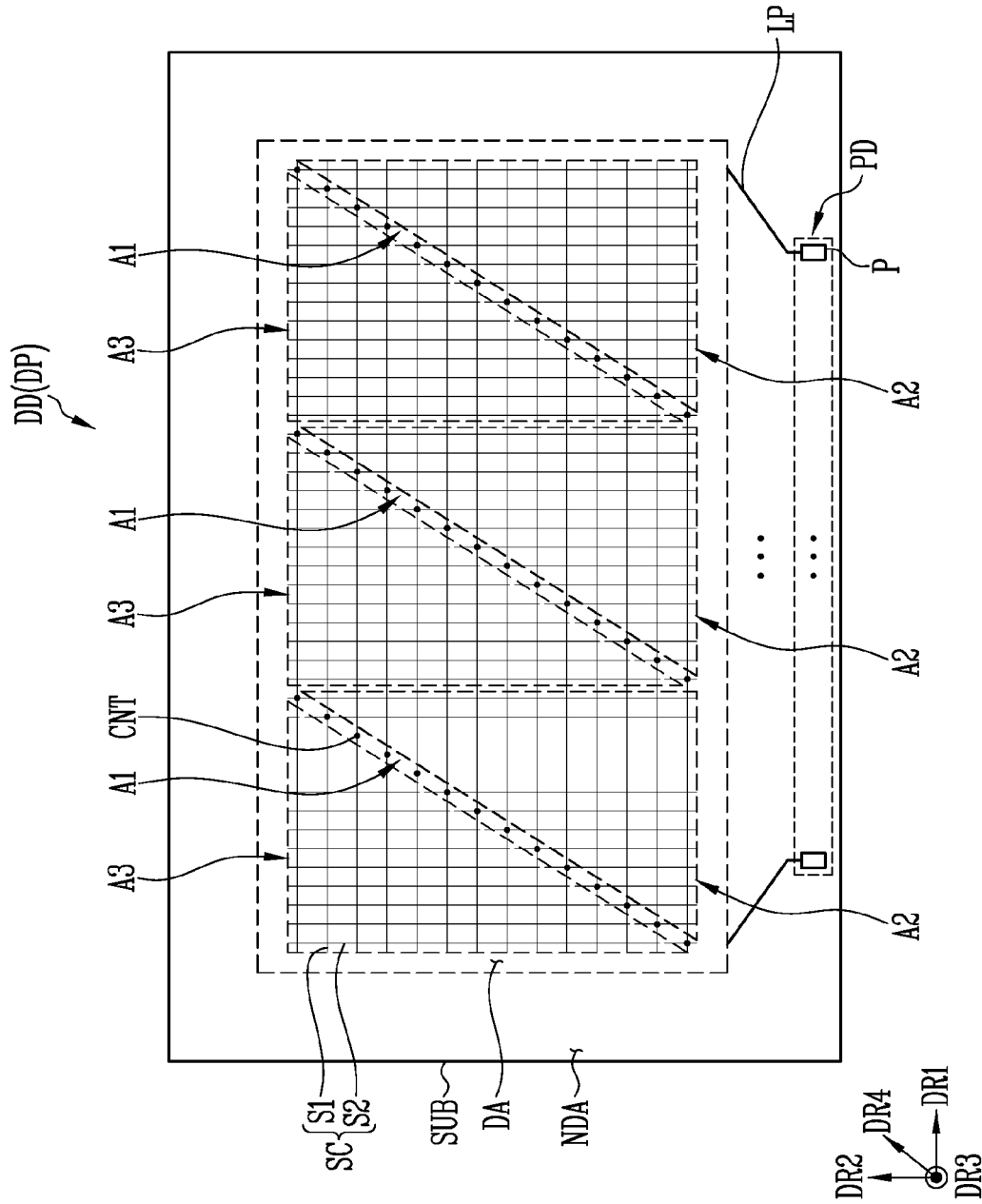
FIGS. 6A and 6B are schematic plan views schematically illustrating a display device in accordance with an embodiment.
Figure 6B:
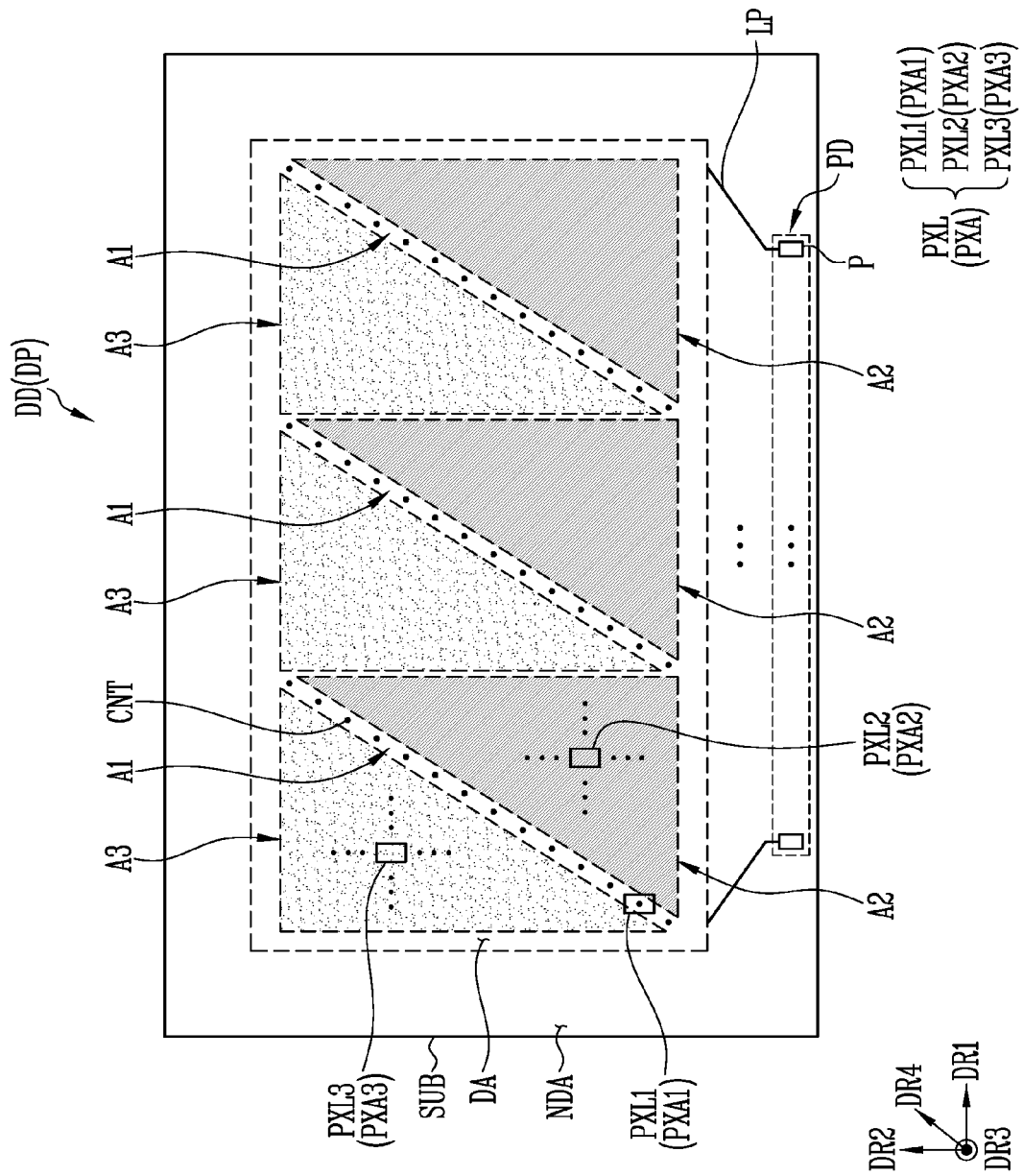

FIGS. 6A and 6B are schematic plan views illustrating a display device DD in accordance with an embodiment. FIGS. 6A and 6B are schematic plan views illustrating only some or a number of components of a display device DD in accordance with an embodiment.

With regard to the display device DD of FIGS. 6A and 6B, the following description will be focused on differences from that of the foregoing embodiments to avoid repetitive descriptions thereof.

As illustrated in FIGS. 6A and 6B, for the sake of explanation, a transverse direction (or a horizontal direction) in a plan view is indicated by a first direction DR1. A longitudinal direction (or a vertical direction) in a plan view is indicated by a second direction DR2. A thickness direction of the substrate SUB in a sectional view is indicated by a third direction DR3. A diagonal direction inclined with respect to the first direction DR1 and/or the second direction DR2 is indicated by a fourth direction DR4. The first to fourth directions DR1 to DR4 may refer to the directions indicated by the first to fourth directions DR1 to DR4, respectively.

Referring to FIGS. 6A and 6B, the display device DD in accordance with an embodiment may include a substrate SUB, pixels PXL, a scan line SC, a line circuit LP, and a pad part PD.

The scan line SC may be a signal line through which a signal (for example, a scan signal and/or a control signal) is transmitted to each of the pixels PXL. In an embodiment, the scan line SC may include a first scan line S1 and a second scan line S2.

The first scan line S1 may extend in the display area DA of the substrate SUB in the transverse direction (or the horizontal direction), for example, in the first direction DR1, and first scan lines S1 may be provided or disposed. The first scan lines S1 may be arranged or disposed in the second direction DR2. Each of the first scan lines S1 may be electrically connected in common to pixels PXL that are successively arranged or disposed in a same direction as the direction in which the first scan line S1 extends. For example, a first scan line S1 may be electrically connected in common to pixels PXL that are arranged or disposed on a same pixel row in the first direction DR1.

The second scan line S2 may extend in the display area DA of the substrate SUB in the longitudinal direction (or the vertical direction), for example, in the second direction DR2, and second scan lines S2 may be provided or disposed. The second scan lines S2 may be arranged or disposed in the first direction DR1. In an embodiment, the number of second scan lines S2 may be greater than the number of first scan lines S1. Some or a number of the second scan lines S2 may be electrically connected with the driver DIC (see FIG. 4B) through the pads P of the pad part PD to receive signals from the driver DIC.

The second scan lines S2 may intersect the first scan lines S1. However, the disclosure is not limited thereto. In an embodiment, only some or a number of the second scan lines S2 may intersect the first scan lines S1. The scan line SC including the first scan lines S1 and the second scan lines S2 may have a substantially mesh shape (or a substantially lattice shape) in a plan view. A signal supplied to the scan line SC may be uniformly transmitted to the respective pixels PXL in the overall or entire area of the display device DD.

In an embodiment, each of the first scan lines S1 may be electrically and/or physically connected with some or a number of the second scan lines S2 that are arranged or disposed in the first direction DR1 through at least one or more contactors CNT. For example, a first scan line S1 may be electrically and/or physically connected, through three contactors CNT, with three second scan lines S2 of the second scan lines S2 that are successively arranged or disposed in the first direction DR1. Each of the three contactors CNT may be a through hole (or a contact hole) which passes through at least one insulating layer disposed between each of the three second scan lines S2 and the first scan line S1. Each of the three second scan lines S2 may receive a signal from the driver DIC in case that the display device DD is driven, and may transmit the signal to the first scan line S1 through the corresponding contactor CNT of the three contactors CNT.

In an embodiment, contactors CNT may be provided or disposed. The contactors CNT may be successively arranged or disposed in a diagonal direction, for example, the fourth direction DR4, inclined with respect to at least one of the first direction DR1 and the second direction DR2.

A first scan line S1 and at least one second scan line S2 may be disposed in a pixel area PXA (see FIG. 4A) in which each of the pixels PXL is provided or disposed. For example, a first scan line S1 and two second scan lines S2 may be disposed in the pixel area PXA. Some or a number of the pixels PXL may include a contactor CNT. The other pixels PXL may not include the contactor CNT. In an embodiment, the pixels PXL may be classified or arranged or grouped into a first pixel PXL1, a second pixel PXL2, and a third pixel PXL3, depending on whether or provided that the pixels PXL include the contactor CNT. In other words, each of the pixels PXL may be a first pixel PXL1, a second pixel PXL2, or a third pixel PXL3 based on whether or not including the contactor CNT.

The first pixel PXL1 may include a contactor CNT. The contactor CNT may be disposed in a first pixel area PXA1 in which the first pixel PXL1 is provided or disposed.

In the first pixel PXL1, a first scan line S1 may contact or directly contact at least one second scan line S2 through the contactor CNT to thus be physically and/or electrically connected to the at least one second scan line S2. In the first pixel PXL1, the at least one second scan line S2 along with the first scan line S1 may function as a scan line SC that supplies a signal (for example, a scan signal and/or a control signal) to the first pixel PXL1.

The second pixel PXL2 may not include a contactor CNT. The contactor CNT may not be disposed in a second pixel area PXA2 in which the second pixel PXL2 is provided or disposed.

The second pixel PXL2 may be electrically connected to a same first scan line S1 as that of the first pixel PXL1 disposed in a same pixel row in the first direction DR1. Therefore, a signal may be transmitted to the first scan line S1 from the second scan line S2 of the first pixel PXL1 through the contactor CNT, so that the signal may be supplied to the second pixel PXL2.

Furthermore, the second pixel PXL2 may be electrically connected in common to at least one second scan line S2 of the first pixel PXL1 disposed in a same pixel column in the second direction DR2. In other words, the second pixel PXL2 may share at least one second scan line S2 of the first pixel PXL1. Therefore, at least one second scan line S2 of the second pixel PXL2, along with one first scan line S1 provided or disposed in the second pixel PXL2, may be used as a scan line SC that supplies a signal. Detailed descriptions thereof will be made with reference to FIG. 13.

The third pixel PXL3 may not include a contactor CNT. The contactor CNT may not be disposed in a third pixel area PXA3 in which the third pixel PXL3 is provided or disposed. The third pixel PXL3 may not be electrically connected in common to at least one second scan line S2 of the first pixel PXL1 disposed in a same pixel column in the second direction DR2. In other words, the third pixel PXL3 may not share at least one second scan line S2 of the first pixel PXL1. At least one second scan line S2 of the third pixel PXL3 may be separated from at least one second scan line S2 of the first pixel PXL1 disposed in a same pixel column as that of the corresponding pixel PXL in the second direction DR2. In an embodiment, at least one second scan line S2 of the third pixel PXL3 may be electrically connected with a power line PL (see FIGS. 4A and 4B) of the corresponding pixel PXL to thus be used as a power line PL. Detailed descriptions thereof will be made with reference to FIGS. 14 and 15.

The first pixel PXL1, the second pixel PXL2, and the third pixel PXL3 may have different structures.

In an embodiment, the display area DA of the substrate SUB may be sectioned into or may include a first area A1, a second area A2, and a third area A3, based on the contactor CNT.

The first area A1 may be an area of the display area DA in which the contactor CNT is disposed. The first pixel PXL1 may be provided or disposed in the first area A1. The second area A2 may be an area of the display area DA that is disposed in a lower portion of the display area DA based on the first area A1. The second pixel PXL2 may be provided or disposed in the second area A2. The third area A3 may be an area of the display area DA that is disposed in an upper portion of the display area DA based on the first area A1. The third pixel PXL3 may be provided or disposed in the third area A3. Therefore, the second pixel PXL2 may be disposed in the display area DA of the substrate SUB such that the second pixel PXL2 is closer to the pad part PD than to the first pixel PXL1 in the second direction DR2. The third pixel PXL3 may be disposed in the display area DA of the substrate SUB such that the third pixel PXL3 is farther from the pad part PD than from the first pixel PXL1 in the second direction DR2.

At least one of the first area A1, the second area A2, and the third area A3 may have a size (or a surface area) different from that of the other areas. For example, the first area A1 may have a size less than that of the second and third areas A2 and A3. The second area A2 and the third area A3 may have a same size or different sizes.

Hereinafter, the structure of each of the first pixel PXL1, the second pixel PXL2, and the third pixel PXL3 will be described with reference to FIGS. 7 to 18.

Figure 7:
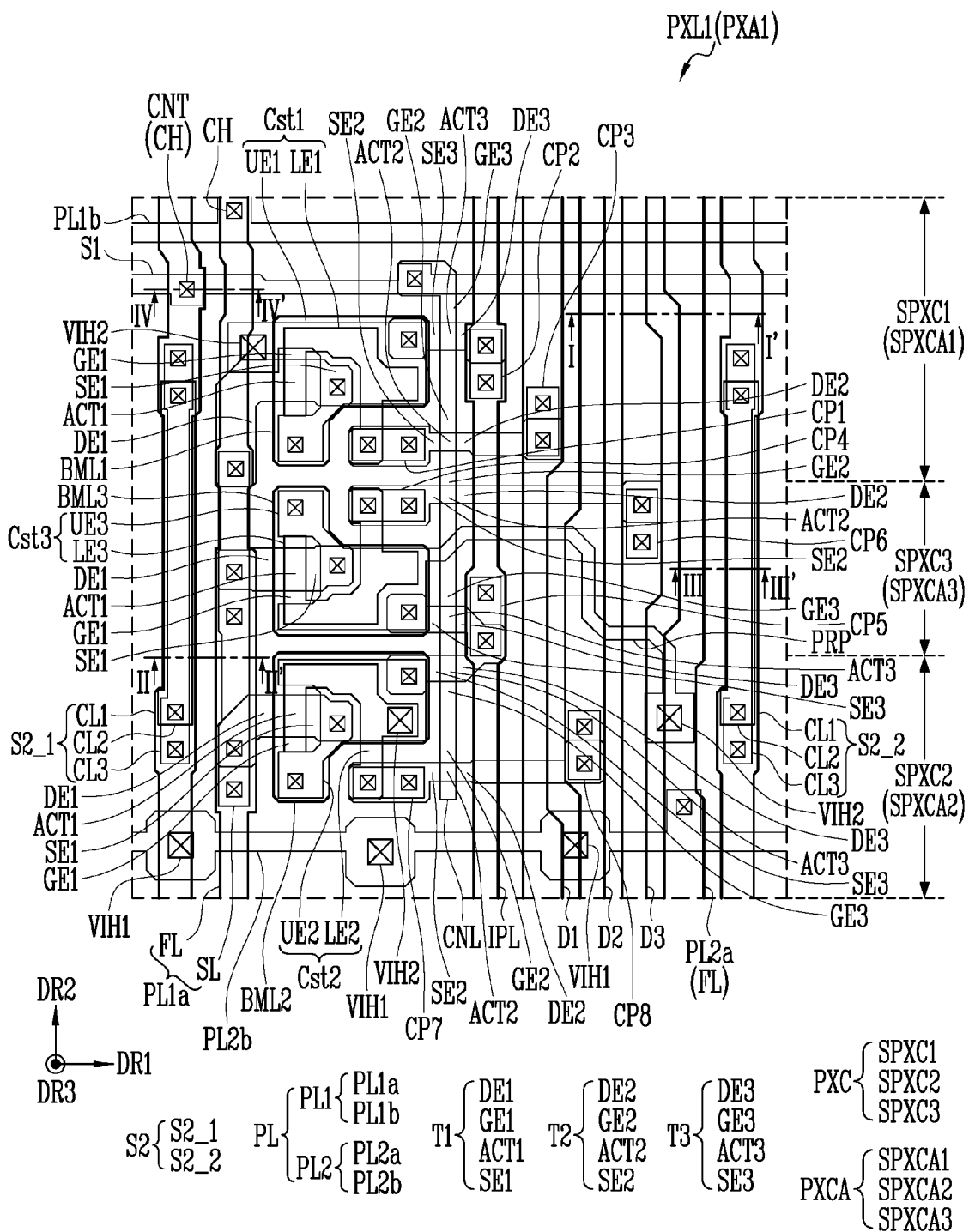
FIG. 7 is a schematic plan view schematically illustrating a pixel circuit area of a first pixel shown in FIG. 6B.
Figure 8:
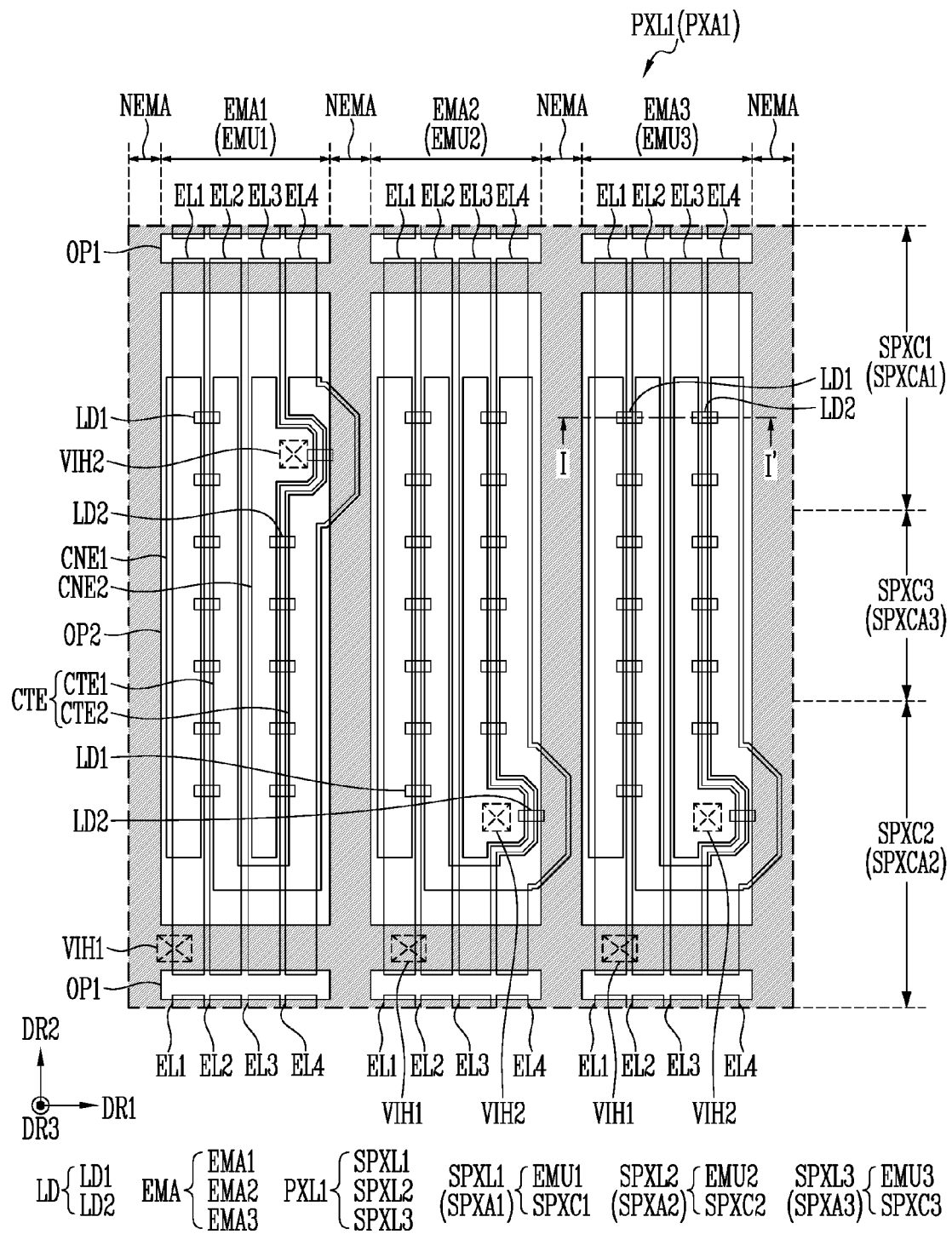
FIG. 8 is a schematic plan view schematically illustrating an emission area of the first pixel shown in FIG. 6B.
Figure 9:
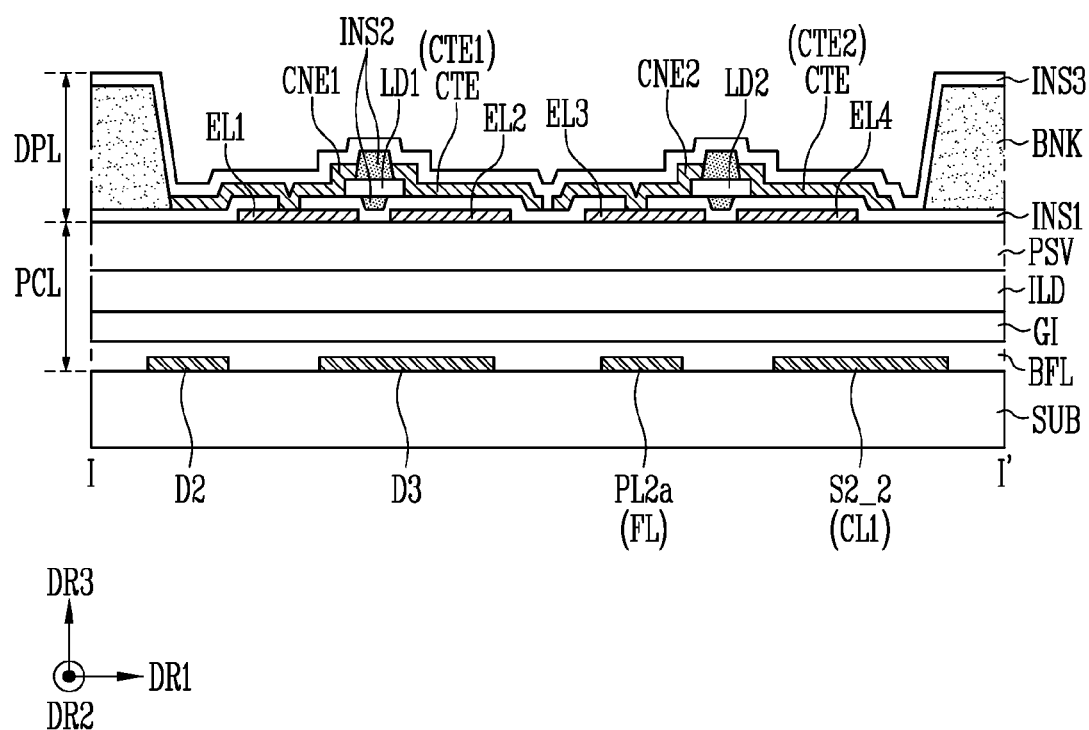
FIGS. 9 to 11 are schematic cross-sectional views taken along line I-I' of FIGS. 7 and 8.
Figure 10:
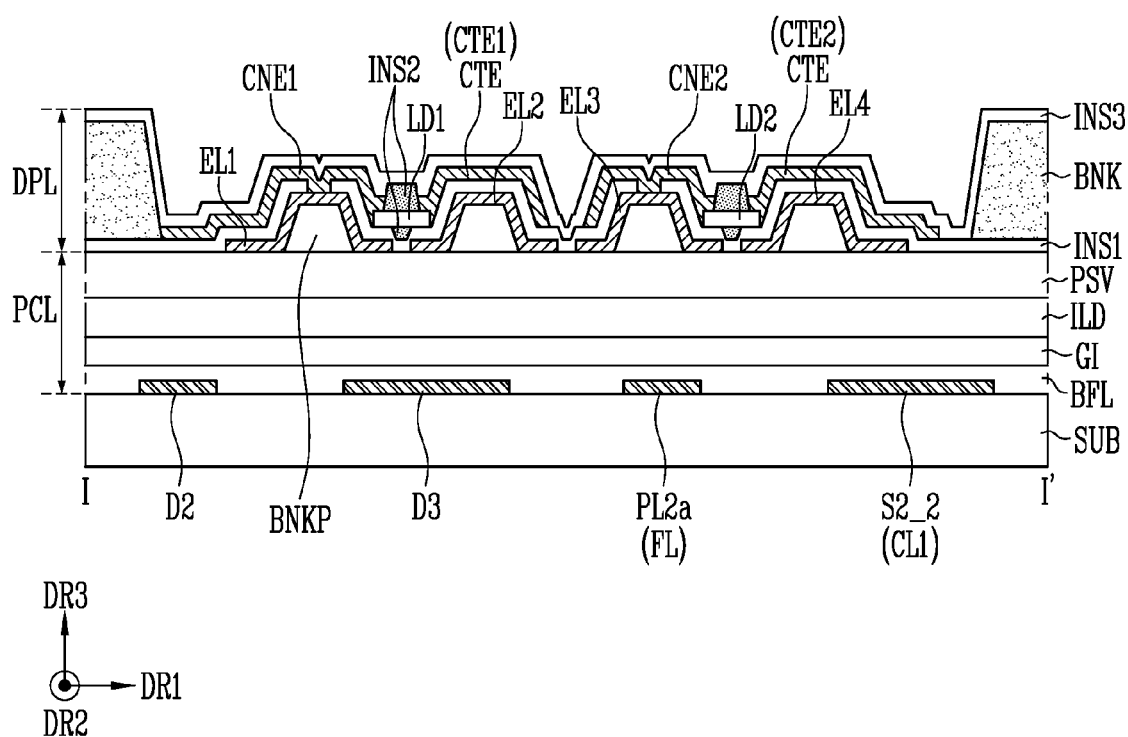
Figure 11:
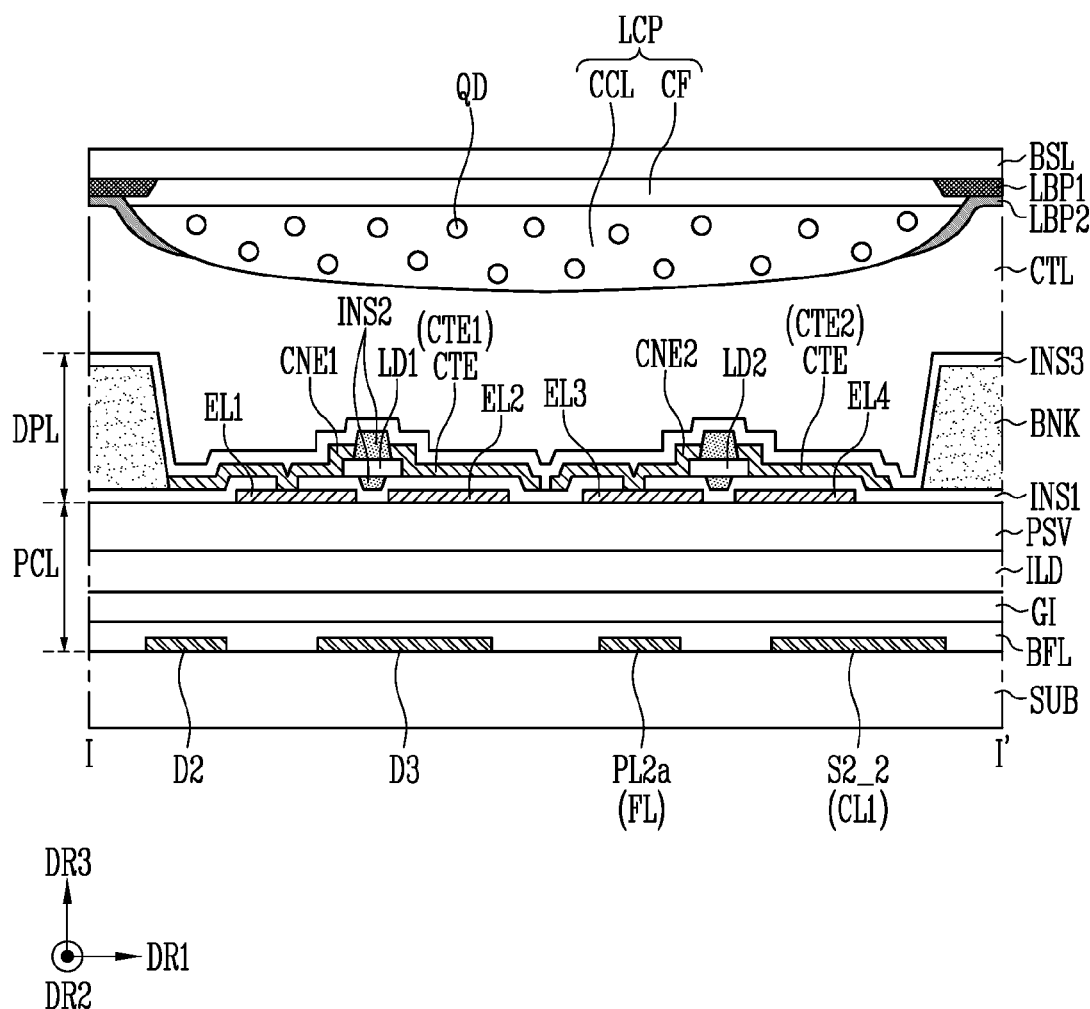
Figure 12A:
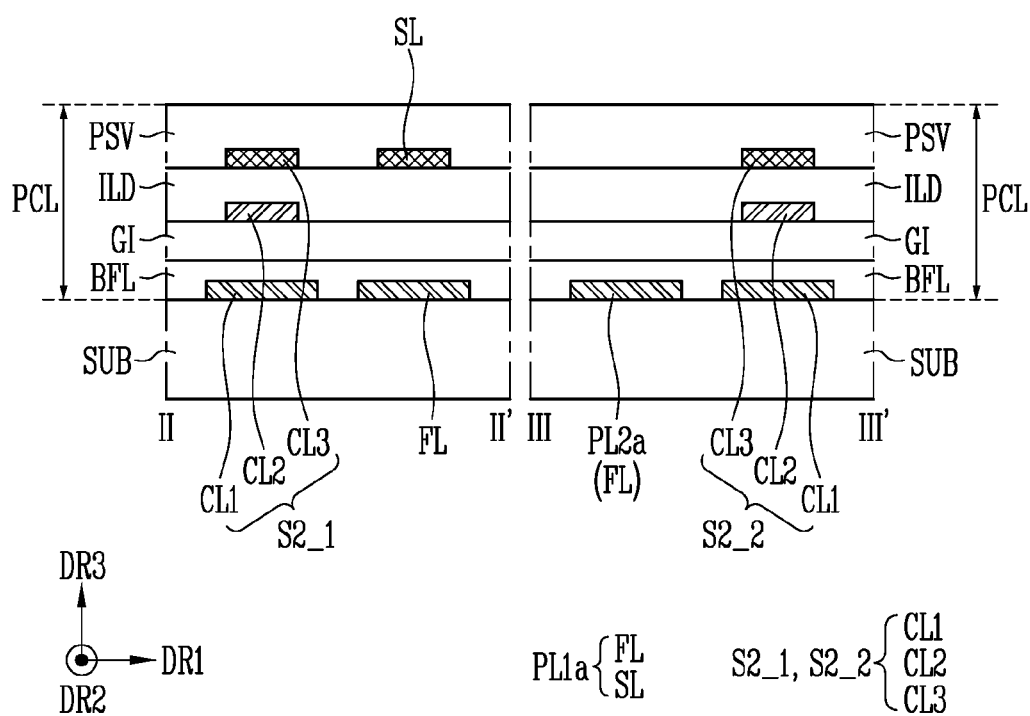
FIG. 12A is a schematic cross-sectional view taken along line II-II' and line III-III' of FIG. 7.
Figure 12B:
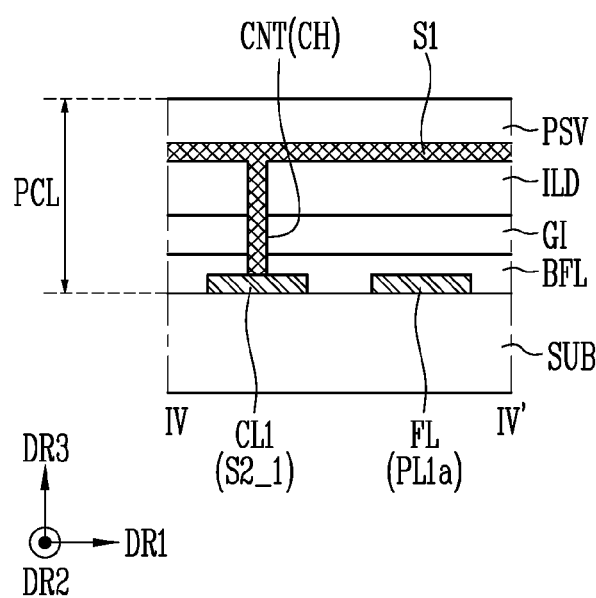
FIG. 12B is a schematic cross-sectional view taken along line IV-IV' of FIG. 7.

FIG. 7 is a schematic plan view illustrating a pixel circuit area PXCA of the first pixel PXL1 shown in FIG. 6B. FIG. 8 is a schematic plan view illustrating an emission area EMA of the first pixel PXL1 shown in FIG. 6B. FIGS. 9 to 11 are schematic sectional views taken along line I-I' of FIGS. 7 and 8. FIG. 12A is a schematic sectional view taken along lines II-II' and III-III' of FIG. 7. FIG. 12B is a schematic sectional view taken along line IV-IV' of FIG. 7.

FIGS. 7 and 8 illustrate a schematic structure of the pixel circuit area PXCA and the emission area EMA in accordance with an embodiment, focusing on the first pixel area PXA1 in which the first pixel PXL1 is disposed.

Compared to the embodiment of FIG. 9, the embodiment of FIG. 10 may further include bank patterns BNKP.

Compared to the embodiment of FIG. 9, the embodiment of FIG. 11 may further include an optical layer LCP and a base layer BSL.

FIGS. 7 to 12B simply illustrate a pixel PXL, for example, illustrate that each electrode is formed as a single electrode and each insulating layer is formed as a single insulating layer, the disclosure is not limited thereto.

In the description of embodiments, "components are provided or disposed and/or formed on a same layer" may mean that the components are formed by a same process, and "components are provided or disposed and/or formed on different layers" may mean that the components are formed by different processes.

As illustrated in FIGS. 7 to 12B, a transverse direction (or a horizontal direction) in a plan view is indicated by a first direction DR1, a longitudinal direction (or a vertical direction) in a plan view is indicated by a second direction DR2, and a thickness direction of the substrate SUB in a sectional view is indicated by a third direction DR3. The first to third directions DR1, DR2, and DR3 may refer to the directions indicated by the first to third directions DR1, DR2, and DR3, respectively.

Referring to FIGS. 6B and 7 to 12B, the first pixel PXL1 may include a first sub-pixel SPXL1, a second sub-pixel SPXL2, and a second sub-pixel SPXL3.

The first sub-pixel SPXL1 may include a first sub-pixel circuit SPXC1 and a first sub-emission unit EMU1. The second sub-pixel SPXL2 may include a second sub-pixel circuit SPXC2 and a second sub-emission unit EMU2. The third sub-pixel SPXL3 may include a third sub-pixel circuit SPXC3 and a third sub-emission unit EMU3. The first sub-pixel circuit SPXC1, the second sub-pixel circuit SPXC2, and the third sub-pixel circuit SPXC3 may form the pixel circuit PXC of the first pixel PXL1. The first sub-emission unit EMU1, the second sub-emission unit EMU2, and the third sub-emission unit EMU3 may form the emission unit EMU (see FIG. 5) of the first pixel PXL1.

An area of the pixel area PXA1 (hereinafter referred to as "first pixel area") of the first pixel PXL1 in which the first sub-pixel SPXL1 is provided or disposed may be the first sub-pixel area SPXA1. An area of the first pixel area PXA1 in which the second sub-pixel SPXL2 is provided or disposed may be the second sub-pixel area SPXA2. An area of the first pixel area PXA1 in which the third sub-pixel SPXL3 is provided or disposed may be the third sub-pixel area SPXA3.

The first pixel area PXA1 may include a first sub-pixel circuit area SPXCA1, a second sub-pixel circuit area SPXCA2, and a third sub-pixel circuit area SPXCA3. For example, the first pixel area PXA1 may be sectioned or divided into or may include the first sub-pixel circuit area SPXCA1, the third sub-pixel circuit area SPXCA3, and the second sub-pixel circuit area SPXCA2 that may be successively arranged or disposed in the second direction DR2.

The first sub-pixel circuit area SPXCA1 may be an area in which the first sub-pixel circuit SPXC1 is provided or disposed. The second sub-pixel circuit area SPXCA2 may be an area in which the second sub-pixel circuit SPXC2 is provided or disposed. The third sub-pixel circuit area SPXCA3 may be an area in which the third sub-pixel circuit SPXC3 is provided or disposed.

The first pixel PXL1 may include a substrate SUB, a pixel circuit layer PCL, and a display element layer DPL.

The substrate SUB may include a transparent insulating material to allow light transmission. The substrate SUB may be a rigid or flexible substrate.

For example, the rigid substrate SUB may be one of a glass substrate, a quartz substrate, a glass ceramic substrate, and a crystalline glass substrate.

The flexible substrate may be either a film substrate or a plastic substrate which may include a polymer organic material. For example, the flexible substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

Material applied to the substrate SUB may have resistance (thermal resistance) to high treatment temperatures during a process of fabricating the display device DD.

Insulating layers and conductive layers may be disposed on the substrate SUB. For example, the insulating layers may include a buffer layer BFL, a gate insulating layer GI, an interlayer insulating layer ILD, a passivation layer PSV, and first to third insulating layers INS1, INS2, and INS3, which may be successively provided or disposed on the substrate SUB. The conductive layers may be provided or disposed and/or formed between the insulating layers. For example, the conductive layers may include a first conductive layer provided or disposed on the substrate SUB, a second conductive layer provided or disposed on the gate insulating layer GI, a third conductive layer provided on the interlayer insulating layer ILD, a fourth conductive layer provided or disposed on the passivation layer PSV, and a fifth conductive layer provided or disposed on the second insulating layer INS2. However, the insulating layers and the conductive layers provided on the substrate SUB are not limited to those of the foregoing embodiment. In an embodiment, except the insulating layers and the conductive layers, other insulating layers and other conductive layers may be provided or disposed on the substrate SUB.

A signal line electrically connected with the first pixel PXL1 may be disposed on the substrate SUB. The signal line may include signal lines that transmit a signal (or a voltage) to the first pixel PXL1. The signal lines may include a first scan line S1, a second scan line S2, data lines D1, D2, and D3, a power line PL, and an initialization power line IPL.

The first scan line S1 may extend in the first direction DR1. A scan signal and a control signal may be selectively applied to the first scan line S1. The first scan line S1 may be one of the first scan lines S1 described with reference to FIG. 6A.

The first scan line S1 may correspond to the third conductive layer provided or disposed on the interlayer insulating layer ILD. The third conductive layer may have a single-layer structure formed of at least one selected from the group consisting of copper (Cu), molybdenum (Mo), tungsten (W), aluminum neodymium (AlNd), titanium (Ti), aluminum (Al), silver (Ag), and an alloy thereof, or may have a double- or multi-layer structure formed of molybdenum (Mo), titanium (Ti), copper (Cu), aluminum (Al), or silver (Ag) to reduce line resistance.

The first scan line S1 may be electrically connected with a connection line CNL through a corresponding contact hole CH. For example, the first scan line S1 may be electrically and/or physically connected with the connection line CNL through the contact hole CH passing through the interlayer insulating layer ILD.

The connection line CNL may correspond to the second conductive layer provided or disposed and/or formed on the gate insulating layer GI. The second conductive layer and the third conductive layer may include a same material or a similar material or include at least one selected from among materials as the material of the third conductive layer.

In an embodiment, the connection line CNL may be integral with a second gate electrode GE2 of the second transistor T2 of each of the first to third sub-pixel circuits SPXC1, SPXC2, and SPXC3. For example, a portion of the connection line CNL may be the second gate electrode GE2 of the second transistor T2 of each of the first to third sub-pixel circuits SPXC1, SPXC2, and SPXC3. Therefore, the connection line CNL may be electrically connected with the second gate electrode GE2 of the second transistor T2 of each of the first to third sub-pixel circuits SPXC1, SPXC2, and SPXC3.

Furthermore, the connection line CNL may be integral with a third gate electrode GE3 of the third transistor T3 of each of the first to third sub-pixel circuits SPXC1, SPXC2, and SPXC3. For example, another portion of the connection line CNL may be the third gate electrode GE3 of the third transistor T3 of each of the first to third sub-pixel circuits SPXC1, SPXC2, and SPXC3. Therefore, the connection line CNL may be electrically connected with the third gate electrode GE3 of the third transistor T3 of each of the first to third sub-pixel circuits SPXC1, SPXC2, and SPXC3.

As described above, since the connection line CNL is electrically connected with the first scan line S1 through the corresponding contact hole CH, the first scan line S1 may be electrically connected with some or a number of components (for example, the second and third transistors T2 and T3) of each of the first to third sub-pixel circuits SPXC1, SPXC2, and SPXC3 through the connection line CNL. The first scan line S1 may supply a scan signal to the second transistor T2 of each of the first to third sub-pixel circuits SPXC1, SPXC2, and SPXC3 during a driving period of the light emitting elements LD and may supply a control signal to the third transistor T3 of each of the first to third sub-pixel circuits SPXC1, SPXC2, and SPXC3 during a sensing period.

The connection line CNL may be a common component provided or disposed in common in the first to third sub-pixel circuits SPXC1, SPXC2, and SPXC3. In other words, the first to third sub-pixel circuits SPXC1, SPXC2, and SPXC3 may share a connection line CNL.

The interlayer insulating layer ILD may be an inorganic insulating layer including an inorganic material. For example, the interlayer insulating layer ILD may include at least one of metal oxides such as silicon nitride ($SiN_x$), silicon oxide ($SiO_x$), silicon oxynitride ($SiO_xN_y$), and aluminum oxide ($AlO_x$). However, the material of the interlayer insulating layer ILD is not limited to that of the foregoing embodiments. In an embodiment, the interlayer insulating layer ILD may be formed as an organic insulating layer including an organic material. The interlayer insulating layer ILD may be provided or disposed in a single-layer structure or a multilayer structure having at least two or more layers.

The gate insulating layer GI and the interlayer insulating layer ILD may include a same material or a similar material, or may include at least one selected from among materials as the material of the interlayer insulating layer ILD. The gate insulating layer GI may be an inorganic insulating layer including an inorganic material.

The data lines D1, D2, and D3 may include a first data line D1, a second data line D2, and a third data line D3 spaced apart from each other in the first direction DR1 and extending in the second direction DR2 different from, for example, intersecting, the first direction DR1. Each of the first to third data lines D1, D2, and D3 may be supplied with a corresponding data signal. Each of the first to third data lines D1, D2, and D3 may be the j-th data line Dj described with reference to FIG. 5.

The first data line D1 may be electrically connected with the second transistor T2 of the first sub-pixel circuit SPXC1. The second data line D2 may be electrically connected with the second transistor T2 of the second sub-pixel circuit SPXC2. The third data line D3 may be electrically connected with the second transistor T2 of the third sub-pixel circuit SPXC3. The first to third data lines D1, D2, and D3 may correspond to the first conductive layer provided or disposed on the substrate SUB. The first conductive layer and the third conductive layer may include a same material or a similar material, or include at least one selected from among materials as the material of the third conductive layer.

The power line PL may include a first power line PL1 and a second power line PL2.

The voltage of the first driving power supply VDD (see FIG. 5) may be applied to the first power line PL1. The first power line PL1 may be the first power line PL1 described with reference to FIG. 5. The first power line PL1 may include a 1a-th power line PL1a and a 1b-th power line PL1b.

The 1a-th power line PL1a may extend in the second direction DR2. In an embodiment, the 1a-th power line PL1a may include a first layer FL and a second layer SL. The first layer FL may correspond to the first conductive layer provided or disposed and/or formed on the substrate SUB. The second layer SL may correspond to the third conductive layer provided or disposed and/or formed on the interlayer insulating layer ILD. The first layer FL and the first to third data lines D1, D2, and D3 may be provided or disposed on a same layer. The second layer SL and the first scan line S1 may be provided or disposed on a same layer. The second layer SL may be electrically connected with the first layer FL through at least one or more contact holes CH. For example, the second layer SL may be electrically and/or physically connected with the first layer FL through at least one or more contact holes CH that successively pass through the buffer layer BFL, the gate insulating layer GI, and the interlayer insulating layer ILD.

The 1b-th power line PL1b may extend in the first direction DR1. The 1b-th power line PL1b may correspond to the third conductive layer provided or disposed and/or formed on the interlayer insulating layer ILD. The 1b-th power line PL1b, the first scan line S1, and the second layer SL of the 1a-th power line PL1a may be provided or disposed on a same layer and may be spaced apart from the first scan line S1 in a plan view. The 1b-th power line PL1b may be electrically connected with the 1a-th power line PL1athrough a corresponding contact hole CH. For example, the 1b-th power line PL1b may be electrically and/or physically connected to the first layer FL of the 1a-th power line PL1a through the contact hole CH that successively passes through the buffer layer BFL, the gate insulating layer GI, and the interlayer insulating layer ILD.

The first power line PL1 including the 1a-th power line PL1a and the 1b-th power line PL1b that are electrically connected to each other may have a mesh structure. In an embodiment, the 1a-th power line PL1a may have a double-layer structure including the first layer FL and the second layer SL, so that line resistance can be reduced, and thus signal distortion can be reduced. However, the disclosure is not limited thereto. In an embodiment, the 1a-th power line PL1a may have a single-layer structure or a multi-layer structure including triple or more layers.

The voltage of the second driving power supply VSS (see FIG. 5) may be applied to the second power line PL2. The second power line PL2 may correspond to the second power line PL2 described with reference to FIG. 5. The second power line PL2 may include a 2a-th power line PL2a and a 2b-th power line PL2b.

The 2a-th power line PL2a may extend in the second direction DR2. The 2a-th power line PL2a may have a single-layer structure including a first layer FL. The first layer FL may correspond to the first conductive layer provided or disposed and/or formed on the substrate SUB. The first layer FL, the first to third data lines D1, D2, and D3, and the first layer FL of the 1a-th power line PL1a may be provided or disposed on a same layer. The first layer FL may be spaced apart from the first to third data lines D1, D2, and D3 and the 1a-th power line PL1a, in a plan view.

Although the foregoing embodiment has been described in which the 2a-th power line PL2a has a single-layer structure including only the first layer FL, the disclosure is not limited thereto. In an embodiment, the 2a-th power line PL2a may have a double-layer structure in a manner similar to that of the first 1a-th power line PL1a. Furthermore, the 2a-th power line PL2a may have a multi-layer structure having triple or more layers.

The 2a-th power line PL2a and the 2b-th power line PL2b may be electrically connected to each other through a corresponding contact hole CH. For example, the 2b-th power line PL2b may be electrically and/or physically connected with the 2a-th power line PL2a through the contact hole CH that successively passes through the buffer layer BFL, the gate insulating layer GI, and the interlayer insulating layer ILD. The second power line PL2 including the 2a-th power line PL2a and the 2b-th power line PL2b that are electrically connected to each other may have a mesh structure.

The second scan line S2 may extend in the second direction DR2 intersecting the first direction DR1, which is a direction in which the first scan line S1 extends. In the first pixel PXL1, the second scan line S2 may intersect the first scan line S1, so that a portion thereof may overlap the first scan line S1. The second scan line S2 may be a signal line which is electrically connected with the driver DIC (see FIG. 4B) disposed on a side of the non-display area NDA of the substrate SUB to selectively receive a scan signal and a control signal from the driver DIC. For example, the second scan line S2 may receive a scan signal form the driver DIC during a driving period of the light emitting elements LD and may receive a control signal from the driver DIC during a sensing period.

In an embodiment, the second scan line S2 may include a 2-1-th scan line S2_1 and a 2-2-th scan line S2_2. The 2-1-th scan line S2_1 and the 2-2-th scan line S2_2 each may be disposed adjacent to the power line PL extending in a direction identical to or similar to the extension direction thereof in the first pixel area PXA1 and be spaced apart from the power line PL. For example, the 2-1-th scan line S2_1 may be disposed adjacent to the 1a-th power line PL1a extending in the second direction DR2 and spaced apart from the 1a-th power line PL1a. The 2-2-th scan line S2_2 may be disposed adjacent to the 2a-th power line PL2a extending in the second direction DR2 and spaced apart from the 2a-th power line PL2a. In the first pixel PXL1, the second scan line S2 may be electrically and/or physically separated from the power line PL of the corresponding pixel PXL.

In an embodiment, each of the 2-1-th scan line S2_1 and the 2-2-th scan line S2_2 may have a triple-layer structure including a first conductive line CL1, a second conductive line CL2, and a third conductive line CL3. Here, the first conductive line CL1 may correspond to the first conductive layer provided or disposed and/or formed on the substrate SUB. The second conductive line CL2 may correspond to the second conductive layer provided or disposed and/or formed on the gate insulating layer GI. The third conductive line CL3 may correspond to the third conductive layer provided or disposed and/or formed on the interlayer insulating layer ILD.

The first conductive line CL1, the first to third data lines D1, D2, and D3, and the first layer FL of each of the 1a-th and 2a-th power lines PL1a and PL2a may be provided or disposed on a same layer. The second conductive line CL2 and the connection line CNL may be provided or disposed on a same layer. The third conductive line CL3, the first scan line S1, and the second layer SL of the 1a-th power line PL1a may be provided or disposed on a same layer. The third conductive line CL3 may be electrically connected to the first conductive line CL1 and the second conductive line CL2 through a corresponding contact hole CH. For example, the third conductive line CL3 may be electrically and/or physically connected with the first conductive line CL1 through the contact hole CH that successively passes through the buffer layer BFL, the gate insulating layer GI, and the interlayer insulating layer ILD. Furthermore, the third conductive line CL3 may be electrically connected with the second conductive line CL2 through a contact hole CH passing through the interlayer insulating layer ILD. Therefore, the first conductive line CL1 and the second conductive line CL2 may be electrically connected to each other through the third conductive line CL3.

In an embodiment, the third conductive line CL3 may be provided or disposed and/or formed on the second conductive line CL2 with the interlayer insulating layer ILD interposed therebetween. The second conductive line CL2 may be provided or disposed and/or formed on the first conductive line CL1 with the gate insulating layer GI and the buffer layer BFL interposed therebetween. The first conductive line CL1, the second conductive line CL2, and the third conductive line CL3 may overlap each other in a plan view and a sectional view.

Although the foregoing embodiment has been described in which each of the 2-1-th scan line S2_1 and the 2-2-th scan line S2_2 has a triple-layer structure including the first conductive line CL1, the second conductive line CL2, and the third conductive line CL3, the disclosure is not limited thereto. In an embodiment, each of the 2-1-th scan line S2_1 and the 2-2-th scan line S2_2 may have a single-layer structure, a double-layer structure, or a multi-layer structure including triple or more layers.

The first conductive layer CL1 of each of the 2-1-th and 2-2-th scan lines S2_1 and S2_2 may be provided or disposed in common in some or a number of the pixels PXL disposed in a pixel column identical to that of the first pixel PXL1 in the second direction DR2. For example, the first conductive layer CL1 of each of the 2-1-th and 2-2-th scan lines S2_1 and S2_2 of the first pixel PXL1 may be provided or disposed in common in the second pixels PXL2 disposed in a pixel column identical to that of the first pixel PXL1 in the second direction DR2. In other words, the first pixel PXL1 and the second pixel PXL2 that are disposed in a same pixel column in the second direction DR2 may share the first conductive line CL1 of each of the 2-1-th and 2-2-th scan lines S2_1 and S2_2.

In an embodiment, the first conductive line CL1 may not be provided or disposed in the third pixels PXL3 that are disposed in a pixel column identical to that of the first pixel PXL1 in the second direction DR2. In other words, the first pixel PXL1 and the third pixel PXL3 that are disposed in a same pixel column in the second direction DR2 may not share the first conductive line CL1.

At least one of the 2-1-th scan line S2_1 and the 2-2-th scan line S2_2 may be electrically connected with the first scan line S1 through a contactor CNT. For example, the first scan line S1 may be electrically connected with the 2-1-th scan line S2_1 through the contactor CNT. In an embodiment, the contactor CNT may be a contact hole CH which successively passes through at least one insulating layer, for example, the buffer layer BFL, the gate insulating layer GI, and the interlayer insulating layer ILD, disposed between the first scan line S1 and the 2-1-th scan line S21.

In the first pixel PXL1, the first scan line S1 may be electrically and/or physically connected with the 2-1-th scan line S2_1 through a contactor CNT and selectively receive a scan signal and a control signal from the 2-1-th scan line S2_1. In the first pixel PXL1, the second scan line S2 may function as a signal line that is electrically connected with the first scan line S1 through the contactor CNT to transmit, along with the first scan line S1, a scan signal and a control signal to some or a number of components of each of the first to third sub-pixel circuits SPXC1, SPXC2, and SPXC3, for example, the second and third transistors T2 and T3.

The initialization power line IPL may extend in the second direction DR2 and be disposed between the 1a-th power line PL1a and the first data line D1. The initialization power line IPL may be the j-th sensing line SENj described with reference to FIG. 5. The voltage of the initialization power supply may be applied to the initialization power line IPL. In an embodiment, the initialization power line IPL may correspond to the first conductive layer provided or disposed and/or formed on the substrate SUB. The initialization power line IPL, the first to third conductive lines D1, D2, and D3, the first layer FL of each of the 1a-th and 2a-th power lines PL1a and PL2a, and the first conductive line CL1 of each of the 2-1-th and 2-2-th scan lines S2_1 and S2_2 may be provided or disposed and/or formed on a same layer.

The initialization power line IPL may be electrically connected with the third transistor T3 of the first sub-pixel circuit SPXC1 through a second conductive pattern CP2 and may be electrically connected with the third transistor T3 of each of the second and third sub-pixel circuits SPXC2 and SPXC3 through a fifth conductive pattern CP5.

The second conductive pattern CP2 may correspond to the third conductive layer provided or disposed and/or formed on the interlayer insulating layer ILD. The second conductive pattern CP2 and the first scan line S1 may be provided or disposed and/or formed on a same layer.

A first end of the second conductive pattern CP2 may be electrically connected with the initialization power line IPL through a corresponding contact hole CH. For example, the first end of the second conductive pattern CP2 may be electrically and/or physically connected with the initialization power line IPL through the contact hole CH that successively passes through the buffer layer BFL, the gate insulating layer GI, and the interlayer insulating layer ILD.

A second end of the second conductive pattern CP2 may be electrically connected with the third transistor T3 of the first sub-pixel circuit SPXC1 through a corresponding contact hole CH. For example, the second end of the second conductive pattern CP2 may be electrically connected with a third drain area DE3 of the third transistor T3 of the first sub-pixel circuit SPXC1 through the contact hole CH that successively passes through the gate insulating layer GI and the interlayer insulating layer ILD.

The fifth conductive pattern CP5 may correspond to the third conductive layer provided or disposed and/or formed on the interlayer insulating layer ILD. The fifth conductive pattern CP5 and the second conductive pattern CP2 may be provided or disposed and/or formed on a same layer.

A first end of the fifth conductive pattern CP5 may be electrically connected with the initialization power line IPL through a corresponding contact hole CH. For example, the first end of the fifth conductive pattern CP5 may be electrically and/or physically connected with the initialization power line IPL through the contact hole CH that successively passes through the buffer layer BFL, the gate insulating layer GI, and the interlayer insulating layer ILD.

A second end of the fifth conductive pattern CP5 may be electrically connected with the third transistor T3 of each of the first and third sub-pixel circuits SPXC2 and SPXC3 through a corresponding contact hole CH. For example, the second end of the fifth conductive pattern CP5 may be electrically connected with the third drain area DE3 of the third transistor T3 of each of the second and third sub-pixel circuits SPXC2 and SPXC3 through the contact hole CH that successively passes through the gate insulating layer GI and the interlayer insulating layer ILD.

The first power line PL1, the second power line PL2, the initialization power line IPL, the connection line CNL, the first scan line S1, and the second scan line S2 may be common components provided or disposed in common in the first to third sub-pixel circuits SPXC1, SPXC2, and SPXC3.

Each of the first to third sub-pixels SPXL1, SPXL2, and SPXL3 may include a pixel circuit layer PCL including a corresponding sub-pixel circuit. For example, the pixel circuit layer PCL of the first sub-pixel SPXL1 may include a buffer layer BFL, a first sub-pixel circuit SPXC1, and a passivation layer PSV. The pixel circuit layer PCL of the second sub-pixel SPXL2 may include a buffer layer BFL, a second sub-pixel circuit SPXC2, and a passivation layer PSV. The pixel circuit layer PCL of the third sub-pixel SPXL3 may include a buffer layer BFL, a third sub-pixel circuit SPXC3, and a passivation layer PSV.

The buffer layer BFL may be provided or disposed on the first conductive layer and prevent impurities, etc. from diffusing into each of the first to third sub-pixel circuits SPXC1, SPXC2, and SPXC3. The buffer layer BFL may be an inorganic insulating layer formed of an inorganic material. The buffer layer BFL may include at least one of silicon nitride ($SiN_x$), silicon oxide ($SiO_x$), silicon oxynitride ($SiO_xN_y$), and aluminum oxide ($AlO_x$). The buffer layer BFL may be provided or disposed in a single-layer structure or a multi-layer structure having at least two or more layers. In case that the buffer layer BFL has a multi-layer structure, the respective layers may be formed of a same material or a similar material or different materials. The buffer layer BFL may be omitted depending on the material of the substrate SUB or processing conditions.

Each of the first to third sub-pixel circuits SPXC1, SPXC2, and SPXC3 may include a first transistor T1, a second transistor T2, a third transistor T3, and a storage capacitor Cst. For example, the first sub-pixel circuit SPXC1 may include first to third transistors T1, T2, and T3 and a first storage capacitor Cst1. The second sub-pixel circuit SPXC2 may include first to third transistors T1, T2, and T3 and a second storage capacitor Cst2. The third sub-pixel circuit SPXC3 may include first to third transistors T1, T2, and T3 and a third storage capacitor Cst3. The first transistor T1 of each of the first to third sub-pixel circuits SPXC1 SPXC2, and SPXC3 may correspond to the first transistor T1 described with reference to FIG. 5. The second transistor T2 of each of the first to third sub-pixel circuits SPXC1 SPXC2, and SPXC3 may correspond to the second transistor T2 described with reference to FIG. 5. The third transistor T3 of each of the first to third sub-pixel circuits SPXC1, SPXC2, and SPXC3 may correspond to the third transistor T3 described with reference to FIG. 5.

The first sub-pixel circuit SPXC1, the second sub-pixel circuit SPXC2, and the third sub-pixel circuit SPXC3 may have a substantially identical or similar structure. Hereinafter, the first sub-pixel circuit SPXC1 of the first to third sub-pixel circuits SPXC1, SPXC2, and SPXC3 will be described as a representative example, and the second and third sub-pixel circuits SPXC2 and SPXC3 will be described in brief.

The first sub-pixel circuit SPXC1 may include a first transistor T1 a second transistor T2, a third transistor T3, and a first storage capacitor Cst1.

The first transistor T1 may include a first gate electrode GE1, a first active pattern ACT1, a first source electrode SE1, and a first drain area DE1.

The first gate electrode GE1 may be electrically connected to a second source area SE2 of the second transistor T2 through a first conductive pattern CP1. The first gate electrode GE1 may correspond to the second conductive layer provided or disposed and/or formed on the gate insulating layer GI. The first gate electrode GE1 and the connection line CNL may be provided or disposed and/or formed on a same layer.

The first conductive pattern CP1 may correspond to the third conductive layer. A first end of the first conductive pattern CP1 may be electrically connected with the first gate electrode GE1 through a corresponding contact hole CH. For example, the first end of the first conductive pattern CP1 may be electrically and/or physically connected with the first gate electrode GE1 through the contact hole CH passing through the interlayer insulating layer ILD. A second end of the first conductive pattern CP1 may be electrically connected with the second source area SE2 through a corresponding contact hole CH. For example, the second end of the first conductive pattern CP1 may be electrically and/or physically connected with the second source area SE2 through the contact hole CH that successively passes through the gate insulating layer GI and the interlayer insulating layer ILD.

The first active pattern ACT1, the first source area SE1, and a second drain area DE2 each may be a semiconductor pattern formed of polysilicon, amorphous silicon, oxide semiconductor, etc. within the spirit and the scope of the disclosure. Each of the first active pattern ACT1, the first source area SE1, and the first drain area DE1 may be formed of an undoped semiconductor layer or a semiconductor layer doped with an impurity. For example, each of the first source area SE1 and the first drain area DE1 may be formed as a semiconductor layer doped with an impurity. The first active pattern ACT1 may be formed as an undoped semiconductor layer. For example, an n-type impurity may be used as the impurity.

The first active pattern ACT1, the first source area SE1, and the first drain area DE1 may be provided or disposed and/or formed on the buffer layer BFL.

The first active pattern ACT1 may be a channel area of the first transistor T1 as an area overlapping the first gate electrode GE1. In case that the first active pattern ACT1 is relatively long, the channel area of the first transistor T1 may be relatively long. A driving range of a voltage (or a signal) to be applied to the first transistor T1 may be increased. Therefore, the grayscale of light (or rays) emitted by the light emitting elements LD may be precisely controlled.

The first source area SE1 may be electrically connected to (contact) a first end of the first active pattern ACT1. Furthermore, the first source area SE1 may be electrically connected with a first bottom metal layer BML1 through a contact hole CH passing through the buffer layer BFL.

The first bottom metal layer BML1 may correspond to the first conductive layer provided or disposed and/or formed on the substrate SUB. The first bottom metal layer BML1, the first to third data lines D1, D2, and D3, the 1a-th and 2a-th power lines PL1a and PL2a, and the first conductive line CL1 of each of the 2-1-th and 2-2-th scan lines S2_1 and S2_2, and the initialization power line IPL may be provided or disposed and/or formed on a same layer. The first bottom metal layer BML1 may be electrically and/or physically connected to the first source area SE1 through a corresponding contact hole CH. If the first bottom metal layer BML1 is electrically connected with the first transistor T1, a swing width margin of the second driving power supply VSS may be further increased. A driving range of a voltage to be applied to the first gate electrode GE1 of the first transistor T1 may be increased.

The first drain area DE1 may be electrically connected to (or contact) a second end of the first active pattern ACT1. The first drain area DE1 may be electrically connected with the 1a-th power line PL1a through a corresponding contact hole CH. For example, the first drain area DE1 may be electrically and/or physically connected with the first layer FL of the 1a-th power line PL1a through the contact hole CH passing through the buffer layer BFL.

The second transistor T2 may include a second gate electrode GE2, a second active pattern ACT2, a second source area SE2, and a second drain area DE2.

The second gate electrode GE2 may be integral with the connection line CNL. The second gate electrode GE2 may correspond to an area of the connection line CNL. As described above, since the connection line CNL is electrically connected with the first scan line S1 through a corresponding contact hole CH, a signal (for example, a scan signal) applied to the first scan line S1 may be supplied to the second gate electrode GE2.

The second active pattern ACT2, the second source area SE2, and the second drain area DE2 each may be a semiconductor pattern formed of polysilicon, amorphous silicon, oxide semiconductor, etc. within the spirit and the scope of the disclosure. Each of the second active pattern ACT2, the second source area SE2, and the second drain area DE2 may be formed as an undoped semiconductor layer or a semiconductor layer doped with an impurity. For example, each of the second source area SE2 and the second drain area DE2 may be formed as a semiconductor layer doped with an impurity. The second active pattern ACT2 may be formed as an undoped semiconductor layer. For example, an n-type impurity may be used as the impurity.

The second active pattern ACT2, the second source area SE2, and the second drain area DE2 may be provided or disposed and/or formed on the buffer layer BFL.

The second active pattern ACT2 may be a channel area of the second transistor T2 as an area overlapping the second gate electrode GE2.

The second source area SE2 may be electrically connected to (contact) a first end of the second active pattern ACT2. Furthermore, the second source area SE2 may be electrically connected to the first gate electrode GE1 through the first conductive pattern CP1.

The second drain area DE2 may be electrically connected to (or contact) a second end of the second active pattern ACT2. Furthermore, the second drain area DE2 may be electrically connected to the first data line D1 through a third conductive pattern CP3.

The third conductive pattern CP3 may correspond to the third conductive layer provided or disposed and/or formed on the interlayer insulating layer ILD. A first end of the third conductive pattern CP3 may be electrically and/or physically connected with the first data line D1 through the contact hole CH that successively passes through the buffer layer BFL, the gate insulating layer GI, and the interlayer insulating layer ILD. A second end of the third conductive pattern CP3 may be electrically connected to the second drain area DE2 through a contact hole CH that successively passes through the gate insulating layer GI and the interlayer insulating layer ILD. The second drain area DE2 and the first data line D1 may be electrically connected to each other through the third conductive pattern CP3.

The third transistor T3 may include a third gate electrode GE3, a third active pattern ACT3, a third source area SE3, and a third drain area DE3.

The third gate electrode GE3 may be integral with the connection line CNL. The third gate electrode GE3 may correspond to another area of the connection line CNL. As described above, since the connection line CNL is electrically connected with the first scan line S1 through a corresponding contact hole CH, a signal (for example, a control signal) applied to the first scan line S1 may be supplied to the third gate electrode GE3.

The third active pattern ACT3, the third source area SE3, and the third drain area DE3 each may be a semiconductor pattern formed of polysilicon, amorphous silicon, oxide semiconductor, etc. within the spirit and the scope of the disclosure. Each of the third active pattern ACT3, the third source area SE3, and the third drain area DE3 may be formed as an undoped semiconductor layer or a semiconductor layer doped with an impurity. For example, each of the third source area SE3 and the third drain area DE3 may be formed as a semiconductor layer doped with an impurity. The third active pattern ACT3 may be formed as an undoped semiconductor layer. For example, an n-type impurity may be used as the impurity.

The third active pattern ACT3, the third source area SE3, and the third drain area DE3 may be provided or disposed and/or formed on the buffer layer BFL.

The third active pattern ACT3 may correspond to a channel area of the third transistor T3 as an area overlapping the third gate electrode GE3.

The third source area SE3 may be electrically connected to (contact) a first end of the third active pattern ACT3. Furthermore, the third source area SE3 may be electrically and/or physically connected with the first bottom metal layer BML1 through a contact hole CH passing through the buffer layer BFL.

The third drain area DE3 may be electrically connected to (or contact) a second end of the third active pattern ACT3. Furthermore, the third drain area DE3 may be electrically connected to the initialization power line IPL through the second conductive pattern CP2.

The first storage capacitor Cst1 may include a first lower electrode LE1 and a first upper electrode UE1. Here, the first storage capacitor Cst1 may be the storage capacitor Cst described with reference to FIG. 5.

The first lower electrode LE1 may be integral with the first gate electrode GE1. The first lower electrode LE1 may be an area of the first gate electrode GE1.

The first upper electrode UE1 may overlap the first lower electrode LE1 in a plan view and have a size (or a surface area) greater than that of the first lower electrode LE1, but the disclosure is not limited thereto. In a plan view, the first upper electrode UE1 may overlap each of the first source area SE1 and the third source area SE3. The first upper electrode UE1 may correspond to the third conductive layer provided or disposed and/or formed on the interlayer insulating layer ILD.

The first upper electrode UE1 may be electrically and/or physically connected with the first bottom metal layer BML1 through the contact hole CH that successively passes through the buffer layer BFL, the gate insulating layer GI, and the interlayer insulating layer ILD. As described above, since the first source area SE1 and the third source area SE3 are electrically connected with the first bottom metal layer BML1, the first upper electrode UE1 may be electrically and/or physically connected with the first and third source areas SE1 and SE3 through the first bottom metal layer BML1.

The second sub-pixel circuit SPXC2 may include a first transistor T1, a second transistor T2, a third transistor T3, and a second storage capacitor Cst2.

The first transistor T1 may include a first gate electrode GE1, a first active pattern ACT1, a first source electrode SE1, and a first drain area DE1.

The first gate electrode GE1 may be electrically connected to a second source area SE2 of the second transistor T2.

The first active pattern ACT1 may be a channel area of the first transistor T1.

The first source electrode SE1 may be electrically connected to the first active pattern ACT1. Furthermore, the first source area SE1 may be electrically and/or physically connected with a second bottom metal layer BML2 through a contact hole CH passing through the buffer layer BFL.

The second bottom metal layer BML2 may be a component corresponding to the first bottom metal layer BML1. The second bottom metal layer BML2 may correspond to the first conductive layer provided or disposed and/or formed on the substrate SUB. The second bottom metal layer BML2 may be electrically and/or physically connected to the first source area SE1 through a corresponding contact hole CH. Furthermore, the second bottom metal layer BML2 may be electrically and/or physically connected with the third source area SE3 of the third transistor T3 through a contact hole CH passing through the buffer layer BFL. The second bottom metal layer BML2 may be electrically and/or physically connected with a second upper electrode UE2 through a contact hole CH that successively passes through the buffer layer BFL, the gate insulating layer GI, and the interlayer insulating layer ILD.

The first drain area DE1 may be electrically connected to the first active pattern ACT1. Furthermore, the first drain area DE1 may be electrically and/or physically connected with the first layer FL of the 1a-th power line PL1a through a contact hole CH passing through the buffer layer BFL.

The second transistor T2 may include a second gate electrode GE2, a second active pattern ACT2, a second source area SE2, and a second drain area DE2.

The second gate electrode GE2 may be integral with the connection line CNL and be electrically connected with the first scan line S1.

The second active pattern ACT2 may be a channel area of the second transistor T2.

The second source area SE2 may be electrically connected to the second active pattern ACT2. Furthermore, the second source area SE2 may be electrically connected to the first gate electrode GE1 through a seventh conductive pattern CP7.

The seventh conductive pattern CP7 may correspond to the third conductive layer provided or disposed and/or formed on the interlayer insulating layer ILD. A first end of the seventh conductive pattern CP7 may be electrically and/or physically connected with the second source area SE2 through a contact hole CH that successively passes through the gate insulating layer GI and the interlayer insulating layer ILD. A second end of the seventh conductive pattern CP7 may be electrically connected with the first gate electrode GE1 through a contact hole CH passing through the interlayer insulating layer ILD.

The second drain area DE2 may be electrically connected to the second active pattern ACT2. Furthermore, the second drain area DE2 may be electrically connected to the second data line D2 through an eighth conductive pattern CP8.

The eighth conductive pattern CP8 may correspond to the third conductive layer provided or disposed and/or formed on the interlayer insulating layer ILD. A first end of the eighth conductive pattern CP8 may be electrically and/or physically connected with the second data line D2 through a contact hole CH that successively passes through the buffer layer BFL, the gate insulating layer GI, and the interlayer insulating layer ILD. A second end of the eighth conductive pattern CP8 may be electrically and/or physically connected with the second drain area DE2 through a contact hole CH that successively passes through the gate insulating layer GI and the interlayer insulating layer ILD.

The third transistor T3 may include a third gate electrode GE3, a third active pattern ACT3, a third source area SE3, and a third drain area DE3.

The third gate electrode GE3 may be integral with the connection line CNL and be electrically connected with the first scan line S1.

The third active pattern ACT3 may be a channel area of the third transistor T3.

The third source area SE3 may be electrically connected to the third active pattern ACT3. Furthermore, the third source area SE3 may be electrically and/or physically connected with the second bottom metal layer BML2 through a corresponding contact hole CH.

The third drain area DE3 may be electrically connected to the third active pattern ACT3. Furthermore, the third drain area DE3 may be electrically connected to the initialization power line IPL through the fifth conductive pattern CP5.

The second storage capacitor Cst2 may have a structure substantially identical or similar to that of the first storage capacitor Cst1 of the first sub-pixel circuit SPXC1. For example, the second storage capacitor Cst2 may include a second lower electrode LE2 and a second upper electrode UE2.

The second lower electrode LE2 may correspond to the second conductive layer and be integral with the second gate electrode GE2 of the corresponding transistor, for example, the second transistor T2. The second upper electrode UE2 may correspond to the third conductive layer and overlap the second lower electrode LE2. The second upper electrode UE2 may be electrically and/or physically connected with the second bottom metal layer BML2 through a corresponding contact hole CH.

As described above, the second upper electrode UE2 may be electrically connected to each of the first source area SE1 and the third source area SE3 through the second bottom metal layer BML2.

The third sub-pixel circuit SPXC3 may include a first transistor T1, a second transistor T2, a third transistor T3, and a third storage capacitor Cst3.

The first transistor T1 may include a first gate electrode GE1, a first active pattern ACT1, a first source area SE1, and a first drain area DE1.

The first gate electrode GE1 may be electrically connected to the third source area SE3 of the third transistor T3.

The first active pattern ACT1 may be a channel area of the first transistor T1.

The first source area SE1 may be electrically connected to the first active pattern ACT1. Furthermore, the first source area SE1 may be electrically and/or physically connected with a third bottom metal layer BML3 through a contact hole CH passing through the buffer layer BFL.

The third bottom metal layer BML3 may be a component corresponding to each of the first and second bottom metal layers BML1 and BML2. The third bottom metal layer BML3 may correspond to the first conductive layer. The third bottom metal layer BML3 may be electrically and/or physically connected to the first source area SE1 through a corresponding contact hole CH. Furthermore, the third bottom metal layer BML3 may be electrically and/or physically connected with the third source area SE3 of the third transistor T3 through a contact hole CH passing through the buffer layer BFL. The third bottom metal layer BML3 may be electrically and/or physically connected with a third upper electrode UE3 through a contact hole CH that successively passes through the buffer layer BFL, the gate insulating layer GI, and the interlayer insulating layer ILD.

The first drain area DE1 may be electrically connected to the first active pattern ACT1. Furthermore, the first drain area DE1 may be electrically and/or physically connected with the first layer FL of the 1a-th power line PL1a through a contact hole CH passing through the buffer layer BFL.

The second transistor T2 may include a second gate electrode GE2, a second active pattern ACT2, a second source area SE2, and a second drain area DE2.

The second gate electrode GE2 may be integral with the connection line CNL and be electrically connected with the first scan line S1.

The second active pattern ACT2 may be a channel area of the second transistor T2.

The second source area SE2 may be electrically connected to the second active pattern ACT2. Furthermore, the second source area SE2 may be electrically connected to the first gate electrode GE1 through a fourth conductive pattern CP4.

The fourth conductive pattern CP4 may correspond to the third conductive layer provided or disposed and/or formed on the interlayer insulating layer ILD. A first end of the fourth conductive pattern CP4 may be electrically and/or physically connected with the second source area SE2 through a contact hole CH that successively passes through the gate insulating layer GI and the interlayer insulating layer ILD. A second end of the fourth conductive pattern CP4 may be electrically connected with the first gate electrode GE1 through a contact hole CH passing through the interlayer insulating layer ILD. Therefore, the first gate electrode GE1 and the second source area SE2 may be electrically connected to each other through the fourth conductive pattern CP4.

The second drain area DE2 may be electrically connected to the second active pattern ACT2. Furthermore, the second drain area DE2 may be electrically connected to the third data line D3 through a sixth conductive pattern CP6.

The sixth conductive pattern CP6 may correspond to the third conductive layer provided or disposed and/or formed on the interlayer insulating layer ILD. A first end of the sixth conductive pattern CP6 may be electrically and/or physically connected with the third data line D3 through a contact hole CH that successively passes through the buffer layer BFL, the gate insulating layer GI, and the interlayer insulating layer ILD. A second end of the sixth conductive pattern CP6 may be electrically and/or physically connected with the second drain area DE2 through a contact hole CH that successively passes through the gate insulating layer GI and the interlayer insulating layer ILD. Therefore, the second drain area DE2 and the third data line D3 may be electrically connected to each other through the sixth conductive pattern CP6.

The third transistor T3 may include a third gate electrode GE3, a third active pattern ACT3, a third source area SE3, and a third drain area DE3.

The third gate electrode GE3 may be integral with the connection line CNL and be electrically connected with the first scan line S1.

The third active pattern ACT3 may be a channel area of the third transistor T3.

The third source area SE3 may be electrically connected to the third active pattern ACT3. Furthermore, the third source area SE3 may be electrically and/or physically connected with the third bottom metal layer BML3 through a corresponding contact hole CH.

The third drain area DE3 may be electrically connected to the third active pattern ACT3. Furthermore, the third drain area DE3 may be electrically connected to the initialization power line IPL through the fifth conductive pattern CP5. In an embodiment, the third drain area DE3 of the third transistor T3 and the second drain area DE2 of the second transistor T2 may share the fifth conductive pattern CP5.

The third storage capacitor Cst3 may have a structure substantially identical or similar to that of each of the first and second storage capacitors Cst1 and Cst2. For example, the third storage capacitor Cst3 may include a third lower electrode LE3 and a third upper electrode UE3.

The third lower electrode LE3 may correspond to the second conductive layer and be integral with the third gate electrode GE3 of the corresponding transistor, for example, the third transistor T3. The third upper electrode UE3 may correspond to the third conductive layer and overlap the third lower electrode LE3. The third upper electrode UE3 may be electrically and/or physically connected with the third bottom metal layer BML3 through a corresponding contact hole CH. The third upper electrode UE3 may include a protrusion pattern PRP extending to the 2a-th power line PL2a in a direction, for example, the first direction DR1. The protrusion pattern PRP may be integral with the third upper electrode UE3 to thus form an area of the third upper electrode UE3.

As described above, the third upper electrode UE3 may be electrically connected to each of the first source area SE1 and the third source area SE3 through the third bottom metal layer BML3.

The passivation layer PSV may be provided or disposed and/or formed on the first sub-pixel circuit SPXC1, the second sub-pixel circuit SPXC2, and the third sub-pixel circuit SPXC3.

The passivation layer PSV may be provided in the form of an organic insulating layer, an inorganic insulating layer, or an organic insulating layer disposed on an inorganic insulating layer. The inorganic insulating layer may include, for example, at least one of metal oxides such as silicon oxide ($SiO_x$), silicon nitride ($SiN_x$), silicon oxynitride ($SiO_xN_y$), and aluminum oxide ($AlO_x$). The organic insulating layer may include, for example, at least one of polyacrylate resin, epoxy resin, phenolic resin, polyamide resin, polyimide rein, unsaturated polyester resin, polyphenylen ether resin, polyphenylene sulfide resin, and benzocyclobutene resin.

The passivation layer PSV may include a first via hole VIH1 and a second via hole VIH2.

The first via hole VIH1 may expose each of an area of the 2b-th power line PL2b, another area of the 2b-th power line PL2b, and still another area of the 2b-th power line PL2b. The second via hole VIH2 may expose each of an area of the first upper electrode UE1, an of the second upper electrode UE2, and an area of the third upper electrode UE3 (for example, an area of the protrusion pattern PRP). In an embodiment, three first via holes VIH1 may be provided or formed in the first pixel area PXA1, and three second via holes VIH2 may be provided or formed in the first pixel area PXA1.

The first pixel area PXA1 may include a first emission area EMA1, a second emission area EMA2, and a third emission area EMA3. For example, the first pixel area PXA1 may include the first emission area EMA1, the second emission area EMA2, and the third emission area EMA3 which are partitioned from each other in the first direction DR1.

The first emission area EMA1 may be an area where light is emitted by the light emitting elements LD that are driven by the first sub-pixel circuit SPXC1. The light emitting elements LD may be a component of the first sub-emission unit EMU1. In an embodiment, the first emission area EMA1 may be an emission area of the first sub-pixel SPXL1.

The second emission area EMA2 may be an area where light is emitted by the light emitting elements LD that are driven by the second sub-pixel circuit SPXC2. Here, the light emitting elements LD may be a component of the second sub-emission unit EMU2. In an embodiment, the second emission area EMA2 may be an emission area of the second sub-pixel SPXL2.

The third emission area EMA3 may be an area where light is emitted by the light emitting elements LD that are driven by the third sub-pixel circuit SPXC3. Here, the light emitting elements LD may be a component of the third sub-emission unit EMU3. In an embodiment, the third emission area EMA3 may be an emission area of the third sub-pixel SPXL3.

The first emission area EMA1, the second emission area EMA2, and the third emission area EMA3 may form the emission area EMA of the first pixel PXL1.

The first pixel area PXA1 may include a non-emission area NEMA which is adjacent to the first emission area EMA1 (or encloses the perimeter of the first emission area EMA1), a non-emission area NEMA which is adjacent to the second emission area EMA2 (or encloses the perimeter of the second emission area EMA2), and a non-emission area NEMA which is adjacent to the third emission area EMA3 (or encloses the perimeter of the third emission area EMA3).

As illustrated in FIGS. 8 to 12B, each of the first sub-pixel SPXL1, the second sub-pixel SPXL2, and the third sub-pixel SPXL3 may include a display element layer DPL including light emitting elements LD. The display element layer DPL of the first sub-pixel SPXL1 may correspond to the first emission area EMA1. The display element layer DPL of the second sub-pixel SPXL2 may correspond to the second emission area EMA2. The display element layer DPL of the third sub-pixel SPXL3 may correspond to the third emission area EMA3.

The display element layers DPL each may be provided or disposed and/or formed on the protective layer PSV.

The display element layer DPL may include a bank BNK, first to fourth electrodes EL1, EL2, EL3, and EL4, light emitting elements LD, first and second connection electrodes CNE1 and CNE2, an intermediate electrode CTE, first to third insulating layers INS1, INS2, and INS3.

The bank BNK may be a structure which defines the pixel areas or the emission areas EMA of the first pixel PXL1 (or the first to third sub-pixels SPXL1, SPXL2, and SPXL3) and pixels PXL adjacent to the first pixel PXL1, and for example, may be a pixel defining layer. The bank BNK may be disposed in an area between the first to third emission areas EMA1, EMA2, and EMA3 and around the first to third emission areas EMA1, EMA2, and EMA3.

The bank BNK may also be a dam structure for defining each emission area EMA to which the light emitting elements LD are to be supplied during a process of supplying the light emitting elements LD to the first pixel PXL1. For example, since the first to third emission areas EMA1, EMA2, and EMA3 are partitioned by the bank BNK, a mixed solution (for example, an ink) including a target amount and/or type of light emitting elements LD may be introduced into each of the first to third emission areas EMA1, EMA2, and EMA3.

The bank BNK may include at least one light shielding material and/or at least one reflective material, thereby preventing a light leakage defect in which light (or a ray) leaks between each of the first to third sub-pixels SPXL1, SPXL2, and SPXL3 and sub-pixels adjacent thereto. In an embodiment, the bank BNK may include a transparent material (or substance). The transparent material may include, for example, polyamide resin, polyimide resin, etc., but the disclosure is not limited thereto. In an embodiment, in order to enhance the efficiency of light emitted from the first pixel PXL1, a separate reflective material layer may be provided or disposed and/or formed on the bank BNK.

The bank BNK may include, in the first pixel area PXA1, at least one opening area through which components disposed thereunder are exposed. For example, the bank BNK may include, in the first pixel area PXA1, a first opening area OP1 and a second opening area OP2 through which components disposed thereunder are exposed. In an embodiment, the first to third emission areas EMA1, EMA2, and EMA3 may be defined by the second opening area OP2 of the bank BNK. Each of the first to third emission areas EMA1, EMA2, and EMA3 may correspond to the second opening area OP2 of the bank BNK.

In the first pixel area PXA1, the first opening area OP1 of the bank BNK may be spaced apart from the second opening area OP2 and spaced apart from each of upper and lower sides of the second opening area OP2. Here, the first opening area OP1 of the bank BNK may be the first opening area OP1 described with reference to FIGS. 4A and 4B.

As the bank BNK is disposed in the non-emission area NEMA between the first to third emission areas EMA1, EMA2, and EMA3, a supply (or introduction) area of the first pixel area PXA1 to which light emitting elements LD are to be supplied (or introduced) may be determined. Therefore, the light emitting elements LD are supplied to only the supply area, so that the material efficiency can be improved. Furthermore, a defect in which the light emitting elements LD are supplied to other areas except the supply area can be prevented from occurring, and thus the number of light emitting elements LD that can be used as valid light sources in the corresponding emission area EMA may be increased. For example, in an operation of supplying light emitting elements LD to the first pixel PXL1, the light emitting elements LD may be prevented from being supplied to undesired areas and be efficiently supplied to each of the first to third emission areas EMA1, EMA2, and EMA3. Therefore, the light emitting elements LD may be prevented from being wasted. The cost of manufacturing the display device DD may be reduced.

The bank BNK may be provided or disposed and/or formed on the first insulating layer INS1, but the disclosure is not limited thereto. In an embodiment, the bank BNK may be provided or disposed and/or formed on the passivation layer PSV.

The first electrode EL1, the second electrode EL2, the third electrode EL3, and the fourth electrode EL4 may be successively arranged or disposed in the first direction DR1 on the passivation layer PSV of each of the first to third emission areas EMA1, EMA2, and EMA3 (or the first to third sub-pixel areas SPXA1, SPXA2, and SPXA3). The first to fourth electrodes EL1, EL2, EL3, and EL4 may correspond to the fourth conductive layer provided or disposed and/or formed on the passivation layer PSV.

In each of the first to third sub-pixel areas SPXA1, SPXA2, and SPXA3 (or the first to third emission areas EMA1, EMA2, and EMA3), the first electrode EL1, the second electrode EL2, the third electrode EL3, and the fourth electrode EL4 may extend in the second direction DR2. Respective ends of the first to fourth electrodes EL1, EL2, EL3, and EL4 may be disposed in the corresponding first opening areas OP1 of the bank BNK. The first to fourth electrodes EL1, EL2, EL3, and EL4 may be separated from other electrodes (for example, first to fourth electrodes (not shown) provided or disposed in pixels PXL adjacent thereto in the second direction DR2) in the first opening OP1 after the light emitting elements LD are supplied to and aligned in each of the first to third emission areas EMA1, EMA2, and EMA3 during a process of fabricating the display device DD. Each of the first openings OP1 of the bank BNK may be provided for a separation process for the first electrode EL1, the second electrode EL2, the third electrode EL3, and the fourth electrode EM.

Each of the first to fourth electrodes EL1, EL2, EL3, and EL4 in the corresponding sub-pixel area may be spaced apart from an electrode adjacent thereto in the first direction DR1. For example, the first electrode EL1 may be spaced apart from the second electrode EL2 in the first direction DR1. The second electrode EL2 may be spaced apart from the third electrode EL3 in the first direction DR1. The third electrode EL3 may be spaced apart from the fourth electrode EL4 in the first direction DR1. Although the distance between the first electrode EL1 and the second electrode EL2, the distance between the second electrode EL2 and the third electrode EL3, and the distance between the third electrode EL3 and the fourth electrode EL4 may be a same, the disclosure is not limited thereto. In an embodiment, the distance between the first electrode EL1 and the second electrode EL2, the distance between the second electrode EL2 and the third electrode EL3, and the distance between the third electrode EL3 and the fourth electrode EL4 may be different from each other.

The first to fourth electrodes EL1, EL2, EL3, and EL4 may be formed of a material having reflectivity to enable light emitted by each of the light emitting elements LD to travel in an image display direction (for example, in a frontal direction) of the display device. For example, the first to fourth electrode EL1, EL2, EL3, and EL4 may be formed of a conductive material (or substance) having reflectivity. The conductive material (or substance) may include an opaque metal that has an advantage in reflecting, in the image display direction (for example, the third direction DR3) of the display device DD, light emitted by the light emitting elements LD. For example, the opaque metal may include a metal such as silver (Ag), magnesium (Mg), aluminum (Al), platinum (Pt), palladium (Pd), gold (Au), nickel (Ni), neodymium (Nd), iridium (Ir), chrome (Cr), titanium (Ti), and an alloy thereof. In an embodiment, the first to fourth electrode EL1, EL2, EL3, and EL4 may be formed of a transparent conductive material (or substance). The transparent conductive material (or substance) may include conductive oxides such as indium tin oxide (ITO), indium zinc oxide (IZO), zinc oxide (ZnO), indium gallium zinc oxide (IGZO), and indium tin zinc oxide (ITZO), and a conductive polymer such as poly(3,4-ethylenedioxythiophene) (PEDOT). In case that the first to fourth electrodes EL1, EL2, EL3, and EL4 include a transparent conductive material (or substance), a separate conductive layer formed of an opaque metal for reflecting light emitted by the light emitting elements LD in the image display direction of the display device DD may be added. However, the material of the first to fourth electrodes EL1, EL2, EL3, and EL4 is not limited to the foregoing materials.

Although each of the first to fourth electrodes EL1, EL2, EL3, and EL4 may be provided or disposed and/or formed in a single-layer structure, the disclosure is not limited thereto. In an embodiment, each of the first to fourth electrodes EL1, EL2, EL3, and EL4 may be provided or disposed and/or formed in a multi-layer structure formed by stacking at least two materials among metals, alloys, conductive oxides, and conductive polymers. Each of the first to fourth electrodes EL1, EL2, EL3, and EL4 may be formed in a multi-layer structure including at least two layers to minimize distortion resulting from a signal delay in case that signals (or voltages) are transmitted to opposite ends of each of the light emitting elements LD. For example, each of the first to fourth electrodes EL1, EL2, EL3, and EL4 may be formed in a multi-layer structure formed by sequentially stacking layers of indium tin oxide (ITO)/silver (Ag)/indium tin oxide (ITO).

The first electrode EL1 in the corresponding sub-pixel area may be electrically connected with a corresponding component of the pixel circuit layer PCL through the corresponding first via hole VIH1. For example, the first electrode EL1 of the first sub-pixel area SPXA1 may be electrically connected with the 2b-th power line PL2b of the corresponding sub-pixel area through one of the three first via holes VIH1 of the passivation layer PSV. The first electrode EL1 of the second sub-pixel area SPXA2 may be electrically connected with the 2b-th power line PL2b of the corresponding sub-pixel area through another of the three first via holes VIH1 of the passivation layer PSV. The first electrode EL1 of the third sub-pixel area SPXA3 may be electrically connected with the 2b-th power line PL2b of the corresponding sub-pixel area through the other of the three first via holes VIH1 of the passivation layer PSV. In an embodiment, the first electrode EL1 may correspond to the second electrode EL2 described with reference to FIG. 5 and correspond to a cathode of each of the first to third sub-emission units EMU1, EMU2, and EMU3.

The third electrode EL3 in the corresponding sub-pixel area may be electrically connected with a corresponding component of the pixel circuit layer PCL through the corresponding second via hole VIH2. For example, the first electrode EL1 of the first sub-pixel area SPXA1 may be electrically connected with the first upper electrode UE1 through one of the three second via holes VIH2 of the passivation layer PSV. The third electrode EL3 of the second sub-pixel area SPXA2 may be electrically connected with the second upper electrode UE2 through another of the three second via holes VIH2. The third electrode EL3 of the third sub-pixel area SPXA3 may be electrically connected with the protrusion pattern PRP through the other of the three second via holes VIH2. As described above, since the protrusion pattern PRP is an area of the third upper electrode UE3, the third electrode EL3 of the third sub-pixel area SPXA3 may be electrically connected with the third upper electrode UE3. In an embodiment, the third electrode EL3 may correspond to the first electrode EL1 described with reference to FIG. 5 and correspond to an anode of each of the first to third sub-emission units EMU1, EMU2, and EMU3.

Each of the first to fourth electrodes EL1, EL2, EL3, and EL4 may receive an alignment signal from the pad part PD disposed in the non-display area NDA before the light emitting elements LD are aligned in the emission area EMA of the first pixel PXL1, and may be used as an alignment electrode (or an alignment line) for aligning the light emitting elements LD.

In an operation of aligning the light emitting elements LD, the first electrode EL1 may be electrically connected with a first bus line BUL1 (see FIG. 4A) and receive a first alignment signal from the first power pad to thus be used as the first alignment electrode. In an operation of aligning the light emitting elements LD, the second electrode EL2 may be electrically connected with a second bus line BUL2 (see FIG. 4B) and receive a second alignment signal from the second power pad to thus be used as the second alignment electrode. In an operation of aligning the light emitting elements LD, the third electrode EL3 may be electrically connected with the second electrode EL2 and receive the second alignment signal from the second power pad to thus be used as the second alignment electrode. In an operation of aligning the light emitting elements LD, the fourth electrode EL4 may be electrically connected with the first bus line and receive the first alignment signal from the first power pad to thus be used as the first alignment electrode. The above-mentioned first and second alignment signals may be signals having a voltage difference and/or a phase difference sufficient to allow the light emitting elements LD to be aligned between the first to fourth electrodes EL1, EL2, EL3, and EL4. At least one of the first and second alignment signals may be an alternating current (AC) signal, but the disclosure is not limited thereto.

In an embodiment, in each of the first to third emission areas EMA1, EMA2, and EMA3, a support component (or a support patter) may be disposed between the passivation layer PSV and each of the first to fourth electrodes EL1, EL2, EL3, and EL4. For example, as illustrated in FIG. 10, a bank pattern BNKP may be disposed between the passivation layer PSV and each of the first to fourth electrodes EL1, EL2, EL3, and EL4.

The bank pattern BNKP may be an inorganic insulating layer including an inorganic material or an organic insulating layer including an organic material. In an embodiment, the bank pattern BNKP may include an organic insulating layer having a single-layer structure and/or an inorganic insulating layer having a single-layer structure, but the disclosure is not limited thereto. In an embodiment, the bank pattern BNKP may be provided in a multi-layer structure formed by stacking at least one organic insulating layer and at least one inorganic insulating layer. However, the material of the bank pattern BNKP is not limited to that of the foregoing embodiment. In an embodiment, the bank pattern BNKP may include a conductive material (or a conductive substance).

The bank pattern BNKP may have a substantially trapezoidal cross-section with a width decreasing upward from a surface (for example, an upper surface) of the passivation layer PSV in the third direction DR3, but the disclosure is not limited thereto. In an embodiment, the bank pattern BNKP may include a curved surface having a cross-sectional shape such as a substantially semi-elliptical shape or a substantially semi-circular shape (or a substantially hemispherical shape) with a width decreasing upward from a surface of the passivation layer PSV in the third direction DR3. In a sectional view, the shape of the bank pattern BNKP is not limited to that of the foregoing embodiments and may be changed in various ways so long as the efficiency of light emitted by each of the light emitting elements LD can be enhanced.

Each of the first to fourth electrodes EL1, EL2, EL3, and EL4 may be provided or disposed and/or formed on the bank pattern BNKP. Therefore, each of the first to fourth electrodes EL1, EL2, EL3, and EL4 may have a surface profile corresponding to the shape of the bank pattern BNKP disposed therebelow, so that light emitted by the light emitting elements LD may be reflected by each of the first to fourth electrodes EL1, EL2, EL3, and EL4 and more efficiently travel in the image display direction of the display device DD. The bank pattern BNKP and each of the first to fourth electrodes EL1, EL2, EL3, and EL4 may function as a reflective component that guides light emitted by the light emitting elements LD in a desired direction to thus enhance the optical efficiency of the display device DD. In case that each pixel PXL does not include the bank pattern BNKP, the first to fourth electrodes EL1, EL2, EL3, and EL4 may be provided or disposed and/or formed on the surface (for example, the upper surface) of the passivation layer PSV.

After the light emitting elements LD are aligned in each of the first to third emission areas EMA1, EMA2, and EMA3, a portion of each of the first to fourth electrodes EL1, EL2, EL3, and EL4 disposed between the sub-pixels adjacent to each other in the second direction DR2 may be removed, and an end thereof may be disposed in each corresponding first opening OP1 of the bank BNK, so as to drive each of the first to third sub-pixels SPXL1, SPXL2, and SPXL3 independently of (or separately from) sub-pixels adjacent thereto in the second direction DR2.

After the light emitting elements LD are aligned in each the first to third emission areas EMA1, EMA2, and EMA3, each of the first to fourth electrodes EL1, EL2, EL3, and EL4 may be used as a driving electrode for driving the light emitting elements LD.

The first insulating layer INS1 may be provided or disposed and/or formed on the first to fourth electrodes EL1, EL2, EL3, and EL4. For example, the first insulating layer INS1 may cover or overlap areas of the first to fourth electrodes ET1, ET2, ET3, and EL4 and may be partially open to expose other areas of the first to fourth electrodes ET1, ET2, ET3, and EL4

The first insulating layer INS1 may be formed as an inorganic insulating layer including an inorganic material or as an organic insulating layer including an organic material. The first insulating layer INS1 may be formed as an inorganic insulating layer having an advantage in protecting the light emitting elements LD from the pixel circuit layer PCL. For example, the first insulating layer INS1 may include at least one of metal oxides such as silicon nitride ($SiN_x$), silicon oxide ($SiO_x$), silicon oxynitride ($SiO_xN_y$), and aluminum oxide ($AlO_x$), but the disclosure is not limited thereto. In an embodiment, the first insulating layer INS1 may be formed as an organic insulating layer that has an advantage in planarizing support surfaces of the light emitting elements LD. The first insulating layer INS1 may be formed as a single layer or multiple layers.

The first insulating layer INS1 may be provided or disposed and/or formed on the passivation layer PSV to cover or overlap the overall or entire surfaces of the first to fourth electrodes EL1, EL2, EL3, and EL4. After the light emitting elements LD are supplied (or introduced) to and aligned on the first insulating layer INS1, the first insulating layer INS1 may be partially open to expose an area of each of the first and third electrodes EL1 and EL3. The first insulating layer INS1 may be patterned in the form of an individual pattern which is sectionally disposed under or below the light emitting elements LD after the supply (introduction) and alignment of the light emitting elements LD. The first insulating layer INS1 may cover or overlap the other areas of the first and third electrodes EL1 and EL3 except the respective areas of first and third electrodes EL1 and EL3. In an embodiment, the first insulating layer INS1 may be omitted. In an embodiment, the first insulating layer INS1 may be partially open to expose an area of each of the first to fourth electrodes EL1, EL2, EL3, and EL4.

The bank BNK may be provided or disposed and/or formed on the first insulating layer INS1.

In each of the first to third emission areas EMA1, EMA2, and EMA3 of the first pixel PXL1, the third electrode EL3 and the fourth electrode EL4 may form a first serial set SET1 (see FIG. 5) (or referred to as a first stage) along with light emitting elements LD electrically connected in parallel to each other between the third electrode EL3 and the fourth electrode EL4, and the first electrode EL1 and the second electrode EL2 may form a second serial set SET2 (see FIG. 5) (or referred to as a second stage) along with light emitting elements LD electrically connected in parallel to each other between the first electrode EL1 and the second electrode EL2.

In an embodiment, the first and second serial sets SET1 and SET2 may be disposed in each of the first to third emission areas EMA1, EMA2, and EMA3. The first and second serial sets SET1 and SET2 may form a sub-emission unit of each of the first to third sub-pixels SPXL1, SPXL2, and SPXL3. For example, the first and second serial sets SET1 and SET2 disposed in the first emission area EMA1 may form the first sub-emission unit EMU1 of the first sub-pixel SPXL1. The first and second serial sets SET1 and SET2 disposed in the second emission area EMA2 may form the second sub-emission unit EMU2 of the second sub-pixel SPXL2. The first and second serial sets SET1 and SET2 disposed in the third emission area EMA3 may form the third sub-emission unit EMU3 of the third sub-pixel SPXL3.

The third electrode EL3 included in the first serial set SET1 may be an anode of each of the first to third sub-emission units EMU1, EMU2, and EMU3. The first electrode EL1 included in the second serial set SET2 may be a cathode of the corresponding sub-emission unit.

Each of the light emitting elements LD may be formed as a light-emitting diode which is made of a material having an inorganic crystal structure and has a subminiature size, for example, a size to a degree of the nanometer scale to the micrometer scale. Each of the light emitting elements LD may be a subminiature light-emitting diode fabricated by an etching method or a growth method.

Although at least two to several tens of light emitting elements LD may be aligned and/or provided or disposed in each of the first to third emission areas EMA1, EMA2, and EMA3, the number of light emitting elements LD is not limited thereto. In an embodiment, the number of light emitting elements LD aligned and/or provided or disposed in each of the first to third emission areas EMA1, EMA2, and EMA3 may be changed in various ways.

Each of the light emitting elements LD may emit light of color light and/or white light. Each of the light emitting elements LD may be aligned on the first insulating layer INS1 between two adjacent electrodes among the first to fourth electrodes EL1, EL2, EL3, and EL4. such that the extension direction (or the longitudinal direction (L)) of the light emitting element LD is parallel to the first direction DR1, in a plan view and a sectional view. The light emitting elements LD may be dispersed in a solution and introduced into each of the first to third emission areas EMA1, EMA2, and EMA3.

The light emitting elements LD may be introduced into each of the first to third emission areas EMA1, EMA2, and EMA3 of each pixel PXL by an inkjet printing method, a slit coating method, or other various methods. For example, the light emitting elements LD may be mixed with a volatile solvent and supplied to the first pixel area PXA1 by an inkjet printing method or a slit coating method. Here, if a corresponding alignment signal is applied to each of the first to fourth electrodes EL1, EL2, EL3, and EL4. provided or disposed in each of the first to third emission areas EMA1, EMA2, and EMA3, an electric field may be formed between two adjacent electrodes of the first to fourth electrodes EL1, EL2, EL3, and EL4. Therefore, light emitting elements LD may be aligned between the two adjacent electrodes of the first to fourth electrodes EL1, EL2, EL3, and EM. As described above, since a same alignment signal (or a same alignment voltage) is applied to each of the second and third electrodes EL2 and EL3, the light emitting elements LD may not be aligned between the second electrode LE2 and the third electrode EL3. However, the disclosure is not limited to this. In an embodiment, in case that an alignment signal is applied to each of the second and third electrodes EL2 and EL3, a potential difference may occur between alignment signals applied to the second electrode EL2 and the third electrode EL3 due to line resistance of the two electrodes, an effect resulting from an electric field induced between adjacent electrodes, etc. within the spirit and the scope of the disclosure. Light emitting elements LD may also be aligned between the second and third electrodes EL2 and EL3.

After the alignment of the light emitting elements LD, the solvent may be removed by volatilization or other methods. Therefore, the light emitting elements LD may be aligned and/or provided or disposed in each of the first to third emission areas EMA1, EMA2, and EMA3.

Although FIG. 8 illustrates that the light emitting elements LD, the longitudinal direction (refer to 'L' of FIG. 1) of which is parallel to the first direction DR1, are aligned between two adjacent electrodes of the first to fourth electrodes EL1, EL2, EL3, and EL4, the disclosure is not limited thereto. In an embodiment, some or a number of the light emitting elements LD may be aligned between two adjacent electrodes such that the longitudinal direction (L) thereof is parallel to the second direction DR2 and/or a direction inclined with respect to the second direction DR2. Furthermore, in an embodiment, at least one reverse light emitting element LDr (see FIG. 5) may be electrically connected between two adjacent electrodes in a reverse direction.

In an embodiment, the light emitting elements LD may include first light emitting elements LD1 and second light emitting elements LD2.

The first light emitting elements LD1 may be disposed between the first electrode EL1 and the second electrode EL2. The second light emitting elements LD2 may be disposed between the third electrode EL3 and the fourth electrode EL4.

The first light emitting elements LD1 may be aligned in a same direction between the first electrode EL1 and the second electrode EL2. The first electrode EL1 and the second electrode EL2 may form the second serial set SET2 along with the first light emitting elements LD1 electrically connected in parallel to each other in a same direction between the first electrode EL1 and the second electrode EL2.

The second light emitting elements LD2 may be aligned in a same direction between the third electrode EL3 and the fourth electrode EL4. The third electrode EL3 and the fourth electrode EL4 may form the first serial set SET1 along with the second light emitting elements LD2 electrically connected in a same direction between the third electrode EL3 and the fourth electrode EL4.

The first and second light emitting elements LD1 and LD2 may be provided or disposed and/or formed on the first insulating layer INS1 in each of the first to third emission areas EMA1, EMA2, and EMA3.

The second insulating layer INS2 may be provided or disposed and/or formed on the light emitting elements LD.

The second insulating layer INS2 may be provided or disposed and/or formed on the light emitting elements LD to partially cover or overlap the outer circumferential surface (or the surface) of each of the light emitting elements LD such that the opposite ends of the light emitting element LD are exposed to the outside.

The second insulating layer INS2 may be formed as a single layer or multiple layers and include an inorganic insulating layer including at least one inorganic material or an organic insulating layer including at least one organic material. The second insulating layer INS2 may include an inorganic insulating layer that has an advantage in protecting the active layer 12 (see FIG. 1) of each of the light emitting elements LD from external oxygen, water, etc. within the spirit and the scope of the disclosure. However, the disclosure is not limited thereto. The second insulating layer INS2 may be formed as an organic insulating layer including an organic material, depending on design conditions, etc. of the display device DD in which the light emitting elements LD are used. After the arrangement of the light emitting elements LD in each of the first to third emission areas EMA1, EMA2, and EMA3 have been completed, the second insulating layer INS2 is formed on the light emitting elements LD so that the light emitting elements LD may be prevented from being removed from the aligned position thereof.

In case that a gap (or space) may be present between the first insulating layer INS1 and the light emitting elements LD before the formation of the second insulating layer INS2, the gap may be filled with the second insulating layer INS2 during a process of forming the second insulating layer INS2. The second insulating layer INS2 may be formed as an organic insulating layer that has an advantage in filling the gap between the first insulating layer INS1 and the light emitting elements LD with the second insulating layer INS2.

In each of the first to third emission areas EMA1, EMA2, and EMA3, the first and second connection electrodes CEN1 and CNE2 and the intermediate electrode CTE may be components that more reliably and electrically connect the first to fourth electrodes EL1, EL2, EL3, and EL4 and the light emitting elements LD.

The first connection electrode CNE1 may be provided or disposed and/or formed on the first electrode EL1 and the respective first ends of the first light emitting elements LD1. The first connection electrode CNE1 may be electrically connected with the first electrode EL1 by contacting or directly contacting the first electrode EL1 exposed by the first insulating layer INS1. In an embodiment, in case that a conductive capping layer (not illustrated) is disposed on the first electrode EL1, the first connection electrode CNE1 may be disposed on the capping layer and be electrically connected with the first electrode EL1 by contacting the capping layer. The capping layer may protect the first electrode EL1 from a defect which may occur during the process of fabricating the display device DD, and may increase adhesive force between the first electrode EL1 and the passivation layer PSV disposed therebelow. The capping layer may include a transparent conductive material such as indium zinc oxide (IZO). The first connection electrode CNE1 may electrically connect the first electrode EL1 and the respective first ends of the first light emitting elements LD1.

In a plan view, the first connection electrode CNE1 may have a substantially bar shape extending in the second direction DR2, but the disclosure is not limited thereto. In an embodiment, the shape of the first connection electrode CNE1 may be changed in various ways so long as the first connection electrode CNE1 can be reliably and electrically connected with the first ends of the first light emitting elements LD1. Furthermore, the shape of the first connection electrode CNE1 may be changed in various ways, taking into account the connection relationship with the first electrode EL1 disposed thereunder.

The second connection electrode CNE2 may be disposed on the third electrode EL3 and the respective second ends of the second light emitting elements LD2. The second connection electrode CNE2 may be electrically connected with the third electrode EL3 by contacting or directly contacting the third electrode EL3 exposed by the first insulating layer INS1. In an embodiment, in case that a conductive capping layer (not illustrated) is disposed on the third electrode EL3, the second connection electrode CNE2 may be disposed on the capping layer and be electrically connected with the third electrode EL3 by the capping layer. The second connection electrode CNE2 may electrically connect the third electrode EL3 and the respective second ends of the second light emitting elements LD2.

In a plan view, the second connection electrode CNE2 may have a substantially bar shape extending in the second direction DR2, but the disclosure is not limited thereto. In an embodiment, the shape of the second connection electrode CNE2 may be changed in various ways so long as the second connection electrode CNE2 can be reliably and electrically connected with the second ends of the second light emitting elements LD2. Furthermore, the shape of the second connection electrode CNE2 may be changed in various ways, taking into account the connection relationship with the third electrode EL3 disposed thereunder.

The first and second connection electrodes CNE1 and CNE2 may be formed of various transparent conductive materials to allow light emitted by each of the light emitting elements LD and reflected by the first and third electrodes EL1 and EL3 to travel in the image display direction of the display device DD without loss. For example, the first and second connection electrodes CNE1 and CNE2 may include at least one of various transparent conductive materials including indium tin oxide (ITO), indium zinc oxide (IZO), zinc oxide (ZnO), indium gallium zinc oxide (IGZO), and indium tin zinc oxide (ITZO) and may be substantially transparent or translucent to satisfy transmittancy (or transmittance). The material of the first and second connection electrodes CNE1 and CNE2 is not limited to the above-mentioned materials. In an embodiment, the first and second connection electrodes CNE1 and CNE2 may also be formed of various opaque conductive materials (or substances). The first and second connection electrodes CNE1 and CNE2 each may be formed as a single layer or multiple layers. In an embodiment, the first and second connection electrodes CNE1 and CNE2 may correspond to the fifth conductive layer provided or disposed and/or formed on the second insulating layer INS2.

The intermediate electrode CTE may include a first intermediate electrode CTE1 and a second intermediate electrode CTE2 which extend in the second direction DR2.

The first intermediate electrode CTE1 may be provided or disposed on the second electrode EL2 and overlap the second electrode EL2, in a plan view. The first intermediate electrode CTE1 may be disposed on the first insulating layer INS1 on the second electrode EL2 and be electrically insulated from the second electrode EL2. The first intermediate electrode CTE1 may be disposed on the respective second ends of the first light emitting elements LD1 in each of the first to third emission areas EMA1, EMA2, and EMA3 and be electrically and/or physically connected with the first light emitting elements LD1.

The second intermediate electrode CTE2 may be provided or disposed on the fourth electrode EL4 and overlap the fourth electrode EL4, in a plan view. The second intermediate electrode CTE2 may be disposed on the first insulating layer INS1 on the fourth electrode EL4 and be electrically insulated from the fourth electrode EL4. The second intermediate electrode CTE2 may be disposed on the respective first ends of the second light emitting elements LD2 in each of the first to third emission areas EMA1 to EMA3 and be electrically and/or physically connected with the second light emitting elements LD2.

The first intermediate electrode CTE1 and the second intermediate electrode CTE2 may be integral with each other and be electrically connected with each other. The first intermediate electrode CTE1 and the second intermediate electrode CTE2 may be respectively different areas of the intermediate electrode CTE. The first intermediate electrode CTE1 and the second intermediate electrode CTE2 described with reference to FIG. 5 may have a same configuration. The second intermediate electrode CTE2 and the first intermediate electrode CTE1 described with reference to FIG. 5 may have a same configuration. The intermediate electrode CTE may function as a bridge electrode (or a connection electrode) for electrically connecting the respective first ends of the second light emitting elements LD2 of the first serial set SET1 with the respective second ends of the first light emitting elements LD1 of the second serial set SET2. In other words, the first serial set SET1 and the second serial set SET2 may be electrically connected to each other by the intermediate electrode CTE.

In an embodiment, the respective first ends of the first light emitting elements LD1 and the respective first ends of the second light emitting elements LD2 may include a same type of semiconductor layers (for example, the first conductive layers 11 described with reference to FIG. 1). The respective second ends of the first light emitting elements LD1 and the respective first ends of the second light emitting elements LD2 may include a same type of semiconductor layers (for example, the second conductive layers 13 described with reference to FIG. 1).

In a plan view, the intermediate electrode CTE including the first intermediate electrode CTE1 and the second intermediate electrode CTE2 may be spaced apart from the second connection electrode CNE2 and enclose at least a portion of the second connection electrode CNE2, but the disclosure is not limited thereto. In an embodiment, the intermediate electrode CTE may be changed into various shapes so long as it can reliably and electrically connect the first serial set SET1 and the second serial set SET2 that are successively provided. In an embodiment, the first connection electrode CNE1, the second connection electrode CNE2, and the intermediate electrode CTE may be spaced apart from each other in a plan view and a sectional view.

The intermediate electrode CTE may be formed of various transparent conductive materials to allow light emitted by each of the light emitting elements LD and reflected by the first to fourth electrodes EL1, EL2, EL3, and EL4 to travel in the image display direction of the display device DD without loss. For example, the intermediate electrode CTE and the first and second connection electrodes CNE1 and CNE2 may include a same material or a similar material, or include at least one selected from among materials as the material of the first and second connection electrodes CNE1 and CNE2.

The intermediate electrode CTE and the first and second connection electrodes CNE1 and CNE2 may be provided or disposed on a same layer and be formed by a same process. For example, the intermediate electrode CTE and the first and second connection electrodes CNE1 and CNE2 may be provided or disposed and/or formed on the second insulating layer INS2. However, the disclosure is not limited thereto. In an embodiment, the intermediate electrode CTE and the first and second connection electrodes CNE1 and CNE2 may be provided or disposed on different layers and be formed by different processes.

The third insulating layer INS3 may be provided or disposed and/or formed on the first connection electrode CNE1, the second connection electrode CNE2, and the intermediate electrode CTE. The third insulating layer INS3 may be an inorganic insulating layer including an inorganic material or an organic insulating layer including an organic material. For example, the third insulating layer INS3 may have a structure formed by alternately stacking at least one inorganic insulating layer and at least one organic insulating layer. The third insulating layer INS3 may cover or overlap the entirety of the display element layer DPL to prevent external water or moisture from being introduced into the display element layer DPL including the light emitting elements LD.

If driving current flows from the fist power line PL1 to the second power line PL2 by the first transistor T1 of each of the first to third sub-pixels SPXL1 to SPXL3, the driving current may flow into the sub-emission unit of the corresponding sub-pixel through the second via hole VIH2 of the corresponding sub-pixel.

For example, driving current may be supplied to the third electrode EL3 of the first emission area EMA1 through the second via hole VIH2 of the first sub-pixel SPXL1. The driving current may flow to the intermediate electrode CTE via the second light emitting elements LD2 through the second connection electrode CNE2 electrically connected with the third electrode EL3. Therefore, in the first serial set SET1 of the first sub-pixel SPXL1, the second light emitting elements LD2 each may emit light at a luminance corresponding to current distributed thereto. Driving current flowing into the intermediate electrode CTE may flow to the first connection electrode CNE1 via the intermediate electrode CTE and the first light emitting elements LD1. Therefore, in the second serial set SET2 of the first sub-pixel SPXL1, the first light emitting elements LD1 each may emit light at a luminance corresponding to current distributed thereto.

Driving current may be supplied to the third electrode EL3 of the second emission area EMA2 through the second via hole VIH2 of the second sub-pixel SPXL2. The driving current may flow to the intermediate electrode CTE via the second light emitting elements LD2 through the second connection electrode CNE2 electrically connected with the third electrode EL3. Therefore, in the first serial set SET1 of the second sub-pixel SPXL2, the second light emitting elements LD2 each may emit light at a luminance corresponding to current distributed thereto. Driving current flowing into the intermediate electrode CTE may flow to the first connection electrode CNE1 via the intermediate electrode CTE and the first light emitting elements LD1. Therefore, in the second serial set SET2 of the second sub-pixel SPXL2, the first light emitting elements LD1 each may emit light at a luminance corresponding to current distributed thereto.

Driving current may be supplied to the third electrode EL3 of the third emission area EMA3 through the second via hole VIH2 of the third sub-pixel SPXL3. The driving current may flow to the intermediate electrode CTE via the second light emitting elements LD2 through the second connection electrode CNE2 electrically connected with the third electrode EL3. Therefore, in the first serial set SET1 of the third sub-pixel SPXL3, the second light emitting elements LD2 each may emit light at a luminance corresponding to current distributed thereto. Driving current flowing into the intermediate electrode CTE may flow to the first connection electrode CNE1 via the intermediate electrode CTE and the first light emitting elements LD1. Therefore, in the second serial set SET2 of the third sub-pixel SPXL3, the first light emitting elements LD1 each may emit light at a luminance corresponding to current distributed thereto.

As described above, driving current of each of the first to third sub-pixels SPXL1, SPXL2, and SPXL3 may flow successively via the second light emitting elements LD2 of the first serial set SET1 and the first light emitting elements LD1 of the second serial set SET2. Therefore, each of the first to third sub-pixels SPXL1, SPXL2, and SPXL3 may emit light at a luminance corresponding to a data signal supplied during each frame period.

According to the foregoing embodiment, in an operation of forming the first connection electrode CNE1 and the second connection electrode CNE2, the intermediate electrode CTE may be formed simultaneously together with the first and second connection electrodes CNE1 and CNE2. Therefore, the process of fabricating the first to third sub-pixels SPXL1, SPXL2, and SPXL3 and the display device DD including the first to third sub-pixels SPXL1, SPXL2, and SPXL3 may be simplified, so that the product yield can be enhanced.

In the foregoing embodiment, the emission unit EMU has a serial/parallel combination or mixed structure. Therefore, the first pixel PXL1 can be reliably driven, so that driving current flowing into the display panel of the display device DD can be reduced, and the power consumption efficiency can be improved.

In an embodiment, at least one overcoat layer (for example, a layer for planarizing the upper surface of the display element layer DPL) may be further disposed over the third insulating layer INS3.

In an embodiment, as illustrated in FIG. 11, an upper substrate may be further disposed on the third insulating layer INS3.

The upper substrate may be provided or disposed on the display element layer DPL of the corresponding sub-pixel to cover or overlap the display area DA (see FIG. 6A) in which the first to third sub-pixels SPXL1, SPXL2, and SPXL3 are disposed. The upper substrate may be formed as an encapsulation substrate (or a thin-film encapsulation layer) and/or a window layer of the display device DD. An intermediate layer CTL may be provided or disposed between the upper substrate and the display element layer DPL.

The intermediate layer CTL may be a transparent adhesive layer (or a transparent bonding layer), for example, an optically clear adhesive layer, for enhancing the adhesive force between the display element layer DPL and the upper substrate, but the disclosure is not limited thereto. In an embodiment, the intermediate layer CTL may be a refractive index converting layer that changes the refractive index of light emitted by the light emitting elements LD toward the upper substrate to thus enhance the emission luminance of each pixel PXL.

The upper substrate may include a base layer BSL and a light conversion pattern layer LCP.

The base layer BSL may be a rigid or flexible substrate, and the material or properties thereof are not limited to a particular material or particular properties. The base layer BSL and the substrate SUB may be formed of a same material or similar material, or different materials.

The light conversion pattern layer LCP may be disposed on a surface of the base layer BSL to face a corresponding pixel PXL. The light conversion pattern layer LCP may include a color conversion layer CCL and a color filter CF which correspond to a color.

The color conversion layer CCL may include color conversion particles QD corresponding to a specific or given color. The color filter CF may allow light having the specific or given color to selectively pass therethrough.

The color conversion layer CCL may be disposed on the surface of the base layer BSL to face each of the first to third sub-pixels SPXL1, SPXL2, and SPXL3 and may include the color conversion particles QD which convert light, emitted by the light emitting elements LD disposed in the corresponding sub-pixel, to light having a specific or given color. Each color conversion layer CCL may include the color conversion particles QD which convert, light emitted by the light emitting elements LD of each of the first to third sub-pixels SPXL1, SPXL2, and SPXL3, to light having a specific or given color. For example, the first sub-pixel SPXL1 of the first to third sub-pixels SPXL1, SPXL2, and SPXL3 may be a red pixel, the second sub-pixel SPXL2 thereof may be a green pixel, and the third sub-pixel SPXL3 thereof may be a blue pixel. The color conversion layer CCL of the first sub-pixel SPXL1 may include color conversion particles QD having red quantum dots which convert light, emitted by the light emitting elements LD of the corresponding sub-pixel, to red light. The color conversion layer CCL of the second sub-pixel SPXL2 may include color conversion particles QD having green quantum dots which convert light, emitted by the light emitting elements LD of the corresponding sub-pixel, to green light. The color conversion layer CCL of the third sub-pixel SPXL3 may include color conversion particles QD having blue quantum dots which convert light, emitted by the light emitting elements LD of the corresponding sub-pixel, to blue light. In an embodiment, the third sub-pixel SPXL3 may include a light scattering layer having light scattering particles, in place of the color conversion layer CCL including the color conversion particles QD. For example, in case that the light emitting elements LD emit blue-based light, the third sub-pixel SPXL3 may include a light scattering layer including light scattering particles. The light scattering layer may be omitted in some embodiments. In an embodiment, the third sub-pixel SPXL3 may include a transparent polymer in place of the color conversion layer CCL.

The color filter CF may be disposed on the surface of the color conversion layer CCL of each of the first to third sub-pixels SPXL1 SPXL2, and SPXL3 and include a color filter material allowing light having a specific or given color converted by the corresponding color conversion layer CCL to selectively pass therethrough. For example, the color filter CF of the first sub-pixel SPXL1 may be a red color filter. The color filter CF of the second sub-pixel SPXL2 may be a green color filter. The color filter CF of the third sub-pixel SPXL3 may be a blue color filter.

The light conversion pattern layer LCP including the color conversion layer CCL and the color filter CF may be disposed in the emission area EMA of each of the first to third sub-pixels SPXL1, SPXL2, and SPXL3.

A first light block pattern LBP1 may be disposed adjacent to the light conversion pattern layer LCP of each of the first to third sub-pixels SPXL1, SPXL2, and SPXL3. In other words, the first light block pattern LBP1 may be disposed between the light conversion pattern layer LCP of the first sub-pixel SPXL1, the light conversion pattern layer LCP of the second sub-pixel SPXL2, and the light conversion pattern layer LCP of the third sub-pixel SPXL3.

The first light block pattern LBP1 may be provided or disposed on the surface of the base layer BSL to overlap the bank BNK provided or disposed in the non-emission area NEMA of the corresponding sub-pixel. The first light block pattern LBP1 may include at least one black matrix material (for example, at least one light shielding material) among different kinds of black matrix materials, and/or a color filter material having a specific or given color. The first light block pattern LBP1 and the bank BNK may be formed of a same material or a similar material, but the disclosure is not limited thereto. In other words, the first light block pattern LBP1 and the bank BNK may include a same material or a similar material or different materials.

In an embodiment, the first light block pattern LBP1 may have a multi-layer structure formed by overlapping at least two color filters allowing different colors of light to selectively pass therethrough, among a red color filter, a green color filter, and a blue color filter. For example, the first light block pattern LBP1 may include a red color filter, a green color filter disposed on the red color filter and overlapping the red color filter, and a blue color filter disposed on the green color filter and overlapping the green color filter. In other words, the first light block pattern LBP1 may have a structure formed by successively stacking the red color filter, the green color filter, and the blue color filter. In the non-emission area NEMA of each sub-pixel area, the red color filter, the green color filter, and the blue color filter may be used as the first light block pattern LBP1 for blocking transmission of light.

In an embodiment, a second light block pattern LBP2 may be disposed on the first light block pattern LBP1. The first light block pattern LBP1 and the second light block pattern LBP2 may include a same material or a similar material. For example, the first light block pattern LBP1 and the second light block pattern LBP2 each may be a black matrix.

As described above, in the first pixel PXL1, the second scan line S2 may function as a signal line that is electrically connected with the first scan line S1 to transmit a scan signal and a control signal to some or a number of components of each of the first to third sub-pixel circuits SPXC1, SPXC2, and SPXC3, for example, the second and third transistors T2 and T3, along with the first scan line S1.

Figure 13:
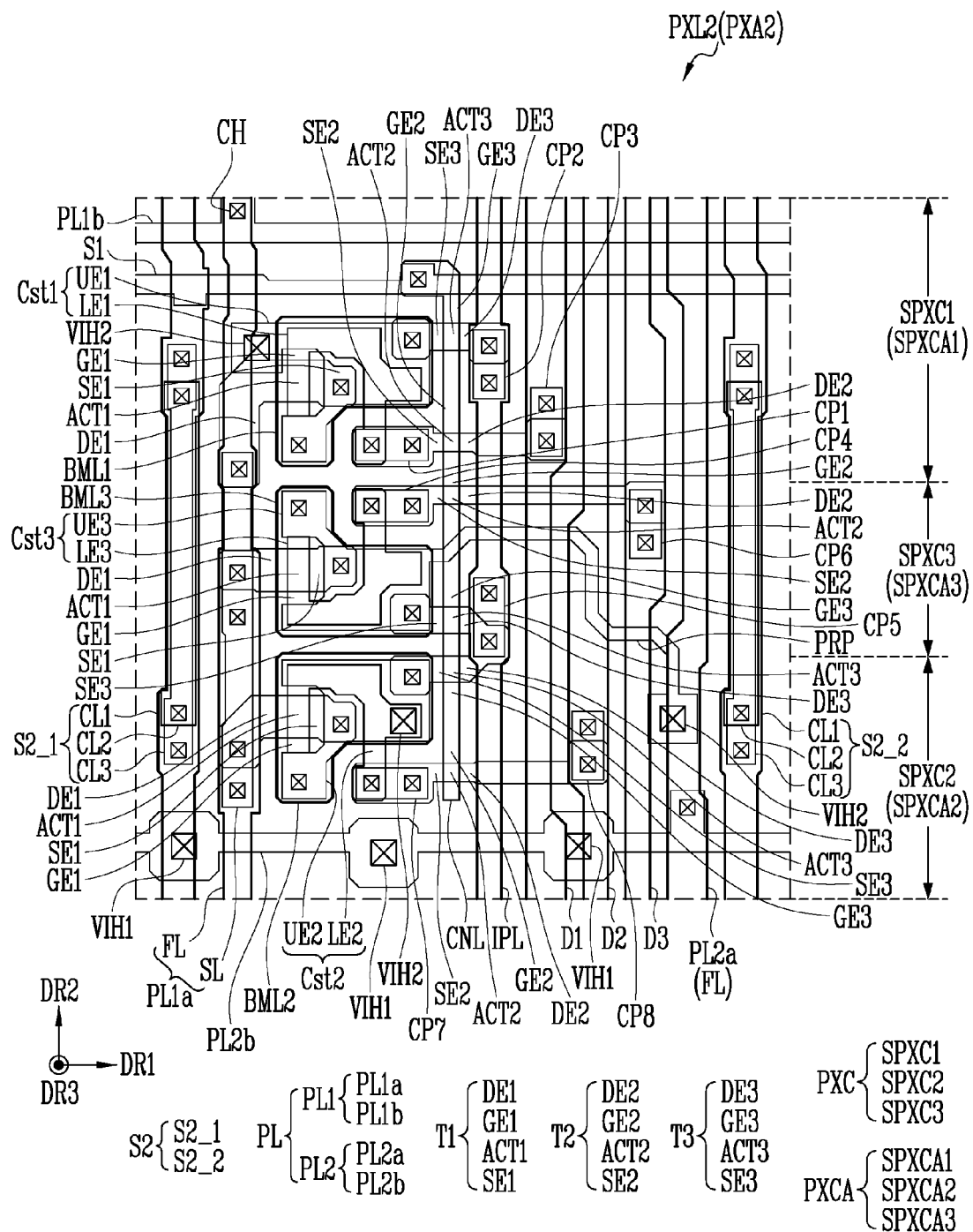
FIG. 13 is a schematic plan view schematically illustrating a pixel circuit area of a second pixel shown in FIG. 6B.

FIG. 13 is a schematic plan view illustrating the pixel circuit area PXCA of the second pixel PXL2 shown in FIG. 6B.

The pixel circuit area PXCA illustrated in FIG. 13 may have a configuration and a structure substantially similar to those of the pixel circuit area PXCA of the first pixel PXL1 shown in FIG. 7, except that the pixel circuit area PXCA may not include a contactor CNT, and the first scan line S1 and the second scan line S2 may not be electrically connected or may not be directly and electrically connected to each other.

Therefore, the following description with reference to FIG. 13 will be focused on differences from that of the foregoing embodiments, to avoid repetitive descriptions thereof. Components which are not separately described in the embodiment of FIG. 13 follow those of the foregoing embodiments. The same reference numeral will be used to designate the same component, and a similar reference numeral will be used to designate a similar component.

Referring to FIGS. 6B, 7, and 13, the second pixel PXL2 may include a first scan line S1 extending in the first direction DR1 and a second scan line S2 intersecting the first scan line S1.

The second scan line S2 may be electrically connected with the driver DIC (see FIG. 4B) and receive a signal (for example, a scan signal and/or a control signal) from the driver DIC. The second scan line S2 may include a 2-1-th scan line S2_1 and a 2-2-th scan line S2_2. Each of the 2-1-th scan line S2_1 and the 2-2-th scan line S2_2 may extend in the second direction DR2, and an area thereof may overlap the first scan line S1.

In the second pixel PXL2, the 2-1-th and 2-2-th scan lines S2_1 and S2_2 may not be electrically connected or directly and electrically connected with the first scan line S1. In other words, in the second pixel PXL2, the first scan line S1 may not be electrically connected or directly and electrically connected with the 2-1-th and 2-2-th scan lines S2_1 and S2_2.

The second pixel PXL2 and the first pixel PXL1 disposed in a pixel row identical to that of the second pixel PXL2 in the first direction DR1 may be electrically connected in common to the first scan line S1. For example, the second pixel PXL2 may be electrically connected to a first scan line S1 identical to that of the first pixel PXL1 disposed in a pixel row identical to that of the second pixel PXL2. Therefore, a signal may be transmitted to the first scan line S1 from the second scan line S2 of the first pixel PXL1 through the contactor CNT, so that the signal may be supplied to each of the first to third sub-pixel circuits SPXC1, SPXC2, and SPXC3 of the second pixel PXL2.

The second pixel PXL2 and the first pixel PXL1 disposed in a pixel column identical to that of the second pixel PXL2 in the first direction DR1 may be electrically connected in common to the first conductive line CL1 of the second scan line S2. For example, the first conductive line CL1 of the 2-1-th scan line S2_1 of the second pixel PXL2 may be electrically connected to the first conductive line CL1 of the 2-1-th scan line S2_1 of the first pixel PXL1 that is disposed in a pixel column identical to that of the second pixel PXL2 in the second direction DR2. Furthermore, the first conductive line CL1 of the 2-2-th scan line S2_2 of the second pixel PXL2 may be electrically connected to the first conductive line CL1 of the 2-2-th scan line S2_2 of the first pixel PXL1.

Therefore, the second scan line S2 in the second pixel PXL2 may transmit, via the corresponding pixel, a signal from the driver DIC to the first pixel PXL1.

According to the foregoing embodiment, the first scan line S1 in the second pixel PXL2 may receive a signal from the first pixel PXL1 disposed in a pixel row identical to that of the second pixel PXL2 in the first direction DR1. The second scan line S2 in the second pixel PXL2 may transmit, through the contactor CNT, a signal from the driver DIC to the first pixel PXL1 disposed in a pixel column identical to that of the second pixel PXL2 in the second direction DR2. The first scan line S1 and the second scan line S2 in the second pixel PXL2 do not include a contactor CNT and thus do not contact or directly contact each other, but may be used as the scan line SC for transmitting a signal received from the driver DIC to the corresponding pixel and the first pixel PXL1.

Figure 14:
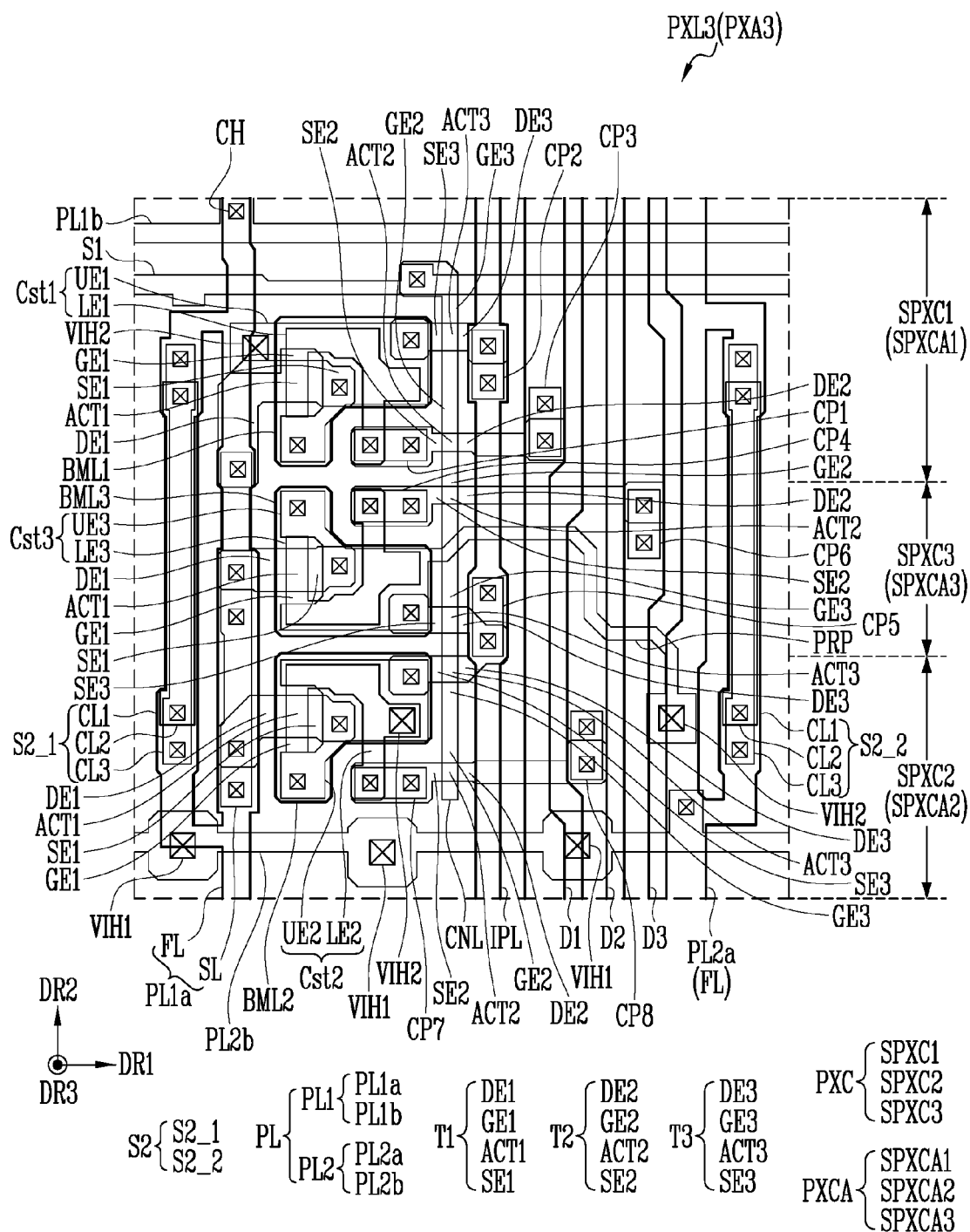
FIGS. 14 and 15 are schematic plan views schematically illustrating a pixel circuit area of a third pixel shown in FIG. 6B.
Figure 15:
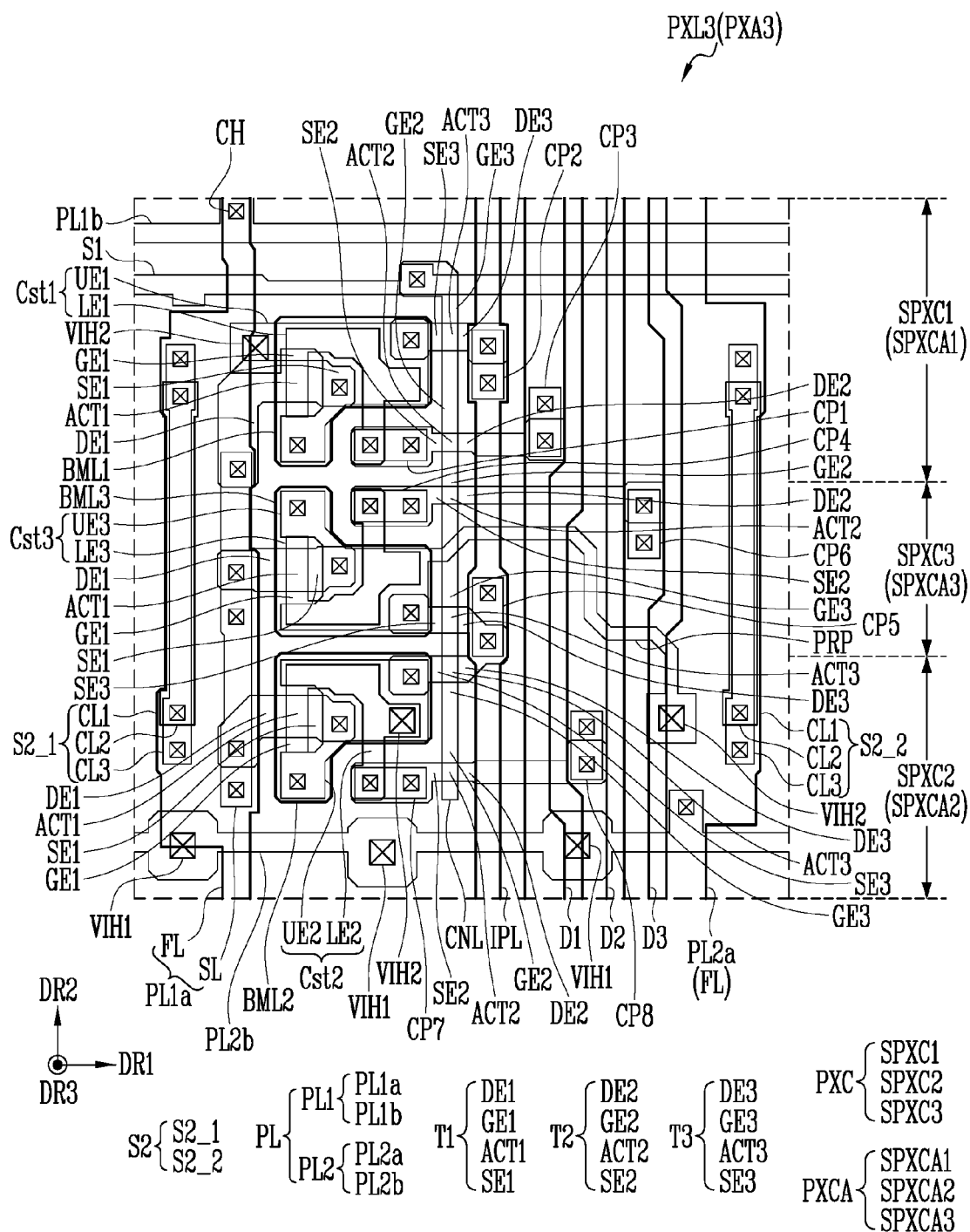

FIGS. 14 and 15 are schematic plan views illustrating the pixel circuit area PXCA of the third pixel PXL3 shown in FIG. 6B.

The pixel circuit areas PXCA of the third pixel PXL3 shown in FIGS. 14 and 15 may have a configuration and a structure substantially similar to those of the pixel circuit area PXCA of the first pixel PXL1 shown in FIG. 7, except that the pixel circuit areas PXCA do not include a contactor CNT, and the second scan line S2 is electrically connected to the power line PL to be used as the power line PL.

Therefore, the description of the third pixel PXL3 of FIGS. 14 and 15 will be focused on differences from that of the foregoing embodiments to avoid repetitive descriptions thereof.

Referring to FIGS. 6B, 7, 14, and 15, the third pixel PXL3 may include a first scan line S1 extending in the first direction DR1 and a second scan line S2 extending in the second direction DR2.

The third pixel PXL3 and the first pixel PXL1 disposed in a pixel row identical to that of the third pixel PXL3 in the first direction DR1 may be electrically connected in common to the first scan line S1. For example, the third pixel PXL3 may be electrically connected to a first scan line S1 identical to that of the first pixel PXL1 disposed in a pixel row identical to that of the third pixel PXL3. Therefore, a signal (for example, a scan signal and/or a control signal) may be transmitted to the first scan line S1 from the second scan line S2 of the first pixel PXL1 through the contactor CNT, so that the signal may be supplied to each of the first to third sub-pixel circuits SPXC1, SPXC2, and SPXC3 of the third pixel PXL3.

The second scan line S2 may include a 2-1-th scan line S2_1 and a 2-2-th scan line S2_2. Each of the 2-1-th and 2-2-th scan liens S2_1 and S2_2 may include a first conductive line CL1, a second conductive line CL2, and a third conductive line CL3.

In an embodiment, the 2-1-th scan line S2_1 of the first pixel PXL1 may not be electrically connected with the 2-1-th scan line S2_1 of the third pixel PXL3 that is disposed over the first pixel PXL1 based on the contactor CNT and is disposed in a pixel column identical to that of the first pixel PXL1 in the second direction DR2. For example, the first conductive line CL1 of the 2-1-th scan line S2_1 of the first pixel PXL1 may not be electrically connected with the first conductive line CL1 of the 2-1-th scan line S2_1 of the third pixel PXL3 that is disposed over the first pixel PXL1 based on the contactor CNT provided or disposed in the first pixel PXL1 and is disposed in a pixel column identical to that of the first pixel PXL1 in the second direction DR2. The 2-1-th scan line S2_1 of the third pixel PXL3 and the 2-1-th scan line S2_1 of the first pixel PXL1 may be electrically separated from each other. Therefore, the 2-1-th scan line S2_1 of the third pixel PXL3 may be regarded as being a component provided separately (or independently) from the 2-1-th scan line S2_1 of the first pixel PXL1.

In an embodiment, the 2-2-th scan line S2_2 of the first pixel PXL1 may not be electrically connected with the 2-2-th scan line S2_2 of the third pixel PXL3 that is disposed over the first pixel PXL1 based on the contactor CNT and is disposed in a pixel column identical to that of the first pixel PXL1 in the second direction DR2. For example, the first conductive line CL1 of the 2-2-th scan line S2_2 of the first pixel PXL1 may not be electrically connected with the first conductive line CL1 of the 2-2-th scan line S2_2 of the third pixel PXL3 that is disposed over the first pixel PXL1 based on the contactor CNT provided or disposed in the first pixel PXL1 and is disposed in a pixel column identical to that of the first pixel PXL1 in the second direction DR2. The 2-2-th scan line S2_2 of the third pixel PXL3 and the 2-2-th scan line S2_2 of the first pixel PXL1 may be electrically separated from each other. Therefore, the 2-2-th scan line S2_2 of the third pixel PXL3 may be regarded as being a component provided separately (or independently) from the 2-2-th scan line S2_2 of the first pixel PXL1.

In the third pixel PXL3, the second scan line S2 may be disposed adjacent to the power line PL and be electrically connected with the power line PL. For example, the 2-1-th scan line S2_1 may be disposed adjacent to the 1a-th power line PL1a and be electrically connected with the 1a-th power line PL1a. The 2-2-th scan line S2_2 may be disposed adjacent to the 2a-th power line PL2a and be electrically connected with the 2a-th power line PL2a. In an embodiment, the second scan line S2 may not overlap the first scan line S1 in the third pixel area PXA3 of the third pixel PXL3.

The first conductive line CL1 of the 2-1-th scan line S2_1 may be integral with the first layer FL of the 1a-th power line PL1a and to thus be electrically connected with the first layer FL. For example, the first conductive line CL1 of the 2-1-th scan line S2_1 may be an area of the 1a-th power line PL1a. A voltage of the first driving power supply VDD (see FIG. 5) applied to the 1a-th power line PL1a may be transmitted to the first conductive line CL1 of the 2-1-th scan line S2_1. Therefore, in the third pixel PXL3, the 2-1-th scan line S2_1 along with the 1a-th power line PL1a may be used as the first power line PL1 for transmitting the voltage of the first driving power supply VDD to each of the first to third sub-pixel circuits SPXC1, SPXC2, and SPXC3 of the corresponding pixel.

In an embodiment, as illustrated in FIG. 14, only the opposite ends of the first conductive line CL1 of the 2-1-th scan line S2_1 may protrude to the first layer FL of the 1a-th power line PL1a in the first direction DR1 and be integral with the first layer FL. The first conductive line CL1 of the 2-1-th scan line S2_1 may not overlap the second layer SL of the 1a-th power line PL1a. In an embodiment, as illustrated in FIG. 15, the first conductive line CL1 of the 2-1-th scan line S2_1 may extend to the first layer FL of the 1a-th power line PL1a in the first direction DR1 and be integral with the first layer FL. The first conductive line CL1 of the 2-1-th scan line S2_1 may overlap the second layer SL of the 1a-th power line PL1a.

Although the foregoing embodiment has been described in which a portion of the first conductive line CL1 of the 2-1-th scan line S2_1 protrudes or extends and is integral with the first layer FL of the 1a-th power line PL1a, the shape of the first conductive line CL1 is not limited thereto. In an embodiment, the shape of the first conductive line CL1 may be changed in various ways so long as occurrence of a capacitance (CAP) coupling (for example, a parasitic capacitor) with an adjacent electrode or line can be minimized.

As described above, as the 2-1-th scan line S2_1 in the third pixel PXL3 is used as the first power line PL1, the surface area of the first power line PL1 may be further increased, and line resistance of the first power line PL1 may be reduced. Therefore, a defect attributable to a signal delay (or a voltage drop) of the first driving power supply VDD may be mitigated or prevented.

The first conductive line CL1 of the 2-2-th scan line S2_2 may be integral with the first layer FL of the 1b-th power line PL1b to thus be electrically connected with the first layer FL. For example, the first conductive line CL1 of the 2-2-th scan line S2_2 may be an area of the 2a-th power line PL2a. A voltage of the second driving power supply VSS (see FIG. 5) applied to the 2a-th power line PL2a may be transmitted to the first conductive line CL1 of the 2-2-th scan line S2_2. Therefore, in the third pixel PXL3, the 2-2-th scan line S2_2 along with the 2a-th power line PL2a may be used as the second power line PL2 for transmitting the voltage of the second driving power supply VSS to each of the first to third sub-pixel circuits SPXC1, SPXC2, and SPXC3 of the corresponding pixel.

In an embodiment, as illustrated in FIG. 14, only the opposite ends of the first conductive line CL1 of the 2-2-th scan line S2_2 may protrude to the first layer FL of the 2a-th power line PL2a in the first direction DR1 and be integral with the first layer FL. In an embodiment, as illustrated in FIG. 15, the first conductive line CL1 of the 2-2-th scan line S2_2 may extend to the first layer FL of the 2a-th power line PL2a in the first direction DR1 and be integral with the first layer FL.

Although the foregoing embodiment has been described in which a portion of the first conductive line CL1 of the 2-2-th scan line S2_2 protrudes or extends and is integral with the first layer FL of the 2a-th power line PL2a, the shape of the first conductive line CL1 is not limited thereto. In an embodiment, the shape of the first conductive line CL1 may be changed in various ways so long as occurrence of a CAP coupling (for example, a parasitic capacitor) with an adjacent electrode or line can be minimized.

As described above, as the 2-2-th scan line S2_2 in the third pixel PXL3 is used as the second power line PL2, the surface area of the second power line PL2 may be further increased, and line resistance of the second power line PL2 may be reduced. Therefore, a defect attributable to a signal delay (or a voltage drop) of the second driving power supply VSS may be mitigated or prevented.

According to the foregoing embodiment, the first scan line S1 in the third pixel PXL3 may receive a signal from the first pixel PXL1 disposed in a pixel row identical to that of the third pixel PXL3 in the first direction DR1. The second scan line S2 in the third pixel PXL3 may be electrically separated from the second scan line S2 of the first pixel PXL1 disposed in a pixel column identical to that of the third pixel PXL3 in the second direction DR2 and be electrically connected with the power line PL of the corresponding pixel to thus be used as the power line PL.

According to the foregoing embodiment, in an operation of aligning the light emitting elements LD (see FIG. 8) in the third pixel PXL3, a voltage drop of an alignment signal to be applied to each of the alignment electrodes of the corresponding pixel, for example, each of the first to fourth electrodes EL1, EL2, EL3, and EL4 described with reference to FIG. 8, may be mitigated. Therefore, in the display area DA of the display device DD, a uniform number of light emitting elements LD are aligned in the first pixel PXL1, the second pixel PXL2 (see FIG. 13), and the third pixel PXL3 regardless of area, so that the luminance uniformity in the display area DA may be improved, and process variation may be mitigated.

Although the foregoing embodiment has been described in which a scan signal and a control signal are transmitted to a same scan line, for example, the first scan line S1, and supplied to some or a number of components of the pixel circuit PXC of each of the first to third pixels PXL1, PXL2, and PXL3, the disclosure is not limited thereto.

In an embodiment, each of the first to third pixels PXL1, PXL2, and PXL3 may include a scan line (not shown) that supplies a scan signal to some or a number of components of the pixel circuit PXC of a corresponding pixel, and another scan line (not shown) that supplies a control signal to other components of the pixel circuit PXC. The foregoing embodiment will be described with reference to FIGS. 16 to 18.

Figure 16:
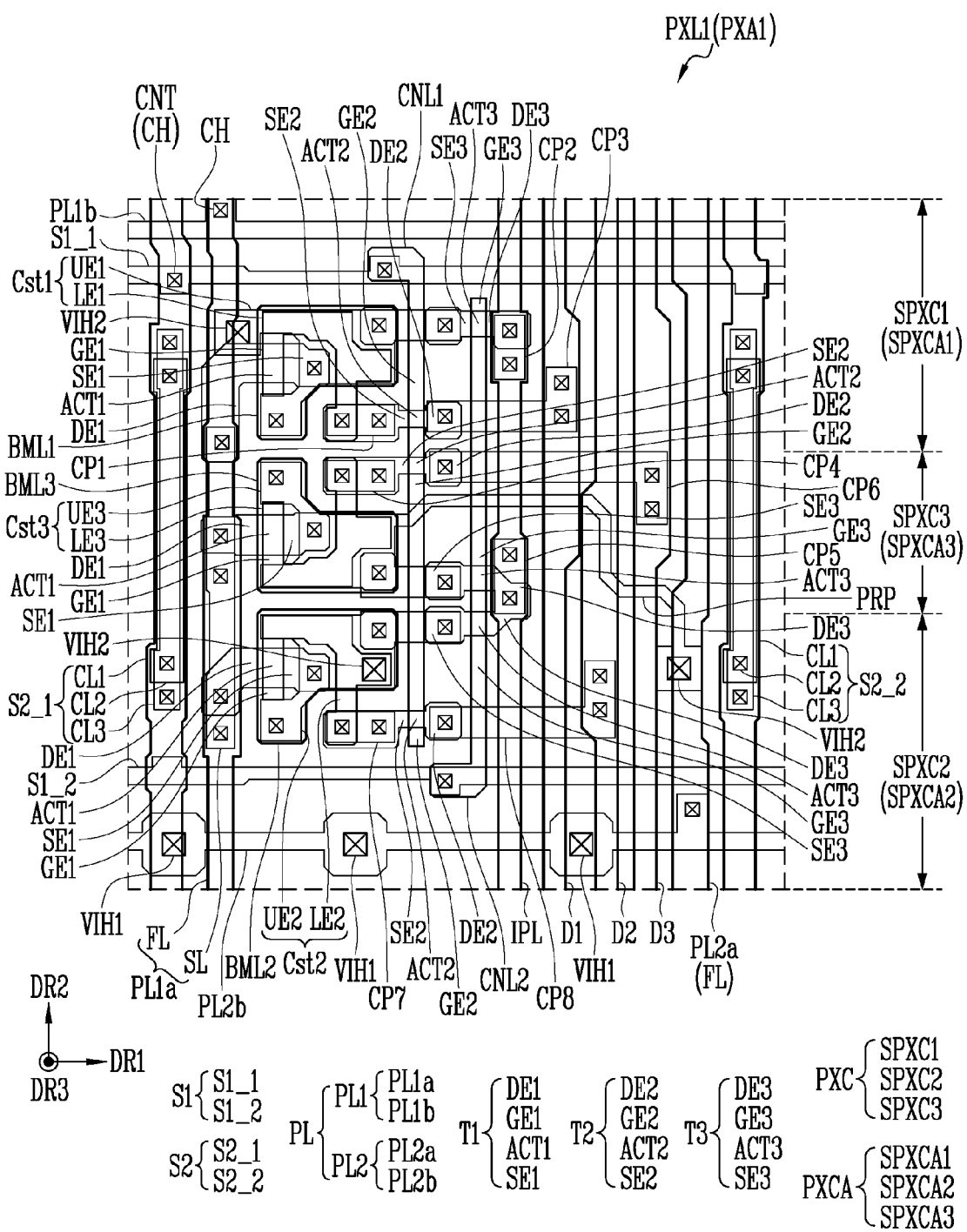
FIG. 16 is a schematic plan view schematically illustrating a pixel circuit area of the first pixel shown in FIG. 6B in accordance with an embodiment.
Figure 17:
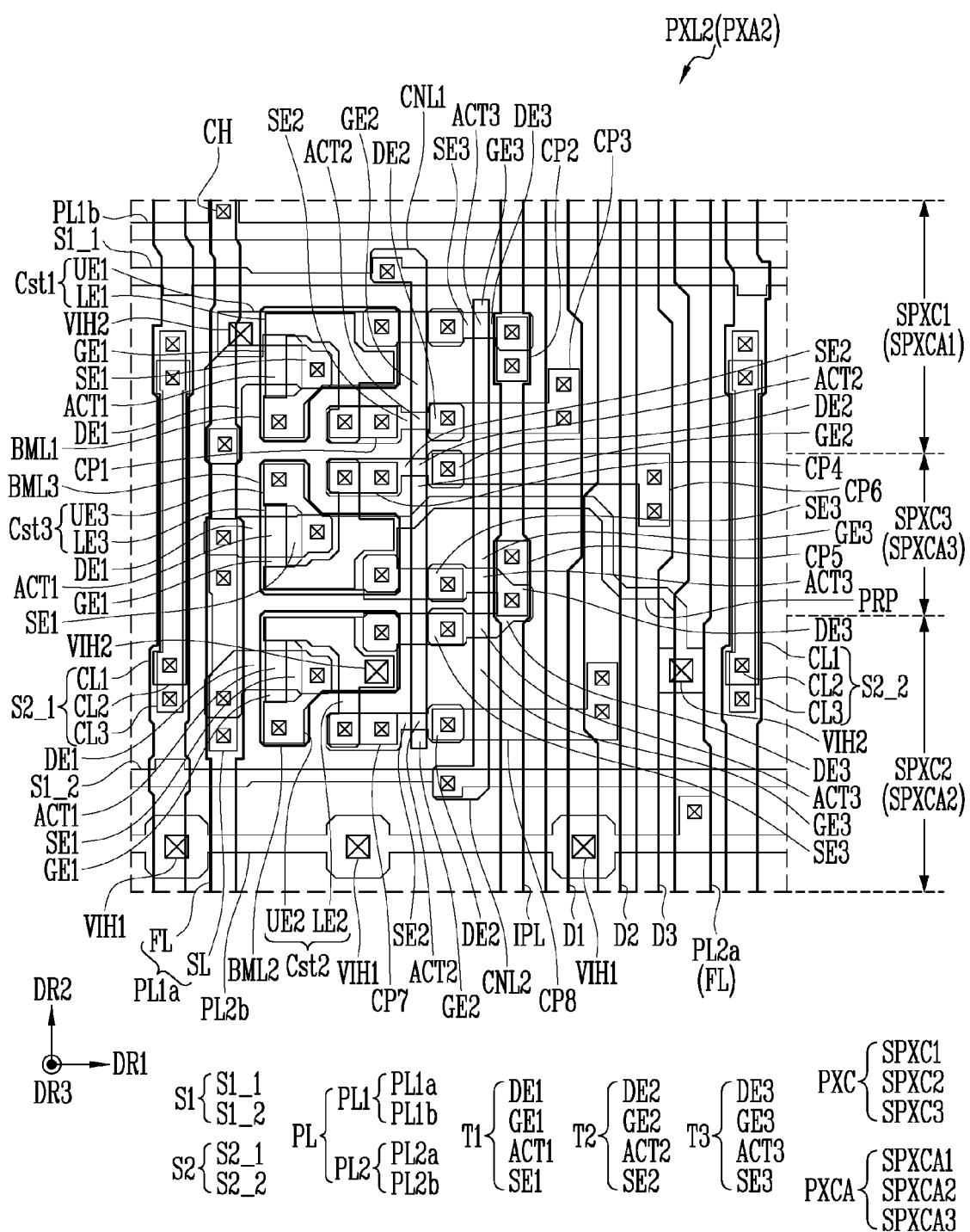
FIG. 17 is a schematic plan view schematically illustrating a pixel circuit area of the second pixel shown in FIG. 6B in accordance with an embodiment.
Figure 18:
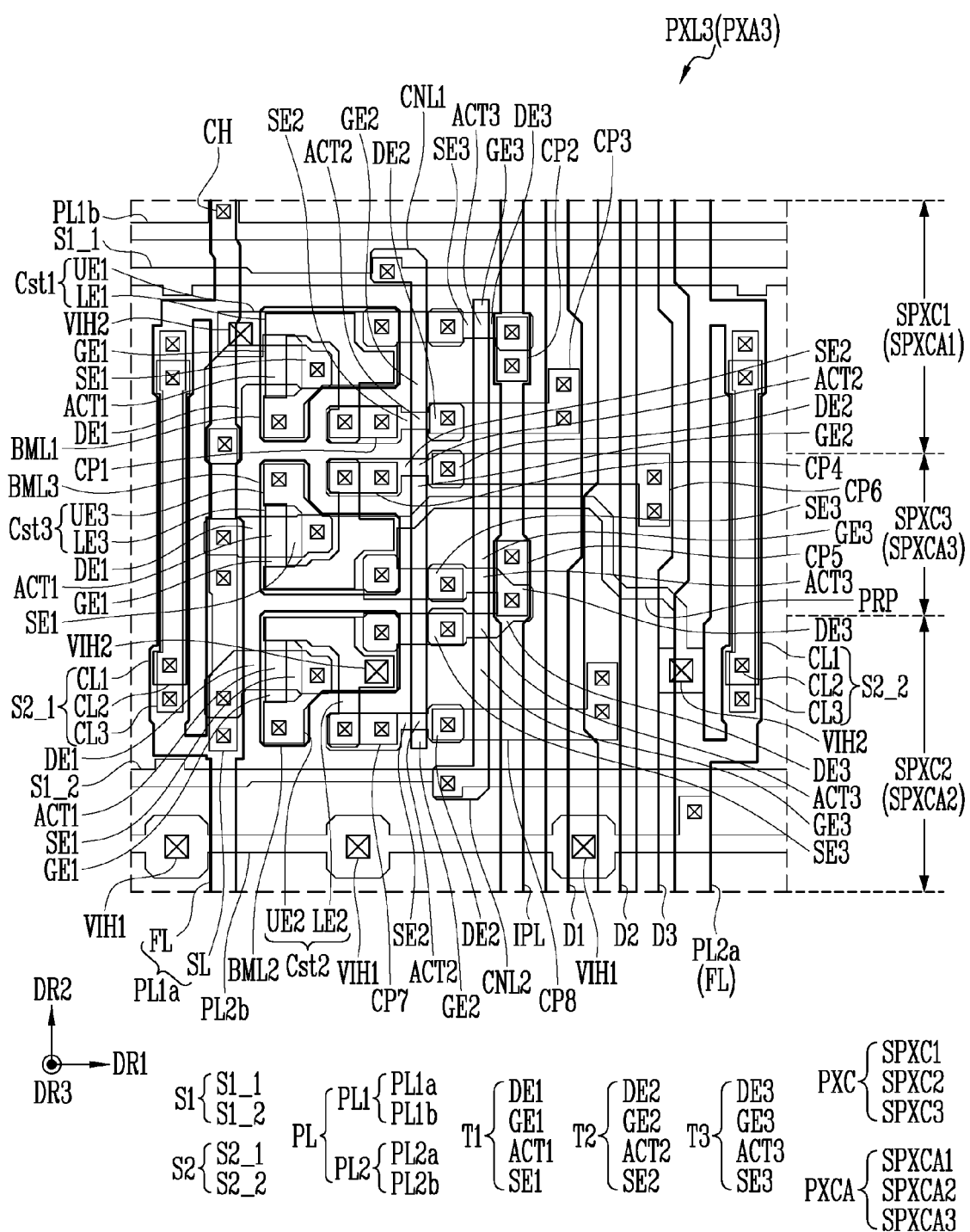
FIG. 18 is a schematic plan view schematically illustrating a pixel circuit area of the third pixel shown in FIG. 6B in accordance with an embodiment.

FIG. 16 is a schematic plan view illustrating the pixel circuit area PXCA of the first pixel PXL1 shown in FIG. 6B in accordance with an embodiment. FIG. 17 is a schematic plan view illustrating the pixel circuit area PXCA of the second pixel PXL2 shown in FIG. 6B in accordance with an embodiment. FIG. 18 is a schematic plan view illustrating the pixel circuit area PXCA of the third pixel PXL3 shown in FIG. 6B in accordance with an embodiment.

The pixel circuit area PXCA illustrated in FIG. 16 may have a configuration and a structure substantially similar to those of the pixel circuit area PXCA of the first pixel PXL1 shown in FIG. 7, except that the pixel circuit area PXCA illustrated in FIG. 16 may include first and second connection lines CNL1 and CNL2 and 1-1-th and 1-2-th scan lines S1_1 and S1_2.

The pixel circuit area PXCA illustrated in FIG. 17 may have a configuration and a structure substantially similar to those of the pixel circuit area PXCA of the second pixel PXL2 shown in FIG. 13 except that the pixel circuit area PXCA illustrated in FIG. 17 may include first and second connection lines CNL1 and CNL2 and 1-1-th and 1-2-th scan lines S1_1 and S1_2.

The pixel circuit area PXCA illustrated in FIG. 18 may have configuration and structure substantially similar to those of the pixel circuit area PXCA of the third pixel PXL3 shown in FIG. 14 except that the pixel circuit area PXCA illustrated in FIG. 18 may include first and second connection lines CNL1 and CNL2 and 1-1-th and 1-2-th scan lines S1_1 and S1_2.

Therefore, the following description with reference to FIGS. 16 to 18 will be focused on differences from that of the foregoing embodiments to avoid repetitive descriptions thereof.

Referring to FIGS. 6B and 16 to 18, each of the first to third pixels PXL1, PXL2, and PXL3 may include a first scan line S1 extending in the first direction DR1 and a second scan line S2 extending in the second direction DR2. For the sake of explanation, in the following descriptions, the term "pixel PXL" or "pixels PXL" will be used to collectively designate the first pixel PXL1, the second pixel PXL2, and the third pixel PXL3. Furthermore, the term "pixel area PXA" or "pixel areas PXA" will be used to collectively designate the first pixel area PXA1 in which the first pixel PXL1 is provided or disposed, the second pixel area PXA2 in which the second pixel PXL2 is provided or disposed, and the third pixel area PXA3 in which the third pixel PXL3 is provided or disposed.

The first scan line S1 may correspond to the third conductive layer provided or disposed and/or formed on the interlayer insulating layer ILD (see FIG. 12A). The second scan line S2 may correspond to the first conductive layer provided or disposed and/or formed on the substrate SUB.

The first scan line S1 may include a 1-1-th scan line S1_1 and a 1-2-th scan line S1_2 which are spaced apart from each other. In an embodiment, the 1-1-th scan line S1_1 may be disposed adjacent to the 1b-th power line PL1b and be spaced apart from the 1b-th power line PL1b. The 1-2-th scan line S1_2 may be disposed adjacent to the 2b-th power line PL2b and be spaced apart from the 2b-th power line PL2b.

A scan signal may be applied to the 1-1-th scan line S1_1. The 1-1-th scan line S1_1 may be the i-th scan line S1 described with reference to FIG. 5. In each of the first to third pixels PXL1, PXL2, and PXL3, the 1-1-th scan line S1_1 may be electrically connected to the first connection line CNL1 through a corresponding contact hole CH. For example, the 1-1-th scan line S1_1 may be electrically and/or physically connected with the first connection line CNL1 through a contact hole CH passing through the interlayer insulating layer ILD in the corresponding pixel PXL.

The first connection line CNL1 may correspond to the second conductive layer provided or disposed and/or formed on the gate insulating layer GI (see FIG. 12A). In an embodiment, the first connection line CNL1 may be integral with the second gate electrode GE2 of the second transistor T2 of each of the first to third sub-pixel circuits SPXC1, SPXC2, and SPXC3 of the corresponding pixel PXL. For example, a portion of the first connection line CNL1 may correspond to the second gate electrode GE2 of each of the first to third sub-pixel circuits SPXC1, SPXC2, and SPXC3. Therefore, the 1-1-th scan line S1_1 may be electrically connected with the second gate electrode GE2 of each of the first to third sub-pixel circuits SPXC1, SPXC2, and SPXC3 of the corresponding pixel PXL.

A control signal may be applied to the 1-2-th scan line S1_2. The 1-2-th scan line S1_2 may correspond to the i-th control line CLi described with reference to FIG. 5. In each of the first to third pixels PXL1, PXL2, and PXL3, the 1-2-th scan line S1_2 may be electrically connected to the second connection line CNL2 through a corresponding contact hole CH. For example, the 1-2-th scan line S1_2 may be electrically and/or physically connected with the second connection line CNL2 through a contact hole CH passing through the interlayer insulating layer ILD in the corresponding pixel PXL.

The second connection line CNL2 may correspond to the second conductive layer provided or disposed and/or formed on the gate insulating layer GI. In an embodiment, the second connection line CNL2 and the first connection line CNL1 may be provided or disposed and/or formed on a same layer. The second connection line CNL2 may be integral with the third gate electrode GE3 of the third transistor T3 of each of the first to third sub-pixel circuits SPXC1, SPXC2, and SPXC3 of the corresponding pixel PXL. For example, a portion of the second connection line CNL2 may correspond to the third gate electrode GE3 of each of the first to third sub-pixel circuits SPXC1, SPXC2, and SPXC3. Therefore, the 1-2-th scan line S1_2 may be electrically connected with the third gate electrode GE3 of each of the first to third sub-pixel circuits SPXC1, SPXC2, and SPXC3.

The first connection line CNL1 and the second connection line CNL2 may be common components provided or disposed in common in the first to third sub-pixel circuits SPXC1, SPXC2, and SPXC3 of each of the first to third pixels PXL1, PXL2, and PXL3.

In an embodiment, the second scan line S2 may include a 2-1-th scan line S2_1 and a 2-2-th scan line S2_2 which are spaced apart from each other.

In the first pixel PXL1, the second scan line S2 may intersect the first scan line S1 of the corresponding pixel PXL, as shown in FIG. 16, so that a portion of the second scan line S2 may overlap the first scan line S1. In the second pixel PXL2, the second scan line S2 may intersect the first scan line S1 of the corresponding pixel PXL, as shown in FIG. 17, so that a portion of the second scan line S2 may overlap the first scan line S1. In the third pixel PXL3, the second scan line S2 may not intersect the first scan line S1 of the corresponding pixel PXL, as shown in FIG. 18, so that the second scan line S2 may not overlap the first scan line S1. However, the disclosure is not limited thereto. In an embodiment, the second scan line S2 of the third pixel PXL3 may intersect the first scan line S1 of the corresponding pixel PXL to thus overlap the first scan line S1.

In the first pixel PXL1, at least one of the second scan lines S2, for example, the 2-1-th scan line S2_1, may be electrically and/or physically connected with the 1-1-th scan line S1_1 through the contactor CNT, as illustrated in FIG. 16. Although not illustrated in the drawings, the other of the second scan lines S2 in the first pixel PXL1, for example, the 2-2-th scan lines S2_2, may be electrically and/or physically connected with the 1-2-th scan line S1_2 through another contactor (not shown).

In the pixel area PXA of each of the first to third pixels PXL1, PXL2, and PXL3, the second scan line S2 may be disposed adjacent to the power line PL. For example, the 2-1-th scan line S2_1 may be disposed in the pixel area PXA of the corresponding pixel PXL to be adjacent to the 1a-th power line PL1a. The 2-2-th scan line S2_2 may be disposed in the pixel area PXA to be adjacent to the 2a-th power line PL2a.

As illustrated in FIG. 16, in the first pixel PXL1, the 2-1-th scan line S2_1 may be disposed adjacent to the 1a-th power line PL1a and be spaced apart from the 1a-th power line PL1a. The 2-2-th scan line S2_2 may be disposed adjacent to the 2a-th power line PL2a and be spaced apart from the 2a-th power line PL2a.

As illustrated in FIG. 17, in the second pixel PXL2, the 2-1-th scan line S2_1 may be disposed adjacent to the 1a-th power line PL1a and spaced apart from the 1a-th power line PL1a. The 2-2-th scan line S2_2 may be disposed adjacent to the 2a-th power line PL2a and spaced apart from the 2a-th power line PL2a.

As illustrated in FIG. 18, the 2-1-th scan line S2_1 in the third pixel PXL3 may be disposed adjacent to the 1a-th power line PL1a and be integral with the 1a-th power line PL1a to thus be electrically connected with the 1a-th power line PL1a. For example, the first conductive line CL1 of the 2-1-th scan line S2_1 may be integral with the first layer FL of the 1a-th power line PL1a to thus be electrically connected with the first layer FL. The first conductive line CL1 of the 2-1-th scan line S2_1 may be an area of the 1a-th power line PL1a.

In an embodiment, in the third pixel PXL3, the 2-1-th scan line S2_1 along with the 1a-th power line PL1a may be used as the first power line PL1 for transmitting the voltage of the first driving power supply VDD (see FIG. 5) to each of the first to third sub-pixel circuits SPXC1, SPXC2, and SPXC3 of the corresponding pixel PXL.

As illustrated in FIG. 18, the 2-2-th scan line S2_2 in the third pixel PXL3 may be disposed adjacent to the 2a-th power line PL2a and be integral with the 2a-th power line PL2a to thus be electrically connected with the 2a-th power line PL2a. For example, the first conductive line CL1 of the 2-2-th scan line S2_2 may be integral with the first layer FL of the 2a-th power line PL2a to thus be electrically connected with the first layer FL. The first conductive line CL1 of the 2-2-th scan line S2_2 may be an area of the 2a-th power line PL2a.

In an embodiment, in the third pixel PXL3, the 2-2-th scan line S2_2 along with the 2a-th power line PL2a may be used as the second power line PL2 for transmitting the voltage of the second driving power supply VSS (see FIG. 5) to each of the first to third sub-pixel circuits SPXC1, SPXC2, and SPXC3 of the corresponding pixel PXL.

Figure 19:
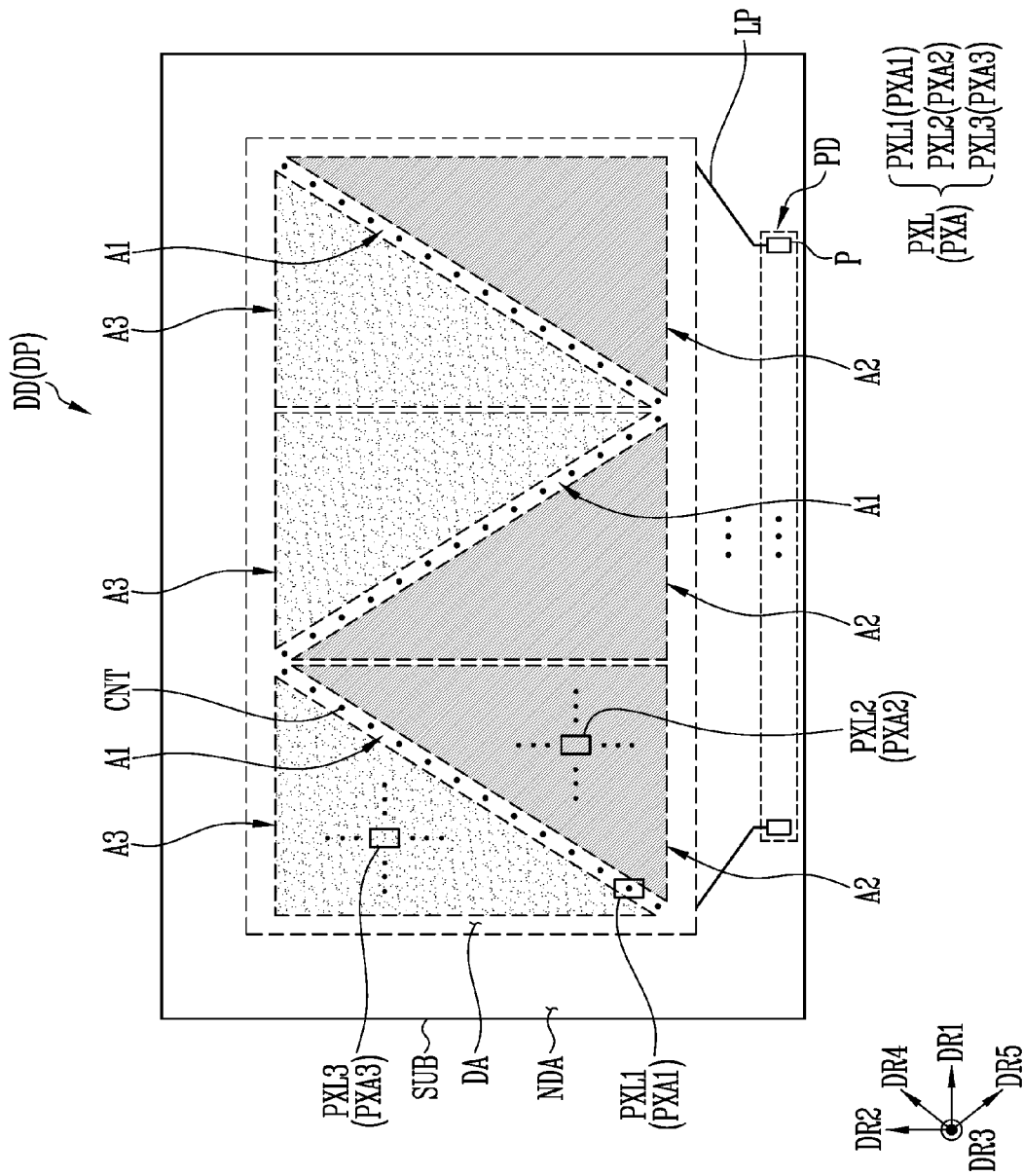
FIGS. 19 and 20 are schematic plan views schematically illustrating a display device in accordance with an embodiment.
Figure 20:
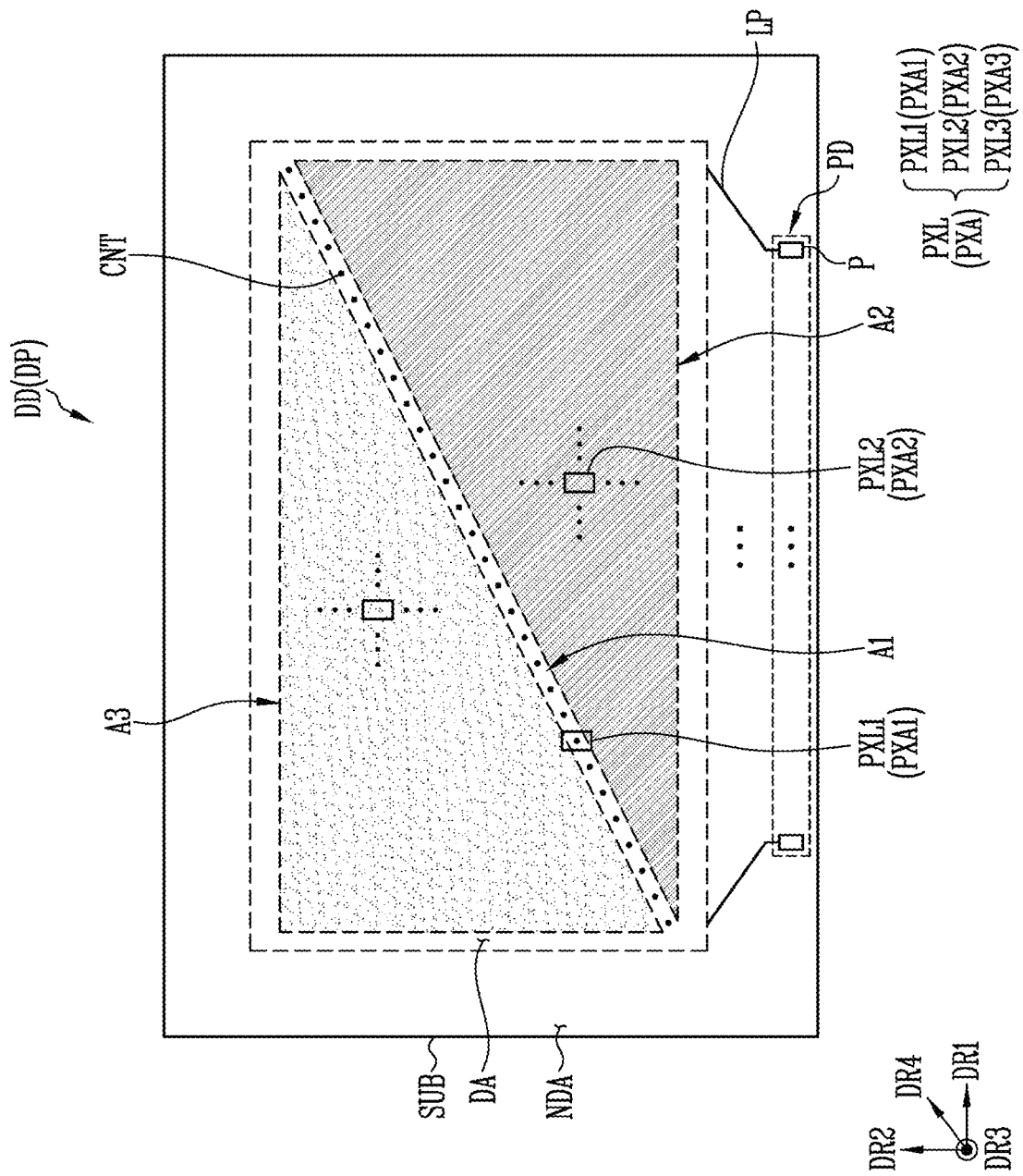

FIGS. 19 and 20 are schematic plan views illustrating a display device DD in accordance with an embodiment. FIGS. 19 and 20 are schematic plan views illustrating only some or a number of components of the display device DD in accordance with an embodiment.

With regard to the display device of FIGS. 19 and 20, the following description will be focused on differences from that of the foregoing embodiments to avoid repetitive descriptions thereof.

As illustrated in FIGS. 19 and 20, for the sake of explanation, a transverse direction (or a horizontal direction) in a plan view is indicated by a first direction DR1, a longitudinal direction (or a vertical direction) in a plan view is indicated by a second direction DR2, a direction perpendicular to the first and second directions DR1 and DR2 is indicated by a third direction DR3, a direction diagonally inclined with respect to the second direction DR2 is indicated by a fourth direction DR4, and a direction diagonally inclined with respect to the first direction DR1 is indicated by a fifth direction DR5. The first to fifth directions DR1, DR2, DR3, DR4, and DR5 may refer to the directions indicated by the first to fifth directions DR1, DR2, DR3, DR4, and DR5, respectively.

Referring to FIGS. 19 and 20, the display device DD in accordance with an embodiment may include a substrate SUB, pixels PXL, a line circuit LP, and a pad part PD.

A scan line SC (see FIG. 6A) for transmitting a signal (for example, a scan signal and/or a control signal) to each of the pixels PXL may be disposed in a display area DA of the substrate SUB. The scan line SC may include first scan lines S1 (see FIG. 6A) and second scan lines S2 (see FIG. 6A). Each of the first scan lines S1 may be electrically and/or physically connected with some or a number of the second scan lines S2 through one or more contactors CNT. For example, as illustrated in FIG. 19, each scan line S1 may be electrically and/or physically connected with three scan lines S2 that are successively arranged or disposed in the first direction DR1, by using three contactors CNT. However, the disclosure is not limited to this. In an embodiment, as illustrated in FIG. 20, each scan line S1 may be electrically and/or physically connected with each scan line S2 that is successively arranged or disposed in the first direction DR1, by using a contactor CNT.

In an embodiment, contactors CNT may be provided, and the positions thereof may be changed in various ways. For example, some or a number of the contactors CNT may be successively arranged or disposed in the fourth direction DR4, in a plan view. Furthermore, others of the contactors CNT may be successively arranged or disposed in the fifth direction DR5 different from the fourth direction DR4, in a plan view. Since some or a number of the contactors CNT are arranged or disposed in the fourth direction DR4 and the other contactors CNT are arranged or disposed in the fifth direction DR5 different from the fourth direction DR4 in the display area DA such that the contactors CNT arranged or disposed in the fourth direction DR4 alternate with the contactors CNT arranged or disposed in the fifth direction DR5, a phenomenon in which a spot is visible because of a difference in luminance between the pixels PXL disposed above and below the contactors CNT may be mitigated or prevented. In other words, the positions of the contactors CNT in the display area DA may be changed in various ways such that a difference in luminance between the pixels PXL disposed above and below the contactors CNT can be reduced, and thus the display quality of the display device DD may be enhanced.

In an embodiment, the pixels PXL may include a first pixel PXL1, a second pixel PXL2, and a third pixel PXL3.

The first pixel PXL1 may include the contactor CNT. In the first pixel PXL1, a first scan line S1 may contact or directly contact at least one second scan line S2 through the contactor CNT to thus be physically and/or electrically connected to the second scan line S2.

The second pixel PXL2 may not include a contactor CNT and may be electrically connected in common to at least one second scan line S2 provided or disposed in the first pixel PXL1 disposed in a pixel column identical to that of the second pixel PXL2 in the second direction DR2. The second pixel PXL2 may be disposed below the contactor CNT. In other words, the second pixel PXL2 may be disposed closer to the pad part PD in the second direction DR2 than to the first pixel PXL1 including the contactor CNT.

The third pixel PXL3 may not include a contactor CNT and may not be electrically connected in common to at least one second scan line S2 provided or disposed in the first pixel PXL1 disposed in a pixel column identical to that of the third pixel PXL3 in the second direction DR2. The third pixel PXL3 may be disposed above the contactor CNT. In other words, the third pixel PXL3 may be disposed farther from the pad part PD in the second direction DR2 than from the first pixel PXL1 including the contactor CNT.

As described above, in case that the positions of the contactors CNT in the display area DA are changed, the positions and shapes of components included in each of the first to third pixels PXL1, PXL2, and PXL3, for example, the second scan lines S2, may be changed to correspond to the positions of the contactors CNT.

In an embodiment, the display area DA of the substrate SUB may be sectioned into or may include a first area A1, a second area A2, and a third area A3, based on the contactor CNT.

The first area A1 may be an area of the display area DA in which the contactor CNT is disposed. The first pixel PXL1 may be provided or disposed in the first area A1. As illustrated in FIG. 19, the first area A1 may include, according to an arrangement direction of the contactor CNT, an area of the display area DA disposed in the fourth direction DR4 and another area of the display area DA disposed in the fifth direction DR5. The second area A2 may be an area of the display area DA that is disposed below the first area A1. The second pixel PXL2 may be provided or disposed in the second area A2. The third area A3 may be an area of the display area DA that is disposed above the first area A1. The third pixel PXL3 may be provided or disposed in the third area A3.

At least one second area A2 may face at least one third area A3, based on a first area A1. A second area A2 and a third area A3 that face each other based on the first area A1 may have a same size or different sizes. In an embodiment, since the first area A1 corresponds to an area of the display area DA in which the first pixels PXL1 including the contactors CNT are provided, the first area A1 may have a size less than that of the second or third area A2 or A3.

In a display device in accordance with an embodiment, some or a number of scan lines extending in a longitudinal direction may be electrically connected with a power line, so that the load of the power line may be reduced, and thus a defect attributable to a signal delay of the power line may be prevented from occurring.

Furthermore, in an embodiment, light emitting elements may be uniformly arranged or disposed in each pixel, so that the arrangement uniformity of the light emitting elements can be enhanced.

The effects of an embodiment are not limited by the foregoing, and other various effects are included herein.

While various embodiments have been described above, those skilled in the art will appreciate that various modifications, additions and substitutions are possible, without departing from the scope and spirit of the disclosure.

Therefore, the embodiments disclosed in this specification are only for illustrative purposes rather than limiting the technical spirit of the disclosure. The scope of the disclosure may therefore be defined by the accompanying claims.

What is claimed is:

1. A display device comprising:
   a substrate including a display area and a non-display area;
   a plurality of pixels disposed in the display area;
   first scan lines that transmit scan signals to the plurality of pixels, extend in a first direction, and are disposed in a second direction different from the first direction;
   second scan lines that extend in the second direction and are disposed in the first direction, each of the second scan lines include a first portion spaced apart from and electrically separated from a second portion;
   a first power line extending in the second direction and transmitting a first driving power voltage to the pixels;
   a second power line extending in the second direction and transmitting a second driving power voltage to the pixels; and
   a pad part electrically connected to the first portion of second scan lines and disposed in the non-display area, wherein
   each of the first scan lines is directly electrically connected to the first portion of at least one of the second scan lines through a corresponding one of contactors, a contactor being a through hole which passes through at least one insulating layer, each of the plurality of pixels is a first pixel, a second pixel, or a third pixel based on whether or not the contactor is included, the first pixel includes a contactor, the third pixel does not include a contactor, and the second portion of each of the second scan lines comprises:
- a 2-1-th scan line electrically connected to the first power line in the third pixel; and
- a 2-2-th scan line electrically connected to the second power line in the third pixel.

2. The display device according to claim 1, wherein the first pixel, the second pixel, and the third pixel have different structures.

3. The display device according to claim 2, wherein
the second pixel does not include a contactor, and is disposed closer to the pad part in the second direction than the first pixel, and
the third pixel is disposed farther from the pad part in the second direction than the first pixel.

4. The display device according to claim 3, wherein
the display area includes:
- a first area in which the first pixel is disposed;
- a second area in which the second pixel is disposed; and
- a third area in which the third pixel is disposed, and
at least one of the first area, the second area, and the third area has a size less than a size of each of the other areas.

5. The display device according to claim 4, wherein the contactors are disposed in a direction inclined to one of the first direction and the second direction in a plan view.

6. The display device according to claim 1, wherein the first scan lines and the second scan lines intersect each other and form a mesh shape.

7. The display device according to claim 1, wherein the second portion of the second scan lines transmit the first driving power voltage and the second driving power voltage to the pixels.

8. The display device according to claim 1, wherein
the first portion of the second scan lines corresponds to the first pixel and the second pixel, and
the second portion of the second scan lines corresponds to the third pixel.

9. The display device according to claim 1, wherein
the first power line and the 2-1-th scan line are integral with each other,
the second power line and the 2-2-th scan line are integral with each other,
the 2-1-th scan line transmits a first alignment signal to the pixels to align light emitting elements, and
the 2-2-th scan line transmits a second alignment signal to the pixels to align the light emitting elements.

10. A display device comprising:
a substrate including a display area and a non-display area;
a plurality of pixels disposed in the display area;
first scan lines that transmit scan signals to the plurality of pixels, extend in a first direction, and are disposed in a second direction different from the first direction;
second scan lines that transmit scan signals and that extend in the second direction and are disposed in the first direction; and
a pad part electrically connected to the second scan lines and disposed in the non-display area, wherein
each of the first scan lines is directly electrically connected to at least one of the second scan lines through a corresponding one of contactors, a contactor being a through hole which passes through at least one insulating layer, each of the plurality of pixels is a first pixel, a second pixel, or a third pixel based on whether or not including a contactor, the first pixel includes a contactor, the third pixel does not include a contactor, the first pixel, the second pixel, and the third pixel have different structures, the second pixel does not include a contactor, and is disposed closer to the pad part in the second direction than the first pixel, the third pixel is disposed farther from the pad part in the second direction than the first pixel, the display area includes:
- a first area in which the first pixel is disposed;
- a second area in which the second pixel is disposed; and
- a third area in which the third pixel is disposed, at least one of the first area, the second area, and the third area has a size less than a size of each of the other areas, and each of the first pixel, the second pixel, and the third pixel comprises:
- a first sub-pixel including a first storage capacitor and at least one transistor electrically connected to the first storage capacitor;
- a second sub-pixel including a second storage capacitor and at least one transistor electrically connected to the second storage capacitor;
- a third sub-pixel including a third storage capacitor and at least one transistor electrically connected to the third storage capacitor;
- a first power line electrically connected to each of the first sub-pixel, the second sub-pixel, and the third sub-pixel and receiving a first driving power voltage;
- a second power line electrically connected to each of the first sub-pixel, the second sub-pixel and the third sub-pixel and receiving a second driving power voltage;
- a first scan line electrically connected to each of the first sub-pixel, the second sub-pixel, and the third sub-pixel, the first scan line being one of the first scan lines;
- a 2-1-th scan line of the second scan lines that is adjacent to the first power line; and
- a 2-2-th scan line of the second scan lines that is adjacent to the second power line.

11. The display device according to claim 10, wherein
each of the 2-1-th scan line and the 2-2-th scan line comprises:
- a first conductive line disposed on the substrate;
- a second conductive line disposed on the first conductive line with a first insulating layer disposed between the first conductive line and the second conductive line; and
- a third conductive line disposed on the second conductive line with a second insulating layer disposed between the second conductive line and the third conductive line, and the first conductive line, the second conductive line, and the third conductive line are electrically connected to each other.

12. The display device according to claim 11, wherein the first power line includes:
   a first layer disposed on the substrate; and
   a second layer disposed on the first layer with the first insulating layer and the second insulating layer that are disposed between the first layer and the second layer,
   the second power line includes a first layer disposed on the substrate,
   the first conductive line and the first layer are disposed on a same layer, and
   the third conductive line and the second layer are disposed on a same layer.

13. The display device according to claim 12, wherein the first scan line of the first pixel is electrically connected to at least one of the 2-1-th scan line and the 2-2-th scan line through the contactor in the first pixel.

14. The display device according to claim 13, wherein the first scan line of the first pixel is electrically connected to the at least one of the 2-1-th scan line and the 2-2-th scan line through at least one contact hole passing through the first insulating layer and the second insulating layer in the first pixel, and
   the contact hole comprises the contactor.

15. The display device according to claim 12, wherein the 2-1-th scan line and the 2-2-th scan line are not electrically connected to the first scan line and overlap the first scan line in the second pixel.

16. The display device according to claim 8, wherein the 2-1-th scan line and the 2-2-th scan line are not electrically connected to the first scan line and do not overlap the first scan line in the third pixel.

17. The display device according to claim 16, wherein
   the 2-1-th scan line is electrically connected to the first power line in the third pixel, and
   the 2-2-th scan line is electrically connected to the second power line in the third pixel.

18. The display device according to claim 17, wherein
   the 2-1-th scan line and the first power line are integral with each other in the third pixel, and
   the 2-2-th scan line and the second power line are integral with each other in the third pixel.

19. The display device according to claim 18, wherein
   the first conductive line of the 2-1-th scan line is integral with the first layer of the first power line in the third pixel, and
   the first conductive line of the 2-2-th scan line is integral with the first layer of the second power line in the third pixel.

20. The display device according to claim 19, wherein
   at least a portion of the first conductive line of the 2-1-th scan line protrudes to the first layer of the first power line and is integral with the first layer of the first power line in the third pixel, and
   at least a portion of the first conductive line of the 2-2-th scan line protrudes to the first layer of the second power line and is integral with the first layer of the second power line in the third pixel.

21. The display device according to claim 19, wherein
   the first conductive line of the 2-1-th scan line extends to the first layer of the first power line and is integral with the first layer of the first power line in the third pixel, and
   the first conductive line of the 2-2-th scan line extends to the first layer of the second power line and is integral with the first layer of the second power line in the third pixel.

22. The display device according to claim 11, wherein each of the first pixel, the second pixel, and the third pixel comprises:
   a first emission area, a second emission area, and a third emission area spaced apart from each other on the substrate in the first direction, and including a plurality of light emitting elements disposed in each of the first emission area, the second emission area, and the third emission area; and
   a first electrode, a second electrode, a third electrode, and a fourth electrode included in each of the first emission area, the second emission area, and the third emission area, and spaced apart from each other in the first direction.

23. The display device according to claim 22, wherein the plurality of light emitting elements comprise:
   first light emitting elements electrically connected to the first electrode and the second electrode and disposed between the first electrode and the second electrode; and
   second light emitting elements electrically connected to the third electrode and the fourth electrode and disposed between the third electrode and the fourth electrode, and
   each of the first pixel, the second pixel, and the third pixel comprises:
   a first connection electrode disposed on the first electrode, and electrically connecting the first electrode to respective first ends of the first light emitting elements;
   an intermediate electrode disposed on the second electrode and the fourth electrode, and electrically connecting respective second ends of the first light emitting elements with respective first ends of the second light emitting elements; and
   a second connection electrode disposed on the third electrode, and electrically connecting the third electrode with respective second ends of the second light emitting elements.

\* \* \* \* \*